US012490033B2

(12) United States Patent
Yuan et al.

(10) Patent No.: US 12,490,033 B2
(45) **Date of Patent: *Dec. 2, 2025**

(54) BONE CONDUCTION MICROPHONES

(71) Applicant: SHENZHEN SHOKZ CO., LTD., Guangdong (CN)

(72) Inventors: Yongshuai Yuan, Shenzhen (CN); Wenbing Zhou, Shenzhen (CN); Wenjun Deng, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 174 days.

This patent is subject to a terminal disclaimer.

(21) Appl. No.: 18/169,227

(22) Filed: Feb. 15, 2023

(65) Prior Publication Data

US 2023/0247352 A1 Aug. 3, 2023

Related U.S. Application Data

(63) Continuation of application No. PCT/CN2021/082495, filed on Mar. 23, 2021.

(30) Foreign Application Priority Data

Dec. 31, 2020 (WO) ................ PCT/CN2020/142533

(51) Int. Cl.
*H04R 1/28* (2006.01)
*H04R 1/46* (2006.01)
(Continued)

(52) U.S. Cl.
CPC ............. *H04R 25/606* (2013.01); *H04R 1/46* (2013.01); *H04R 17/025* (2013.01); *H04R 17/10* (2013.01);
(Continued)

(58) Field of Classification Search
CPC .... H04R 2460/13; H04R 25/606; H04R 1/46; H04R 17/02; H04R 17/025; H04R 17/10
(Continued)

(56) References Cited

U.S. PATENT DOCUMENTS 12,114,129 B2 * 10/2024 Zhou ........................ H04R 7/10
2001/0033669 A1 10/2001 Bank et al.
(Continued)

FOREIGN PATENT DOCUMENTS

CN 103024647 A 4/2013
CN 203181217 U 9/2013
(Continued)

OTHER PUBLICATIONS

Translation of Ushio et al. Japanese Publication No. 2006100954, Apr. 13, 2006 (Year: 2006).*
(Continued)

*Primary Examiner* — Katherine A Faley
(74) *Attorney, Agent, or Firm* — METIS IP LLC

(57) ABSTRACT

The present disclosure is of a bone conduction microphone. The bone conduction microphone comprises of a laminated structure and a base structure. The laminated structure is formed by a vibration unit and an acoustic transducer unit. The base structure is configured to load the laminated structure. At least one side of the laminated structure is physically connected to the base structure. The base structure vibrates based on an external vibration signal, the vibration unit deforms in response to the vibration of the base structure, and the acoustic transducer unit generates an electrical signal based on the deformation of the vibration unit. A resonant frequency of the bone conduction microphone is within a range of 2.5 kHz-4.5 KHz.

19 Claims, 34 Drawing Sheets

(51) Int. Cl.

| | |
|---|---|
| ***H04R 17/02*** | (2006.01) |
| ***H04R 17/10*** | (2006.01) |
| ***H04R 25/00*** | (2006.01) |
| ***H10N 30/30*** | (2023.01) |
| ***H10N 30/50*** | (2023.01) |

(52) U.S. Cl.
CPC ........... *H10N 30/308* (2023.02); *H10N 30/50* (2023.02); *H10N 30/501* (2023.02); *H04R 2460/13* (2013.01)

(58) Field of Classification Search
USPC .......................................................... 381/151
See application file for complete search history.

(56) References Cited

U.S. PATENT DOCUMENTS

| | | | | |
|---|---|---|---|---|
| 2003/0106875 | A1* | 6/2003 | Lin | A61B 5/0878 216/2 |
| 2004/0114849 | A1* | 6/2004 | Shah | G01M 11/0221 385/13 |
| 2005/0137447 | A1* | 6/2005 | Bernhard | H04R 25/606 600/25 |
| 2007/0041595 | A1 | 2/2007 | Carazo et al. | |
| 2007/0284971 | A1* | 12/2007 | Sano | H04R 19/04 310/364 |
| 2008/0173092 | A1* | 7/2008 | Hattori | G01P 15/0922 73/514.34 |
| 2009/0129611 | A1* | 5/2009 | Leidl | H04R 17/02 381/173 |
| 2012/0078035 | A1 | 3/2012 | Andersson et al. | |
| 2012/0266686 | A1 | 10/2012 | Huffman | |
| 2015/0350792 | A1* | 12/2015 | Grosh | H10N 30/50 257/416 |
| 2020/0196065 | A1 | 6/2020 | Pedersen et al. | |
| 2020/0382876 | A1 | 12/2020 | Cerini et al. | |
| 2020/0413203 | A1* | 12/2020 | Tong | H04R 19/04 |

FOREIGN PATENT DOCUMENTS

| | | | |
|---|---|---|---|
| CN | 103618985 | A | 3/2014 |
| CN | 110052391 | A | 7/2019 |
| CN | 110300364 | A | 10/2019 |
| CN | 210171865 | U | 3/2020 |
| CN | 110987159 | A | 4/2020 |
| CN | 210405601 | U | 4/2020 |
| CN | 111372178 | A | 7/2020 |
| CN | 210958796 | U | 7/2020 |
| CN | 211378247 | U | 8/2020 |
| DE | 102015106240 | A1 | 10/2016 |
| EP | 4050910 | A1 | 8/2022 |
| JP | H08195995 | A | 7/1996 |
| JP | H0970086 | A | 3/1997 |
| JP | H09271086 | A | 10/1997 |
| JP | 2002262377 | A | 9/2002 |
| JP | 2003345381 | A | 12/2003 |
| JP | 2004020952 | A | 1/2004 |
| JP | 2006100954 | A | 4/2006 |
| JP | 2014199903 | A | 10/2014 |
| JP | 2017022576 | A | 1/2017 |
| WO | 2010023755 | A1 | 3/2010 |

OTHER PUBLICATIONS

The Extended European Search Report in European Application No. 21912598.6 mailed on Feb. 19, 2024, 13 pages.
Notice of Reasons for Rejection in Japanese Application No. 2023-519932 mailed on Apr. 8, 2024, 14 pages.
International Search Report in PCT/CN2021/082495 mailed on Sep. 2, 2021, 6 pages.
Written Opinion in PCT/CN2021/082495 mailed on Sep. 2, 2021, 5 pages.
International Search Report in PCT/CN2020/142533 mailed on Sep. 6, 2021, 6 pages.
Written Opinion in PCT/CN2020/142533 mailed on Sep. 6, 2021, 6 pages.
Office Action in Russian Application No. 2023104430 mailed on Aug. 9, 2023, 20 pages.
The Notice of Submission of Opinions in Korean Application No. 10-2023-7012287 mailed on May 19, 2025, 16 pages.

* cited by examiner

300

700

BONE CONDUCTION MICROPHONES

CROSS-REFERENCE TO RELATED APPLICATIONS

This application is a continuation of International Application PCT/CN2021/082495, filed on Mar. 23, 2021, which claims priority to International Application PCT/CN2020/142533, filed on Dec. 31, 2020, the entire contents of which are hereby incorporated by reference.

TECHNICAL FIELD

The present disclosure relates to the technical field of hearing equipment, and in particular, to a bone conduction microphone.

BACKGROUND

The microphone receives an external vibration signal, uses an acoustic transducer unit to convert a vibration signal into an electrical signal, and outputs the electrical signal after the electrical signal is processed by a back-end circuit. An air conduction microphone receives an air conduction acoustic signal, and the acoustic signal is transmitted through the air, i.e., the air conduction microphone receives an air vibration signal. The bone conduction microphone receives a bone conduction acoustic signal and the acoustic signal is transmitted through human bones, i.e., the bone conduction microphone receives a bone vibration signal. Compared with the air conduction microphone, the bone conduction microphone has advantages in noise immunity. In a noisy environment, the bone conduction microphone is less disturbed by environmental noise and can capture human voices well.

The structure of the existing bone conduction microphone is too complex, which requires high-level manufacturing process. Insufficient connection strength of some components may create insufficient reliability which affects the output signal. Therefore, it is desirable to provide a bone conduction microphone with a simple structure and greater stability.

SUMMARY

One aspect of the present disclosure provides a bone conduction microphone. The bone conduction microphone may comprise of a laminated structure and a base structure. The laminated structure may be formed by a vibration unit and an acoustic transducer unit. The base structure may be configured to load the laminated structure. At least one side of the laminated structure may be physically connected to the base structure. The base structure may vibrate based on an external vibration signal, the vibration unit may deform in response to the vibration of the base structure, and the acoustic transducer unit may generate an electrical signal based on the deformation of the vibration unit.

In some embodiments, a resonant frequency of the bone conduction microphone may be within a range of 2.5 kHz-4.5 KHz.

In some embodiments, the resonant frequency of the bone conduction microphone may be within a range of 2.5 kHz-3.5 KHz.

In some embodiments, the base structure may include a hollow frame structure. One end of the laminated structure may be connected to the base structure, and the other end of the laminated structure may be suspended in a hollow position of the hollow frame structure.

In some embodiments, the vibration unit may include at least one elastic layer. The acoustic transducer unit may include at least a first electrode layer, a piezoelectric layer, and a second electrode layer arranged in sequence from top to bottom. The at least one elastic layer may be located on an upper surface of the first electrode layer or on a lower surface of the second electrode layer.

In some embodiments, the acoustic transducer unit may further include a seed layer. The seed layer may be located on the lower surface of the second electrode layer.

In some embodiments, a cover area of the first electrode layer, the piezoelectric layer, or the second electrode layer may be less than or equal to an area of the laminated structure. The first electrode layer, the piezoelectric layer, or the second electrode layer may be close to a connection between the laminated structure and the base structure.

In some embodiments, the vibration unit may include at least one elastic layer, the acoustic transducer unit may include at least an electrode layer and a piezoelectric layer, and the at least one elastic layer may be located on a surface of the electrode layer.

In some embodiments, the electrode layer may include a first electrode and a second electrode. The first electrode may be bent into a first comb-shaped structure, and the second electrode may be bent into a second comb-shaped structure. The first comb-shaped structure may be matched with the second comb-shaped structure to form the electrode layer. The electrode layer may be located on an upper surface or a lower surface of the piezoelectric layer.

In some embodiments, the first comb-shaped structure and the second comb-shaped structure may extend along a length direction of the laminated structure. In some embodiments, the resonant frequency of the bone conduction microphone may be positively correlated with a stiffness of the vibration unit.

In some embodiments, the resonant frequency of the bone conduction microphone may be negatively correlated with a mass of the laminated structure.

In some embodiments, the vibration unit may include a suspension membrane structure. The acoustic transducer unit may include a first electrode layer, a piezoelectric layer, and a second electrode layer arranged in sequence from top to bottom. The suspension membrane structure may be connected to the base structure through a circumferential side of the suspension membrane structure, and the acoustic transducer unit may be located on an upper surface or a lower surface of the suspension membrane structure.

In some embodiments, the suspension membrane structure may include a plurality of holes. The plurality of holes may be distributed along an outer circumferential direction or an inner circumferential direction of the acoustic transducer unit.

In some embodiments, the plurality of holes may be circular holes, and the radii of the circular holes may be within a range of 20 μm-300 μm.

In some embodiments, a shape enclosed by the plurality of holes may be consistent with a shape of the acoustic transducer unit.

In some embodiments, a shape of the plurality of holes may be consistent with a shape of the acoustic transducer unit.

In some embodiments, the plurality of holes may be distributed in a circle along an outer circumferential direction or an inner circumferential direction of the acoustic transducer unit.

In some embodiments, a radius of the circle may be within a range of 300 μm-700 μm.

In some embodiments, a radial distance from an edge of the effective acoustic transducer unit to the centers of the plurality of holes may be within a range of 50 μm-400 μm.

In some embodiments, the effective acoustic transducer unit may be a ring structure, and an inner diameter of the acoustic transducer unit may be within a range of 100 μm-700 μm.

In some embodiments, the effective acoustic transducer unit may be a ring structure, and an outer diameter of the acoustic transducer unit may be within a range of 110 μm-710 μm.

In some embodiments, a radial distance from an edge of the acoustic transducer unit to the centers of the plurality of holes may be within a range of 100 μm-400 μm.

In some embodiments, the acoustic transducer unit may be a ring structure. A thickness of the suspension membrane structure located in an inner region of the ring structure may be greater than a thickness of the suspension membrane structure located in an outer region of the ring structure.

In some embodiments, the acoustic transducer unit may be a ring structure. A density of the suspension membrane structure located in an inner region of the ring structure may be greater than a density of the suspension membrane structure located in an outer region of the ring structure.

In some embodiments, a thickness of the suspension membrane structure may be within a range of 0.5 μm-10 μm.

In some embodiments, a shape of the suspension membrane structure may be circular, elliptical, polygonal or irregular.

In some embodiments, a shape of the suspension membrane structure may be circular, and a radius of the suspension membrane structure may be within a range of 500 μm-1500 μm.

In some embodiments, a thickness of the first electrode layer may be within a range of 80 nm-250 nm.

In some embodiments, a thickness of the piezoelectric layer may be within a range of 0.8 μm-5 μm.

In some embodiments, a thickness of the second electrode layer may be within a range of 80 nm-250 nm.

In some embodiments, the vibration unit may further include a mass element. The mass element may be located on the upper surface or the lower surface of the suspension membrane structure.

In some embodiments, the acoustic transducer unit and the mass element may be respectively located on different sides of the suspension membrane structure.

In some embodiments, the acoustic transducer unit and the mass element may be located on a same side of the suspension membrane structure. The acoustic transducer unit may be a ring structure, and the ring structure is distributed along a circumferential distribution of the mass element.

In some embodiments, the mass element may be a cylinder, and a radius of a cross-section of the mass element perpendicular to a thickness direction may be within a range of 100 μm-700 μm.

In some embodiments, the mass element may be a cylinder, and a thickness of the mass element may be within a range of 20 μm-400 μm.

In some embodiments, a lead structure may be arranged on the suspension membrane structure. The first electrode layer and the second electrode layer may be connected to the base structure through the lead structure. A width of the lead structure is within a range of 2 μm-100 μm.

In some embodiments, the lead structure may include a first lead and a second lead. One end of the first lead may be connected to the first electrode layer, and the other end of the first lead may be connected to the base structure. One end of the second lead may be connected to the second electrode layer, and the other end of the second lead may be connected to the base structure.

In some embodiments, the vibration unit may further include a mass element. The mass element may be located on the upper surface or the lower surface of the suspension membrane structure. The suspension membrane structure may include a plurality of holes. The plurality of holes may be distributed along a circumferential direction of the acoustic transducer unit.

In some embodiments, a ratio of an electrical signal intensity to a noise intensity of the bone conduction microphone is 50%-100% of a ratio of a maximum electrical signal intensity to the noise intensity.

In some embodiments, the vibration unit may include at least one support arm and a mass element. The mass element may be connected to the base structure through the at least one support arm.

In some embodiments, the at least one support arm may include at least one elastic layer, and the acoustic transducer unit may be located on the upper surface, the lower surface or inside the at least one support arm.

In some embodiments, the acoustic transducer unit may include a first electrode layer, a piezoelectric layer, and a second electrode layer arranged in sequence from top to bottom. The first electrode layer or the second electrode layer may be connected to the upper surface or the lower surface of the at least one support arm.

In some embodiments, the mass element may be located on the upper surface or the lower surface of the first electrode layer or the second electrode layer.

In some embodiments, an area of the first electrode layer, the piezoelectric layer, or the second electrode layer may be less than or equal to an area of the support arm. Part or all of the first electrode layer, the piezoelectric layer, or the second electrode layer may cover the upper surface or the lower surface of the at least one support arm.

In some embodiments, an area of the first electrode layer may be less than or equal to an area of the piezoelectric layer, and the entire region of the first electrode layer may be located on a surface of the piezoelectric layer.

In some embodiments, the first electrode layer, the piezoelectric layer, and the second electrode layer of the acoustic transducer unit may be close to the mass element or a connection between the support arm and the base structure.

In some embodiments, the at least one support arm may include at least one elastic layer. The at least one elastic layer may be located on the upper surface or the lower surface of the first electrode layer or the second electrode layer.

In some embodiments, the bone conduction microphone may further include a limiting structure. The limiting structure may be located in the hollow position of the base structure. The limiting structure may be connected to the base structure, and the limiting structure may be located above or below the mass element.

In some embodiments, the above bone conduction microphone may further include at least one damping structure layer. The at least one damping structure layer may cover the upper surface, the lower surface or the inside of the laminated structure.

BRIEF DESCRIPTION OF THE DRAWINGS

The present disclosure is further illustrated in terms of exemplary embodiments. These exemplary embodiments are described in detail with reference to the drawings. These embodiments are non-limiting. In these embodiments, the same number indicates the same structure, wherein.

DETAILED DESCRIPTION

Figure 1:
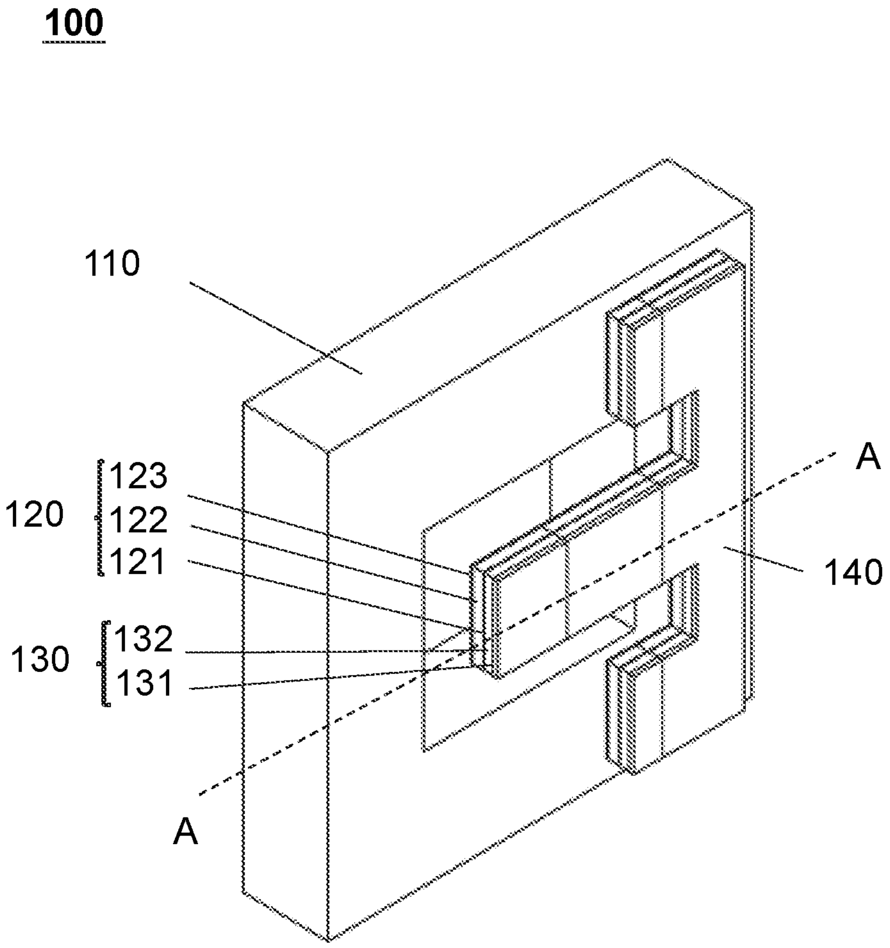
FIG. 1 is a schematic structural diagram illustrating a bone conduction microphone according to some embodiments of the present disclosure.

In order to more clearly illustrate the technical solutions of the embodiments of the present disclosure, the following briefly introduces the drawings that need to be used in the description of the embodiments. Obviously, the accompanying drawings in the following description are only some examples or embodiments of the present disclosure, and those skilled in the art can also apply the present disclosure to other similar scenarios according to the drawings without creative efforts. Unless obviously obtained from the context or the context illustrates otherwise, the same numeral in the drawings refers to the same structure or operation. It should be understood that the drawings are for purposes of illustration and description only, and are not intended to limit the scope of the present disclosure. It should be understood that the drawings are not drawn to scale.

It should be understood that, for the convenience of describing the present disclosure, the terms "center", "upper surface", "lower surface", "upper", "lower", "top", "bottom", "inner", "outer", "axial", "radial", "peripheral", "external" and other indicated positional relationships are based on the positional relationship shown in the drawings, and do not indicate that the referred devices, components or units must have a specific positional relationship, should not be construed as a limitation of the present disclosure.

It should be understood that the "system," "device," "unit," and/or "module" used herein are one method to distinguish different components, elements, parts, sections, or assemblies of different levels. However, the words may be replaced by other expressions if other words can achieve the same purpose.

As used in the disclosure and the appended claims, the singular forms "a," "an," and "the" include plural referents unless the content clearly dictates otherwise. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The flowchart is used in the present disclosure to illustrate the operations performed by the system according to the embodiment of the present disclosure. It should be understood that the foregoing or following operations may not necessarily be performed exactly in order. Instead, various steps may be processed in reverse order or simultaneously. At the same time, other operations can be added to these procedures, or a certain step or steps can be removed from these procedures.

When describing bone conduction-related technologies in the present disclosure, the descriptions of "bone conduction microphone", "bone conduction sound transmission device", or "microphone device" will be used, which is only a form of bone conduction application. The bone conduction devices referred to by the different descriptions above are equivalent. For the convenience of description, the use and application process of the sound generating unit will be described below by taking the bone conduction microphone as an example. It should be noted that the above description is provided for illustrative purposes only and is not intended to limit the scope of the present disclosure.

The bone conduction microphone provided by some embodiments of the present disclosure may include a base structure and a laminated structure. In some embodiments, the base structure may be a regular or irregular three-dimensional structure with a hollow part inside the base structure. For example, the base structure may be a hollow frame structure, including but not limited to regular shapes such as a rectangular frame, a circular frame, a regular polygonal frame, or any irregular shapes. The laminated structure may be located in the hollow position of the base structure, or at least partially suspended above the hollow position of the base structure. In some embodiments, at least part of the laminated structure may be physically connected to the base structure. The "connection" here may be understood that after the laminated structure and the base structure are respectively prepared, the laminated structure and the base structure may be fixedly connected by means of welding, riveting, clamping, bolts, etc., or the laminated structure may be deposited on the base structure by physical deposition (e.g., physical vapor deposition) or chemical deposition (e.g., chemical vapor deposition) during the preparation process. In some embodiments, at least part of the laminated structure may be fixed to an upper surface or a lower surface of the base structure. At least part of the laminated structure may also be fixed to a side wall of the base structure. For example, the laminated structure may be a cantilever beam. The cantilever beam may be a plate-shaped structure. One end of the cantilever beam may be connected to an upper surface, a lower surface of the base structure, or a side wall where the hollow position in the base structure is located, and the other end of the cantilever beam may not be connected or contacted with the base structure, so that the other end of the cantilever beam may be suspended in the hollow position of the base structure. As another example, the laminated structure may include a diaphragm layer (also referred to as a suspension membrane structure). The suspension membrane structure may be fixedly connected to the base structure. The laminated structure may be arranged on an upper surface or a lower surface of the suspension membrane structure. As another example, the laminated structure may include a mass element and one or more support arms. The mass element may be fixedly connected to the base structure through one or more support arms. One end of the support arm may be connected to the base structure, and the other end of the support arm may be connected to the mass element, so that the mass element and part of the support arm may be suspended in the hollow position of the base structure. It should be known that "located in the hollow position of the base structure" or "suspended in the hollow position of the base structure" mentioned in the present disclosure may mean "suspended in, below or above the hollow position of the base structure". In some embodiments, the laminated structure may include a vibration unit and an acoustic transducer unit. Specifically, the base structure may vibrate based on an external vibration signal. The vibration unit may deform in response to the vibration of the base structure. The acoustic transducer unit may generate an electrical signal based on the deformation of the vibration unit. It should be known that the description of the vibration unit and the acoustic transducer unit here is only for the purpose of conveniently introducing the working principle of the laminated structure, and does not limit the actual composition and structure of the laminated structure. In fact, the vibration unit may not be necessary, and its function may be completely realized by the acoustic transducer unit. For example, after certain changes are made to the structure of the acoustic transducer unit, the acoustic transducer unit may directly respond to the vibration of the base structure to generate an electrical signal.

The vibration unit may refer to a part of the laminated structure that is prone to deformation under the action of an external force or inertia. The vibration unit may be configured to transmit the deformation caused by the external force or inertia to the acoustic transducer unit. In some embodiments, the vibration unit and the acoustic transducer unit may overlap to form the laminated structure. The acoustic transducer unit may be located on the upper layer of the vibration unit, and the acoustic transducer unit may also be located on the lower layer of the vibration unit. For example, when the laminated structure is a cantilever beam structure, the vibration unit may include at least one elastic layer. The acoustic transducer unit may include a first electrode layer, a piezoelectric layer, and a second electrode layer arranged in sequence from top to bottom. The elastic layer may be located on the surface of the first electrode layer or the second electrode layer. The elastic layer may deform during the vibration process. The piezoelectric layer may generate an electrical signal based on the deformation of the elastic layer. The first electrode layer and the second electrode layer may collect the electrical signal. As another example, the vibration unit may also be a suspension membrane structure. By changing the density of a specific region of the suspension membrane structure, punching holes in the suspension membrane structure, or setting a counterweight (also referred to as a mass element) on the suspension membrane structure, the suspension membrane structure near the acoustic transducer unit may be more likely to deform under the action of an external force, thereby driving the acoustic transducer unit to generate the electrical signal. As another example, the vibration unit may include at least one support arm and a mass element. The mass element may be suspended in the hollow position of the base structure through the support arm. When the base structure vibrates, the support arm and the mass element of the vibration unit may move relative to the base structure, and the support arm may deform to act on the acoustic transducer unit to generate the electrical signal.

The acoustic transducer unit may refer to a part in the laminated structure that converts the deformation of the vibration unit into the electrical signal. In some embodiments, the acoustic transducer unit may include at least two electrode layers (e.g., a first electrode layer and a second electrode layer), and a piezoelectric layer. The piezoelectric layer may be located between the first electrode layer and the second electrode layer. The piezoelectric layer may refer to a structure that generates a voltage on two ends of the piezoelectric layer when an external force is applied. In some embodiments, the piezoelectric layer may be a piezoelectric polymer film obtained by a semiconductor deposition process (e.g., magnetron sputtering, Metal-organic Chemical Vapor Deposition (MOCVD)). In an embodiment of the present disclosure, the piezoelectric layer may generate the voltage under the deformation stress of the vibration unit. The first electrode layer and the second electrode layer may collect the voltage (electrical signal). In some embodiments, the material of the piezoelectric layer may include a piezoelectric film material. The piezoelectric film material may be a film material (such as an AlN film material) prepared by a deposition process (such as a magnetron sputtering deposition process). In some other embodiments, the material of the piezoelectric layer may include a piezoelectric crystal material and a piezoelectric ceramic material. The piezoelectric crystal may refer to a piezoelectric monocrystal. In some embodiments, the piezoelectric crystal material may include crystal, sphalerite, boracite, tourmaline, zincite, GaAs, barium titanate, and its derivative structure crystals, $KH_2PO_4$, $NaKC_4H_4O_6 \cdot 4H_2O$ (Rochelle salt), etc., or any combination thereof. The piezoelectric ceramic material may refer to a piezoelectric polycrystal formed by the random collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate, aluminum nitride (AlN), zinc oxide (ZnO), or any combination thereof. In some embodiments, the piezoelectric layer material may also be a piezoelectric polymer material, such as polyvinylidene fluoride (PVDF).

In some embodiments, the base structure and the laminated structure may be located in a housing of the bone conduction microphone. The base structure may be fixedly connected to an inner wall of the housing, and the laminated structure may be loaded by the base structure. When the housing of the bone conduction microphone is vibrated by an external force (e.g., the vibration of the face when the human body speaks drives the housing to vibrate), the vibration of the housing drives the base structure to vibrate. Further, when the vibration unit deforms, the piezoelectric layer of the acoustic transducer unit may be subjected to the deformation stress of the vibration unit to generate a potential difference (voltage). At least two electrode layers (e.g., a first electrode layer and a second electrode layer) respectively located on the upper surface and the lower surface of the piezoelectric layer in the acoustic transducer unit may collect the potential difference to convert the external vibration signal into the electrical signal. For illustrative purposes only, the bone conduction microphone described in the embodiments of the present disclosure may be applied to an earphone (e.g., a bone conduction earphone or an air conduction earphone), glasses, a virtual reality device, a helmet, etc. The bone conduction microphone may be placed on the human head (e.g., the face), the neck, near the ears, and the top of the head. The bone conduction microphone may collect the vibration signal of the bone when the human body speaks, and convert the vibration signal into the electrical signal to realize sound acquisition. It should be noted that the base structure is not limited to a structure that is independent of the housing of the bone conduction microphone. In some embodiments, the base structure may also be a part of the housing of the bone conduction microphone.

After receiving the external vibration signal, the bone conduction microphone (or bone conduction sound transmission device) may use the laminated structure (including the acoustic transducer unit and the vibration unit) to convert the vibration signal into the electrical signal, and output the electrical signal after the electrical signal is processed by a back-end circuit. Resonance may also be referred to be "resonant vibration". Under the action of the external vibration signal on the bone conduction microphone, when the frequency of the external force is the same as or very close to the natural oscillation frequency of the system, the phenomenon that the amplitude increases sharply may be referred to as resonance, and the frequency of the resonance may be referred to as "resonant frequency". The bone conduction microphone may have a natural frequency. When the frequency of the external vibration signal is close to the natural frequency, the laminated structure may generate a larger amplitude, thereby outputting a larger electrical signal. Therefore, the response of the bone conduction microphone to the external vibration may appear to generate a formant near the natural frequency. As such, the resonant frequency of the bone conduction microphone may be basically equal to the natural frequency. In some embodiments, the natural frequency of the bone conduction microphone may refer to the natural frequency of the laminated structure. In some embodiments, the natural frequency of the laminated structure may be within a range of 4 kHz-4.5 kHz. In some embodiments, since the bone conduction signal of the human body decays rapidly after 1 kHz, it is desirable to adjust the resonant frequency of the bone conduction microphone (or the natural frequency of the laminated structure) to the voice frequency range of 1 kHz-5 KHz. In some embodiments, the resonant frequency of the bone conduction microphone may be adjusted to the range of the voice frequency band of 2 KHz-5 KHz. In some embodiments, the resonant frequency of the bone conduction microphone may be adjusted to the range of the voice frequency band of 2.5 kHz-4.5 kHz. In some embodiments, the resonant frequency of the bone conduction microphone may be adjusted to the range of the voice frequency band of 3 kHz-4.5 kHz. In some embodiments, the resonant frequency of the bone conduction microphone may be adjusted to the range of the voice frequency band of 2.5 kHz-3.5 kHz. According to the adjustment of the above resonant frequency range, the formant of the bone conduction microphone may be located in the range of the voice frequency band of 2.5 kHz-4.5 kHz, thereby improving the sensitivity of the bone conduction microphone in response to the vibration of the voice frequency band (e.g., a range of the frequency band before the formant, i.e., 20 Hz-5 kHz)

Since the bone conduction microphone may be equivalent to a mass-spring-damping system model, the bone conduction microphone may be equivalent to a mass-spring-damping system doing forced vibration under the action of an exciting force during operation, and its vibration law may conform to the law of mass-spring-damping system. Therefore, the resonant frequency of the bone conduction microphone may be related to the equivalent stiffness and equivalent mass of internal components (e.g., the vibration unit or laminated structure) of the bone conduction microphone. That is, the resonant frequency of the bone conduction microphone may be positively correlated with the equivalent stiffness of internal components of the bone conduction microphone, and negatively correlated with the equivalent mass of internal components of the bone conduction microphone. The equivalent stiffness may be the stiffness after the bone conduction microphone is equivalent to the mass-spring-damping system model, and the equivalent mass is the mass after the bone conduction microphone is equivalent to the mass-spring-damping system model. Thus, in order to adjust the resonant frequency (or natural frequency) of the bone conduction microphone, it is necessary to adjust the equivalent stiffness and equivalent mass of the vibration unit or the laminated structure.

For the bone conduction microphone, the bone conduction microphone at work may be equivalent to the forced vibration of the mass-spring-damping system model under an excitation external force, and vibration law of the bone conduction microphone conforms to the law of the mass-spring-damping system model. Under the action of the excitation external force, the influencing parameters of the resonant frequency $f_0$ may include but not limited to the system equivalent stiffness k, the system equivalent mass m, and the system equivalent relative damping coefficient (damping ratio) ζ. In some embodiments, the system equivalent stiffness k may be positively correlated with the system resonance frequency $f_0$ of the bone conduction microphone, the system equivalent mass m may be negatively correlated with the system resonance frequency $f_0$ of the bone conduction microphone, and the system equivalent relative damping coefficient (damping ratio) ζ may be negatively correlated with the system resonant frequency $f_0$ of the bone conduction microphone. In some embodiments, $$\frac{k}{m}\cdot\left(1-\zeta^2\right)$$

may pe positively correlated with the resonant frequency $f_0$ on system of the bone conduction microphone. In some embodiments, the frequency response may satisfy the following formula (1):

$$f_0=\frac{1}{2\pi}\sqrt{\frac{k}{m}\cdot\left(1-\zeta^2\right)}. \tag{1}$$

Where $f_0$ is the resonant frequency on the system of the bone conduction microphone, k is the system equivalent stiffness, m is the system equivalent mass, and ζ is the system equivalent relative damping coefficient (damping ratio).

For most bone conduction microphones, especially piezoelectric bone conduction microphones, the system equivalent relative damping coefficient ζ may be usually small, and the resonant frequency $f_0$ of the system may be mainly affected by the equivalent stiffness and the equivalent mass. Taking the bone conduction microphone shown in FIG. 5 as an example, a suspension membrane structure 530 may provide spring, damping and mass functions for the vibration system. Therefore, the suspension membrane structure 530 may mainly affect the system equivalent stiffness k, and may also affect the system equivalent mass m. Taking the bone conduction microphone shown in FIG. 7 as an example, a suspension membrane structure 730 may provide spring and damping functions for a vibration system, and a mass element 740 may provide a mass function. Therefore, the suspension membrane structure 730 may mainly affect the system equivalent stiffness k, and may also affect the system equivalent mass m. The mass element 740 may mainly affect the system equivalent mass m, and may also affect the system equivalent stiffness k. For a bone conduction microphone with a relatively complex structure, it is difficult to solve resonant frequency $f_0$ of the bone conduction microphone theoretically. The frequency response of the bone conduction microphone may be solved by building a model of the corresponding structure and parameters using a finite element simulation tool. In some embodiments, the electrode layer (including the first electrode layer and the second electrode layer), the piezoelectric layer, the elastic layer, and the mass element described below may be made by selecting different materials, and the resonant frequency $f_0$ of the bone conduction microphone may be adjusted. In some embodiments, the resonant frequency $f_0$ of the bone conduction microphone may be adjusted by designing the structure of the bone conduction microphone, such as the structure of the support arm and the mass element, the structure of the cantilever beam, the structure of the perforated suspension membrane, and the structure of the suspension membrane and the mass element. In some embodiments, the resonant frequency $f_0$ of the bone conduction microphone may be adjusted by designing the dimensions of different components, such as the length, width, and thickness of the support arm, mass element, cantilever beam, suspension membrane, etc.

In some embodiments, the equivalent stiffness and the equivalent mass may be adjusted by changing the structural parameters of the vibration unit and the acoustic transducer unit, so that the natural frequency of the laminated structure may be reduced to the voice frequency band range. For example, the equivalent stiffness of the vibration unit may be adjusted by setting holes on the vibration unit. As another example, the equivalent mass of the laminated unit may be adjusted by setting the mass element in the vibration unit. As another example, the equivalent stiffness of the laminated unit may be adjusted by setting the support arm in the vibration unit. For more details about the adjustment of the structural parameters of the vibration unit and the acoustic transducer unit, please refer to the description below, which is not repeated herein.

Signal noise ratio (SNR) refers to a ratio of a signal to noise in an electronic device or electronic system. In the bone conduction microphone, the greater the SNR is, the greater the electrical signal intensity of the bone conduction microphone is and the lower the noise is, and the better the effect of the bone conduction microphone is. Therefore, the SNR may be a very important parameter in the design process of the bone conduction microphone. In some embodiments, the SNR may be related to a sensitivity $v_s$ of the bone conduction microphone and a background noise $v_{ntrms}$ of the bone conduction microphone. In some embodiments, the SNR may be positively correlated with the sensitivity $v_s$ of the bone conduction microphone, and the SNR may be negatively correlated with the background noise $v_{ntrms}$ of the bone conduction microphone. In some embodiments, the SNR may be positively correlated with $$Lg\left(\frac{v_s}{v_{ntrms}}\right).$$

In some embodiments, the SNR of the bone conduction microphone may be calculated according to the following formula (2):

$$SNR = 20 \times Lg\left(\frac{v_s}{v_{ntrms}}\right). \tag{2}$$

Where $v_s$ is the sensitivity of the bone conduction microphone. $v_s$ may be related to a piezoelectric constant and an internal stress of the piezoelectric layer (e.g., the first piezoelectric layer), where the piezoelectric constant may be related to the material of the piezoelectric layer, and the internal stress of the piezoelectric layer may be related to the structure and external load of the bone conduction microphone. In some embodiments, after the model is established, the sensitivity $v_s$ of the structures of different bone conduction microphones under corresponding external loads may be solved by means of a finite element numerical calculation method. $v_{ntrms}$ is the background noise of the bone conduction microphone. The background noise $v_{ntrms}$ of the bone conduction microphone may be determined by parameters such as a background noise $v_{narms}$ of an amplifier circuit (ASIC) and a background noise value $v_{nsrms}$ of a transducer (acoustic transducer unit). The background noise $v_{ntrms}$ of the bone conduction microphone may be positively correlated with the background noise value $v_{narms}$ of the amplifier circuit (ASIC) and the background noise value $v_{nsrms}$ of the transducer. $v_{narms}$ is the background noise of the amplifier circuit (ASIC), which may be calculated during the design process of the amplifier circuit or obtained from the manufacturer. In some embodiments, the background noise $v_{ntrms}$ of the bone conduction microphone may be related to the parameters such as the dielectric loss tan δ of the piezoelectric layer (e.g., the first piezoelectric layer), the dielectric constant $\varepsilon_r$ of the piezoelectric layer (e.g., the first piezoelectric layer), the thickness d of the piezoelectric layer (e.g., the first piezoelectric layer), the area S of the effective acoustic transducer unit of the bone conduction microphone, a low frequency cutoff frequency $f_0$ of the background noise of the bone conduction microphone, and a high frequency cutoff frequency $f_1$ of the background noise of the bone conduction microphone.

In some embodiments, the background noise $v_{ntrms}$ of the bone conduction microphone may be positively correlated with the parameters such as the dielectric constant $\varepsilon_r$ of the piezoelectric layer (se.g., the first piezoelectric layer), the thickness d of the piezoelectric layer (e.g., the first piezoelectric layer), and the high frequency cutoff frequency $f_1$ of the background noise of the bone conduction microphone. The background noise $v_{ntrms}$ of the bone conduction microphone may be negatively correlated with the area S of the effective acoustic transducer unit of the bone conduction microphone, the low frequency cutoff frequency $f_0$ of the background noise of the bone conduction microphone, and the dielectric loss tan δ of the piezoelectric layer (e.g., the first piezoelectric layer). In some embodiments, the background noise $v_{ntrms}$ of the bone conduction microphone may be calculated by the following formula (3):

$$v_{ntrms}=f(v_{nsrms},v_{narms})=f(\tan\delta,\varepsilon r,d,S,f_1,f_0,v_{narms},\text{ASIC gain}) \tag{3}.$$

Where ASIC gain is the gain of the amplifier circuit, which may be calculated during the design process of the amplifier circuit or obtained from the manufacturer. tan δ is the dielectric loss of the piezoelectric layer (e.g., the first piezoelectric layer), $\varepsilon_r$ is the dielectric constant of the piezoelectric layer (e.g., the first piezoelectric layer), d is the thickness of the piezoelectric layer (e.g., the first piezoelectric layer), S is the area of the effective acoustic transducer unit of the bone conduction microphone, $f_0$ is the low frequency cutoff frequency of the background noise of the bone conduction microphone, and $f_1$ is the high frequency cutoff frequency of the background noise of the bone conduction microphone.

A formula (4) may be determined for determining the SNR of the bone conduction microphone by substituting formula (3) into formula (2):

$$SNR = 20 \times Lg\left(\frac{v_s}{v_{ntrms}}\right) = 20 \times Lg\left(\frac{v_s}{f(\tan\delta, \varepsilon_\gamma, d, S, f_1, f_0, v_{narms}, ASIC\ \text{gain})}\right). \tag{4}$$

For the meaning of each parameter in formula (4), please refer to the explanations above. In the above formula (4), the dielectric loss tan δ of the piezoelectric material and the dielectric constant $\varepsilon_r$ of the piezoelectric material may be related to the material of the piezoelectric layer (e.g., the first piezoelectric layer). It can be seen from the above formula (4) that the SNR may be related to the area of the effective acoustic transducer unit, the thickness of the piezoelectric layer (e.g., the first piezoelectric layer), the material of the piezoelectric layer (e.g., the first piezoelectric layer), the sensitivity (sensitivity affected by the material and structure of the bone conduction microphone), or other factors.

According to the formula for solving the SNR of the bone conduction microphone proposed in the present disclosure, the electrode layer (the first electrode layer and the second electrode layer), the piezoelectric layer (the first piezoelectric layer and the second piezoelectric layer), elastic layer, and the mass element are respectively designed, and the structure of the bone conduction microphone is designed, so that the design scheme can meet the requirements of the range of the resonant frequency $f_0$ while maximizing the SNR of the bone conduction microphone. For example, the perforated suspension membrane structure, structure of suspension membrane structure and mass element, cantilever beam structure or structure of support arm and mass element, etc., as well as the dimensions of different components of bone conduction microphones, such as the dimension of the suspension membrane structure, the number and dimension of holes in the suspension membrane structure, the dimension and thickness of the mass element, and the area of the effective acoustic transducer unit, etc. may be designed. As an example only, in the perforated suspension membrane structure, the stiffness and mass of the suspension membrane structure may be adjusted by designing the acoustic transducer unit, the material and dimension of each part of the suspension membrane structure, and the number and dimension of holes, etc., so that stress concentration may occur at the acoustic transducer unit. The stress concentration at the acoustic transducer unit may increase the output electrical signal of the bone conduction microphone, thereby maximizing the output sensitivity and SNR of the bone conduction microphone. As an example only, in the structure of the suspension membrane structure and the mass element, the stiffness of the suspension membrane structure and the mass of the mass element may be adjusted by designing the materials and dimensions of the acoustic transducer unit, the suspension membrane structure, and the mass element, so that the stress concentration may occur at the acoustic transducer unit. The stress concentration at the acoustic transducer unit may increase the output electrical signal of the bone conduction microphone, thereby maximizing the output sensitivity and SNR of the bone conduction microphone. In the above design process, in order to ensure that the design of the bone conduction microphone has better reliability, the SNR may be adjusted by adjusting the material, structure and the dimension of different components, so that the SNR is less than the maximum SNR. For example, the SNR may be designed as 80%-100% of the maximum SNR. The SNR may be designed as 50%-100% of the maximum SNR. The SNR may be designed as 20%-100% of the maximum SNR.

Figure 2:
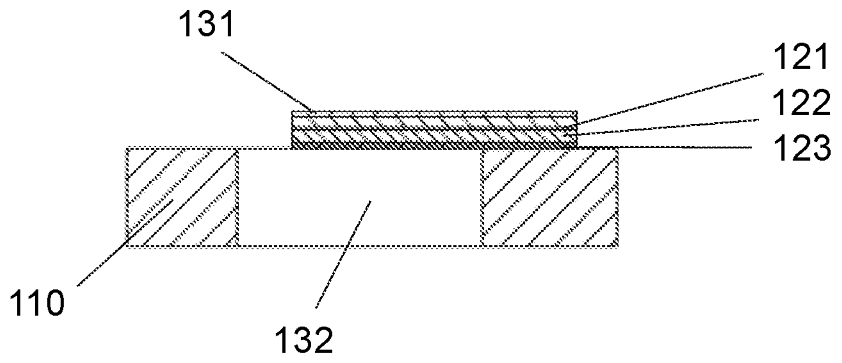
FIG. 2 is a sectional view of a bone conduction microphone in FIG. 1 along an A-A axis according to some embodiments of the present disclosure.

FIG. 1 is a schematic structural diagram illustrating a bone conduction microphone according to some embodiments of the present disclosure. FIG. 2 is a sectional view of a bone conduction microphone in FIG. 1 along an A-A axis according to some embodiments of the present disclosure.

As shown in FIGS. 1 and 2, the bone conduction microphone 100 may include a base structure 110 and a laminated structure, and at least part of the laminated structure is connected to the base structure 110. The base structure 110 may be a hollow frame structure, and part of the laminated structure (e.g., an end of the laminated structure away from a connection between the base structure 110 and the laminated structure) may be located in the hollow position of the hollow frame structure. It should be noted that the frame structure may not limited to the cuboid shape shown in FIG. 1. In some embodiments, the frame structure may be a regular or irregular structure such as a prism or a cylinder. In some embodiments, the laminated structure may be fixedly connected to the base structure 110 in the form of a cantilever beam. Further, the laminated structure may include a fixed end and a free end. The fixed end of the laminated structure may be fixedly connected to the frame structure, and the free end of the laminated structure may not be connected or contacted with the frame structure, so that the free end of the laminated structure may be suspended in the hollow position of the hollow frame structure. In some embodiments, the fixed end of the laminated structure may be connected to an upper surface, a lower surface of the base structure 110 or a side wall where the hollow position of the base structure 110 is located. In some embodiments, the side wall where the hollow position of the base structure 110 is located may also be provided with a mounting groove adapted to the fixed end of the laminated structure, so that the fixed end of the laminated structure may be connected to the base structure 110 in a cooperated manner. In some embodiments, to improve the stability between the laminated structure and the base structure 110, the laminated structure may include a connecting base 140. As an example only, as shown in FIG. 1, the connection base 140 may be fixedly connected to a fixed end of the laminated structure. In some embodiments, the fixed end of the connecting base 140 may be located on the upper surface or the lower surface of the base structure 110. In some embodiments, the fixed end of the connecting base 140 may also be located at the side wall where the hollow position of the base structure 110 is located. For example, the side wall where the hollow position of the base structure 110 is located may be provided with a mounting groove adapted to the fixed end, so that the fixed end of the laminated structure may be connected to the base structure 110 through the mounting groove. The "connection" here may be understood as fixedly connecting the laminated structure and the base structure 110 by means of welding, riveting, bonding, bolting, clamping, etc. after preparing the laminated structure and the base structure 110 respectively, or depositing the laminated structure on the base structure 110 through physical deposition (e.g., physical vapor deposition) or chemical deposition (e.g., chemical vapor deposition) during the manufacturing process. In some embodiments, the connecting base 140 may be a separate structure from the laminated structure or integrally formed with the laminated structure.

In some embodiments, the laminated structure may include an acoustic transducer unit 120 and a vibration unit 130. The vibration unit 130 may refer to a part in the laminated structure that may produce elastic deformation. The acoustic transducer unit 120 may refer to a part in the laminated structure that converts the deformation of the vibration unit 120 into an electrical signal. In some embodiments, the vibration unit 130 may be located on the upper surface or the lower surface of the acoustic transducer unit 120. In some embodiments, the vibration unit 130 may include at least one elastic layer. For illustrative purposes only, the vibration unit 130 shown in FIG. 1 may include a first elastic layer 131 and a second elastic layer 132 arranged in sequence from top to bottom. The first elastic layer 131 and the second elastic layer 132 may be plate-shaped structures made of a semiconductor material. In some embodiments, the semiconductor material may include silicon dioxide, silicon nitride, gallium nitride, zinc oxide, silicon carbide, or the like. In some embodiments, the materials of the first elastic layer 131 and the second elastic layer 132 may be the same or different. In some embodiments, the acoustic transducer unit 120 may include at least a first electrode layer 121, a piezoelectric layer 122, and a second electrode layer 123 arranged in sequence from top to bottom. The elastic layer (e.g., the first elastic layer 131 and the second elastic layer 132) may be located on the upper surface of the first electrode layer 121 or the lower surface of the second electrode layer 123. The piezoelectric layer 122 may generate a voltage (potential difference) under a deformation stress of the vibration unit 130 (e.g., the first elastic layer 131 and the second elastic layer 132) based on a piezoelectric effect, ang the first electrode layer 121 and the second electrode layer 123 may export the voltage (electrical signal). In some embodiments, the material of the piezoelectric layer may include a piezoelectric film material. The piezoelectric film material may be a film material (such as an AlN film material) prepared by a deposition process (such as a magnetron sputtering deposition process). In another embodiments, the material of the piezoelectric layer 122 may include a piezoelectric crystal material and a piezoelectric ceramic material. The piezoelectric crystal material may refer to a piezoelectric monocrystal. In some embodiments, the piezoelectric crystal material may include crystal, sphalerite, boracite, tourmaline, zincite, GaAs, barium titanate and its derivative structure crystals, $KH_2PO_4$, $NaKC_4H_4O_6 \cdot 4H_2O$ (Rochellel salt), or the like, or any combination thereof. The piezoelectric ceramic material may refer to piezoelectric polycrystals formed by the random collection of fine grains obtained by solid-state reaction and sintering of different material powders. In some embodiments, the piezoelectric ceramic material may include barium titanate (BT), lead zirconate titanate (PZT), lead barium lithium niobate (PBLN), modified lead titanate aluminum nitride (AlN), zinc oxide (ZnO), or the like, or any combination thereof. In some embodiments, the piezoelectric layer material may also be a piezoelectric polymer material, such as polyvinylidene fluoride (PVDF). In some embodiments, the first electrode layer 121 and the second electrode layer 123 may be conductive material structures. Exemplarily, conductive materials may include a metal, an alloy material, a metal oxide material, graphene, or the like, or any combination thereof. In some embodiments, the metal and the alloy material may include nickel, iron, lead, platinum, titanium, copper, molybdenum, zinc, or any combination thereof. In some embodiments, the alloy material may include a copper-zinc alloy, a copper-tin alloy, a copper-nickel-silicon alloy, a copper-chromium alloy, a copper-silver alloy, or the like, or any combination thereof. In some embodiments, the metal oxide material may include $RuO_2$, $MnO_2$, $PbO_2$, NiO, or the like, or any combination thereof.

When relative motion occurs between the laminated structure and the base structure 110, the deformation degrees of the vibration unit 130 (e.g., the first elastic layer 131 or the second elastic layer 132) in the laminated structure at different positions may be different, i.e., different positions of the vibration unit 130 may have different deformation stresses on the piezoelectric layer 122 of the acoustic transducer unit 120. In some embodiments, in order to improve the sensitivity of the bone conduction microphone, the acoustic transducer unit 120 may only be set at the position of larger deformation degree of the vibration unit 130, thereby improving the SNR of the bone conduction microphone 100. Correspondingly, the area of the first electrode layer 121, the piezoelectric layer 122, and/or the second electrode layer 123 of the acoustic transducer unit 120 may be less than or equal to the area of the vibration unit 130. In some embodiments, in order to further improve the SNR of the bone conduction microphone 100, the area covered by the acoustic transducer unit 120 on the vibration unit 130 may be less than or equal to ½ of the area of the vibration unit 130. Preferably, the area covered by the acoustic transducer unit 120 on the vibration unit 130 may be less than or equal to ⅓ of the area of the vibration unit 130. Further preferably, the area covered by the acoustic transducer unit 120 on the vibration unit 130 may be less than or equal to ¼ of the area of the vibration unit 130. Further, in some embodiments, the position of the acoustic transducer unit 120 may be close to the connection between the laminated structure and the base structure 110. The vibration unit 130 (e.g., the elastic layer) may produce a large deformation degree when an external force is applied near the connection between the laminated structure and the base structure 110, and the acoustic transducer unit 120 may also be subjected to a large deformation stress near the connection between the laminated structure and the base structure 110. The acoustic transducer unit 120 may be set in a region with a large deformation stress to improve the SNR of the bone conduction microphone 100 on the basis of improving the sensitivity of the bone conduction microphone 100. It should be noted that the acoustic transducer unit 120 close to the connection between the laminated structure and the base structure 110 is relative to the free end of the laminated structure. That is to say, the distance from the acoustic transducer unit 120 to the connection between the laminated structure and the base structure 110 may be less than the distance from the acoustic transducer unit 120 to the free end. In some embodiments, the sensitivity and the SNR of the bone conduction microphone 100 may be improved only by adjusting the area and position of the piezoelectric layer 122 in the acoustic transducer unit 120. For example, the first electrode layer 121 and the second electrode layer 123 may completely or partially cover the surface of the vibration unit 130, and the area of the piezoelectric layer 122 may be less than or equal to the area of the first electrode layer 121 or the second electrode layer 123. In some embodiments, the area covered by the piezoelectric layer 122 on the first electrode layer 121 or the second electrode layer 123 may be less than or equal to ½ of the area of the first electrode layer 121 or the second electrode layer 123. Preferably, the area covered by the piezoelectric layer 122 on the first electrode layer 121 or the second electrode layer 123 may be less than or equal to ⅓ of the area of the first electrode layer 121 or the second electrode layer 123. Further preferably, the area covered by the piezoelectric layer 122 on the first electrode layer 121 or the second electrode layer 123 may be less than or equal to ¼ of the area of the first electrode layer 121 or the second electrode layer 123. In some embodiments, in order to prevent short circuit caused by the connection between the first electrode layer 121 and the second electrode layer 123, the area of the first electrode layer 121 may be less than the area of the piezoelectric layer 122 or the second electrode layer 123. For example, the area of the piezoelectric layer 122, the second electrode layer 123, or the vibration unit 130 may be the same, and the area of the first electrode layer 121 may be less than the area of the vibration unit 130 (e.g., the elastic layer), the piezoelectric layer 122, or the second electrode layer 123. In this case, the entire region of the first electrode layer 121 may be located on the surface of the piezoelectric layer 122, and the edge of the first electrode layer 121 may have a certain distance from the edge of the piezoelectric layer 122, so that the first electrode layer 121 may avoid the region of poor material quality at the edge of the piezoelectric layer 122, further improving the SNR of the bone conduction microphone 100.

In some embodiments, in order to increase the output electrical signal and improve the SNR of the bone conduction microphone, the piezoelectric layer 122 may be located on one side of a neutral layer of the laminated structure. The neutral layer may refer to a plane layer whose deformation stress is approximately zero when deformation occurs in the laminated structure. In some embodiments, the SNR of the bone conduction microphone may also be improved by adjusting (e.g., increasing) the stress and stress variation gradient of the piezoelectric layer 122 per unit thickness. In some embodiments, the SNR and the sensitivity of the bone conduction microphone 100 may also be improved by adjusting the shape, thickness, material, and dimension (e.g., length, width, and thickness) of the acoustic transducer unit 120 (e.g., the first electrode layer 121, the piezoelectric layer 122, the second electrode layer 123), and the vibration unit 130 (e.g., the first elastic layer 131, the second elastic layer 132).

In some embodiments, in order to control the warping deformation of the laminated structure, it is necessary to balance the stress of each layer in the laminated structure, so that the upper and lower parts of the neutral layer of the cantilever beam may be subjected to the same type of stress (e.g., tensile stress, compressive stress), and the size of the stress may be equal. For example, when the piezoelectric layer 122 is an AlN material layer, the piezoelectric layer 122 may be arranged on one side of the neutral layer position of the cantilever beam. The AlN material layer may generally be tensile stress, and the comprehensive stress of the elastic layer on the other side of the neutral layer may also be the tensile stress.

In some embodiments, the acoustic transducer unit 120 may further include a seed layer (not shown in the figure) for providing a good growth surface structure for other layers. The seed layer may be located on the lower surface of the second electrode layer 123. In some embodiments, the material of the seed layer may be the same as that of the piezoelectric layer 122. For example, when the material of the piezoelectric layer 122 is AlN, the material of the seed layer may also be AlN. It should be noted that when the acoustic transducer unit 120 is located on the lower surface of the second electrode layer 123, the seed layer may be located on the upper surface of the first electrode layer 121. Further, when the acoustic transducer unit 120 includes the seed layer, the vibration unit 130 (e.g., the first elastic layer 131, the second elastic layer 132) may be located on the surface of the seed layer away from the piezoelectric layer 122. In other embodiments, the material of the seed layer may also be different from that of the piezoelectric layer 122.

It should be noted that the shape of the laminated structure may not be limited to the rectangle shown in FIG. 1, and may also be regular or irregular shapes such as a triangle, a trapezoid, a circle, a semicircle, ¼ circle, an ellipse, and a semi-ellipse, which is not further limited herein. In addition, the number of laminated structures may not be limited to one as shown in FIG. 1, and may also be 2, 3, 4 or more. Different laminated structures may be suspended side by side in the hollow position of the base structure, or may be suspended in the hollow position of the base structure in sequence along the arrangement direction of each layer of the laminated structure.

Figure 3:
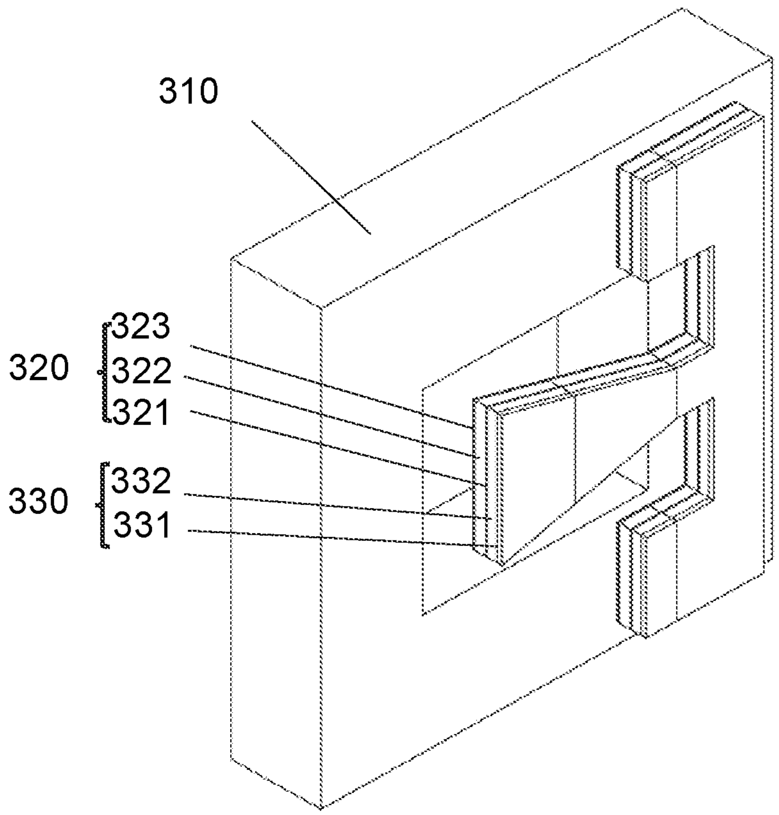
FIG. 3 is a schematic structural diagram illustrating another bone conduction microphone according to some embodiments of the present disclosure.

FIG. 3 is a schematic structural diagram illustrating another bone conduction microphone according to some embodiments of the present disclosure. The bone conduction microphone 300 shown in FIG. 3 may be substantially the same as the bone conduction microphone 100 shown in FIG. 1. The main difference is that the shape of the laminated structure of the bone conduction microphone 300 shown in FIG. 3 is different. As shown in FIG. 3, the bone conduction microphone 300 may include a base structure 310 and a laminated structure. The shape of the laminated structure may be trapezoidal. Further, a width of the laminated structure in the bone conduction microphone 300 may gradually decrease from a free end to a fixed end. In other embodiments, the width of the laminated structure in the bone conduction microphone 300 may gradually increase from the free end to the fixed end. It should be noted that the structure of the base structure 310 here may be similar to that of the base structure 110, and the structure of the vibration unit 330 may be similar to that of the vibration unit 130. For details about the first electrode 321, the piezoelectric layer 322, and the second electrode 323 of the acoustic transducer unit 320, and the first elastic layer 331 and the second elastic layer 332 in the vibration unit 330, please refer to the contents of each layer of the acoustic transducer unit 120 and the vibration unit 130 in FIG. 1. In addition, other components (e.g., the seed layer) in the acoustic transducer unit 120 and the vibration unit 130 may also be applicable to the bone conduction microphone 300 shown in FIG. 3, which is not repeated herein.

Figure 4:
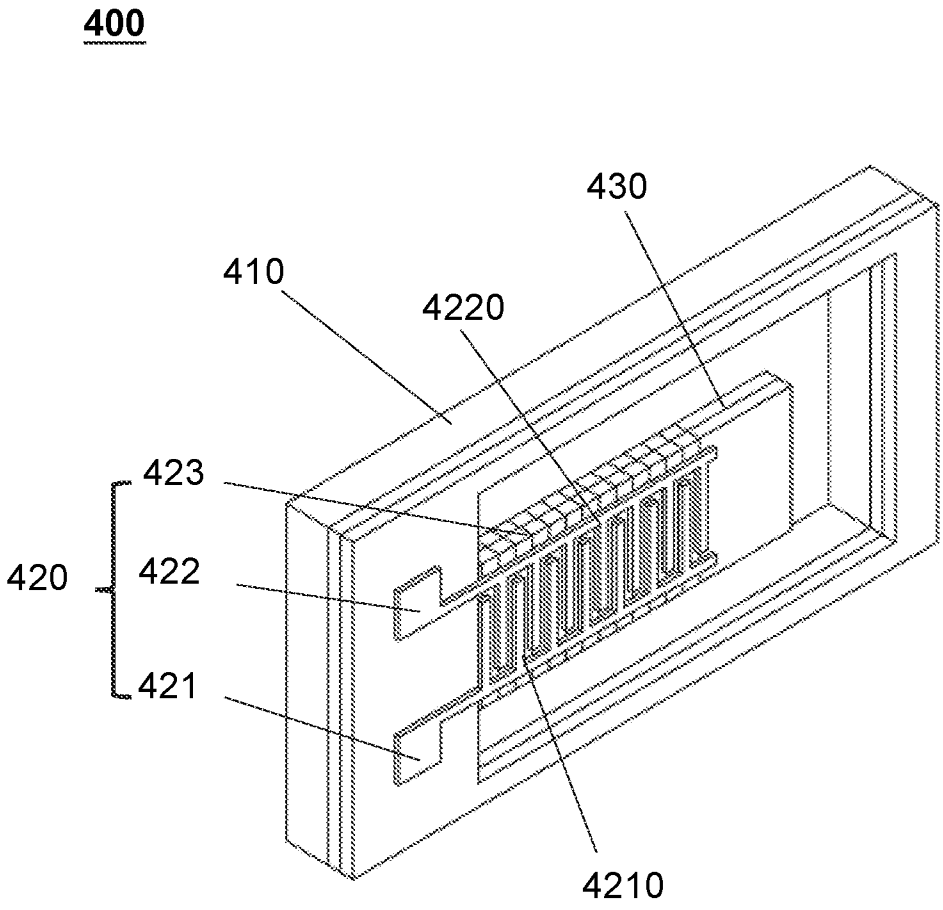
FIG. 4 is a schematic structural diagram illustrating a bone conduction microphone according to some embodiments of the present disclosure.

FIG. 4 is a schematic structural diagram illustrating a bone conduction microphone according to other embodiments of the present disclosure. As shown in FIG. 4, the bone conduction microphone 400 may include a base structure 410 and a laminated structure, and at least part of the laminated structure is connected to the base structure 410. In some embodiments, the base structure 410 may be a hollow frame structure, and part of the laminated structure (e.g., an end of the laminated structure away from a connection between the base structure 410 and the laminated structure) may be located in the hollow position of the hollow frame structure. It should be noted that the frame structure may not be limited to the cuboid shape shown in FIG. 4. In some embodiments, the frame structure may be a regular or irregular structure such as a prism or a cylinder. In some embodiments, the laminated structure may be fixedly connected to the base structure 410 in the form of a cantilever beam. Further, the laminated structure may include a fixed end and a free end. The fixed end of the laminated structure may be fixedly connected to the frame structure, and the free end of the laminated structure may not be connected or contacted with the frame structure, so that the free end of the laminated structure may be suspended in the hollow position of the hollow frame structure. In some embodiments, the fixed end of the laminated structure may be connected to an upper surface, a lower surface of the base structure 410, or a side wall where the hollow position of the base structure 410 is located. In some embodiments, the side wall where the hollow position of the base structure 410 is located may also be provided with a mounting groove adapted to the fixed end of the laminated structure, so that the fixed end of the laminated structure and the base structure 410 may be connected in a cooperated manner. The "connection" here may be understood as fixedly connecting the laminated structure and the base structure 410 by means of welding, riveting, clipping, bolts, etc., after preparing the laminated structure and the base structure 410 respectively. In some embodiments, the laminated structure may also be deposited on the base structure 410 by physical deposition (e.g., physical vapor deposition) or chemical deposition (e.g., chemical vapor deposition) during the manufacturing process. In some embodiments, one or more laminated structures may be arranged on the base structure 410. For example, the number of laminated structures may be 1, 2, 3, 7, etc. Further, the multiple laminated structures may be evenly arranged equidistantly along a circumferential direction of the base structure 410, or may also be unevenly arranged.

In some embodiments, the laminated structure may include an acoustic transducer unit 420 and a vibration unit 430. The vibration unit 430 may be located on an upper surface or a lower surface of the acoustic transducer unit 420. In some embodiments, the vibration unit 430 may include at least one elastic layer. The elastic layer may be a plate-shaped structure made of a semiconductor material. In some embodiments, the semiconductor material may include silicon dioxide, silicon nitride, gallium nitride, zinc oxide, silicon carbide, or the like. In some embodiments, the acoustic transducer unit 420 may include an electrode layer and a piezoelectric layer 423. The electrode layer may include a first electrode 421 and a second electrode 422. In the embodiment of the present disclosure, the piezoelectric layer 423 may generate a voltage (potential difference) under a deformation stress of the vibration unit 430 based on a piezoelectric effect, and the first electrode 421 and the second electrode 422 may export the voltage (electrical signal). In some embodiments, the first electrode 421 and the second electrode 422 may be arranged on the same surface (e.g., the upper surface or the lower surface) of the piezoelectric layer 423 at intervals, and the electrode layer and the vibration unit 430 may be located on different surfaces of the piezoelectric layer 423. For example, when the vibration unit 430 is located on the lower surface of the piezoelectric layer 423, the electrode layer (the first electrode 421 and the second electrode 422) may be located on the upper surface of the piezoelectric layer 423. As another example, when the vibration unit 430 is located on the upper surface of the piezoelectric layer 423, the electrode layer (the first electrode 421 and the second electrode 422) may be located on the lower surface of the piezoelectric layer 423. In some embodiments, the electrode layer and the vibration unit 430 may also be located on the same side of the piezoelectric layer 423. For example, the electrode layer may be located between the piezoelectric layer 423 and the vibration unit 430. In some embodiments, the first electrode 421 may be bent into a first comb-shaped structure 4210. The first comb-shaped structure 4210 may include a plurality of comb structures. There is a first spacing between the adjacent comb structures of the first comb-shaped structure 4210. The first spacing may be the same or different. The second electrode 422 may be bent into a second comb-shaped structure 4220. The second comb-shaped structure 4220 may include a plurality of comb structures. There is a second spacing between the adjacent comb structures of the second comb-shaped structure 4220. The second spacing may be the same or different. The first comb-shaped structure 4210 and the second comb-shaped structure 4220 may be matched to form an electrode layer. Further, the comb structures of the first comb-shaped structure 4210 may extend into the second spacing of the second comb-shaped structure 4220, and the comb structure of the second comb-shaped structure 4220 may extend into the first spacing of the first comb-shaped structure 4210, so as to match with each other to form the electrode layer. The first comb-shaped structure 4210 and the second comb-shaped structure 4220 may match with each other, so that the first electrode 421 and the second electrode 422 may be arranged compactly but may not intersect. In some embodiments, the first comb-shaped structure 4210 and the second comb-shaped structure 4220 may extend along a length direction of a cantilever beam (e.g., the direction from the fixed end to the free end). In some embodiments, the piezoelectric layer 423 may be preferably a piezoelectric ceramic material. When the piezoelectric layer 423 is the piezoelectric ceramic material, a polarization direction of the piezoelectric layer 423 may be consistent with the length direction of the cantilever beam. The characteristic of piezoelectric constant d33 of the piezoelectric ceramic may be used to greatly enhance the output signal and improve the sensitivity. The piezoelectric constant d33 may refer to a proportionality constant for converting mechanical energy into electrical energy by the piezoelectric layer. It should be noted that the piezoelectric layer 423 shown in FIG. 4 may also be made of other materials. When the polarization direction of the piezoelectric layer 423 of other materials is consistent with the thickness direction of the cantilever beam, the acoustic transducer unit 420 may be replaced by the acoustic transducer unit 120 shown in FIG. 1.

When relative motion occurs between the laminated structure and the base structure 410, the deformation degrees of the vibration unit 430 in the laminated structure may be different at different positions, i.e., different positions of the vibration unit 430 may have different deformation stresses on the piezoelectric layer 423 of the acoustic transducer unit 420. In some embodiments, in order to improve the sensitivity of the bone conduction microphone, the acoustic transducer unit 420 may only be set at the position of a large deformation degree of the vibration unit 430, thereby improving the SNR of the bone conduction microphone 400. Correspondingly, the area of the electrode layer and/or the piezoelectric layer 423 of the acoustic transducer unit 420 may be less than or equal to the area of the vibration unit 430. In some embodiments, in order to further improve the SNR of the bone conduction microphone 400, the area covered by the acoustic transducer unit 420 on the vibration unit 430 may be less than the area of the vibration unit 430. Preferably, the area covered by the acoustic transducer unit 420 on the vibration unit 430 may be less than or equal to ½ of the area of the vibration unit 430. Preferably, the area covered by the acoustic transducer unit 420 on the vibration unit 430 may be less than or equal to ⅓ of the area of the vibration unit 430. Further preferably, the area covered by the acoustic transducer unit 420 on the vibration unit 430 may be less than or equal to ¼ of the area of the vibration unit 430. Further, in some embodiments, the acoustic transducer unit 420 may be close to the connection between the laminated structure and the base structure 410. Since the vibration unit 430 (e.g., the elastic layer) may produce a large deformation degree near the connection between the laminated structure and the base structure 410, the acoustic transducer unit 420 may also be subjected to a large deformation stress near the connection between the laminated structure and the base structure 410. Therefore, the acoustic transducer unit 420 may be arranged in the region with relatively large deformation stress to improve the SNR of the bone conduction microphone 400 on the basis of improving the sensitivity of the bone conduction microphone 400. It should be noted that the acoustic transducer unit 420 close to the connection between the laminated structure 410 and the base structure may be relative to the free end of the laminated structure, i.e., the distance from the acoustic transducer unit 420 to the connection between the laminated structure and the base structure 410 may be less than the distance from the acoustic transducer unit 420 to the free end. In some embodiments, the sensitivity and the SNR of the bone conduction microphone 100 may be improved only by adjusting the area and position of the piezoelectric layer 423 in the acoustic transducer unit 420. For example, the electrode layer may completely or partially cover the surface of the vibration unit 430, and the area of the piezoelectric layer 423 may be less than or equal to the area of the electrode layer. Preferably, the area covered by the piezoelectric layer 423 on the vibration unit 130 may be less than or equal to ½ of the area of the electrode layer. Preferably, the area covered by the piezoelectric layer 423 on the vibration unit 430 may be less than or equal to ⅓ of the area of the piezoelectric layer. Further preferably, the area covered by the piezoelectric layer 423 on the vibration unit 430 may be less than or equal to ¼ of the area of the electrode layer. In some embodiments, the area of the piezoelectric layer 423 may be the same as the area of the vibration unit 430. The entire region of the electrode layer may be located at the piezoelectric layer 423, and the edge of the electrode layer may have a certain distance from the edge of the piezoelectric layer 423, so that the first electrode 421 and the second electrode 422 in the electrode layer may avoid the region of poor material quality at the edge of the piezoelectric layer 423, thereby further improving the SNR of the bone conduction microphone 400.

In some embodiments, in order to increase the output electrical signal and improve the SNR of the bone conduction microphone, the shape, thickness, material, and dimension (e.g., length, width, thickness) of the acoustic transducer unit 420 (e.g., the first electrode 421, the piezoelectric layer 423, and the second electrode 422), and the vibration unit 430 (e.g., elastic layer) may be adjusted to improve the SNR and the sensitivity of the bone conduction microphone 400.

In some embodiments, in order to increase the output electrical signal and improve the SNR of the bone conduction microphone, the length and width of the single comb structure, the spacing between the comb structures (e.g. the first spacing and the second spacing) of the first comb-shaped structure 4210 and the second comb-shaped structure 4220, and the length of the entire acoustic transducer unit 420 may be adjusted to increase the output voltage electrical signal and improve the SNR of the bone conduction microphone.

Figure 5:
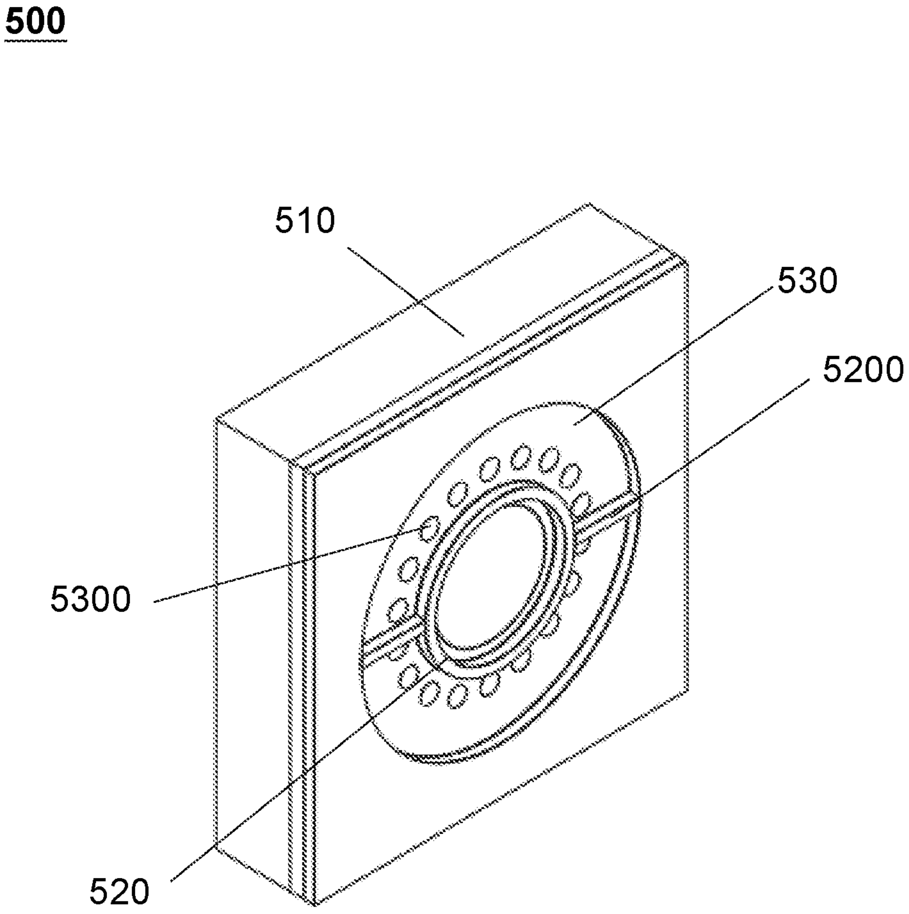
FIG. 5 is a schematic structural diagram illustrating a bone conduction microphone according to some embodiments of the present disclosure.
Figure 6:
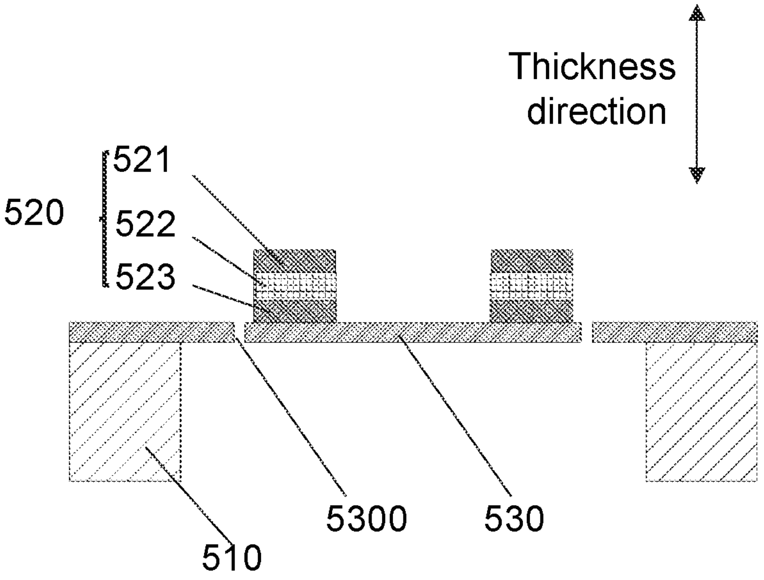
FIG. 6 is a sectional view of a partial structure of a bone conduction microphone in FIG. 5 according to some embodiments of the present disclosure.

FIG. 5 is a schematic structural diagram illustrating a bone conduction microphone according to some embodiments of the present disclosure. FIG. 6 is a sectional view of a partial structure of a bone conduction microphone in FIG. 5 according to some embodiments of the present disclosure. As shown in FIGS. 5 and 6, the bone conduction microphone 500 may include a base structure 510 and a laminated structure, and at least part of the laminated structure is connected to the base structure 510. In some embodiments, the base structure 510 may be a hollow frame structure, and part of the laminate structure may be located in a hollow position of the hollow frame structure. It should be noted that the frame structure may not limited to the cuboid shape shown in FIG. 5. In some embodiments, the frame structure may be a regular or irregular structure such as a prism or a cylinder.

In some embodiments, the laminated structure may include an acoustic transducer unit 520 and a vibration unit.

In some embodiments, a resonant frequency of the bone conduction microphone (or bone conduction sound transmission device) may be positively correlated with a stiffness of the vibration unit. When other parameters (e.g., the mass of the laminated structure, etc.) remain constant, the greater the stiffness of the vibration unit is, the higher the resonant frequency of the bone conduction microphone is. The smaller the stiffness of the vibration unit is, the lower the resonant frequency of the bone conduction microphone is.

In some embodiments, the resonant frequency of the bone conduction microphone may be negatively correlated with the mass of the laminated structure. When other parameters (e.g., the stiffness of the vibration unit, etc.) remain constant, the greater the mass of the laminated structure is, the lower the resonant frequency of the bone conduction microphone is, the smaller the mass of the laminated structure is, the higher the resonant frequency of the bone conduction microphone is.

In some embodiments, the vibration unit may be arranged on an upper surface or a lower surface of the acoustic transducer unit 520. As shown in FIG. 5, the vibration unit may include a suspension membrane structure 530. The suspension membrane structure 530 may be fixed on the base structure 510 by connecting a peripheral side with the base structure 510. The central region of the suspension membrane structure 530 may be suspended in the hollow position of the base structure 510. In some embodiments, the suspension membrane structure 530 may be located on the upper surface or the lower surface of the base structure 510. In some embodiments, the peripheral side of the suspension membrane structure 530 may also be connected to an inner wall of the hollow position of the base structure 510. The "connection" here may be understood as fixing the suspension membrane structure 530 to the upper surface or the lower surface of the base structure 510 or the side wall of the hollow position of the base structure 510 by mechanical fixing (e.g., strong bonding, riveting, clamping, inlaying, etc.) after preparing the suspension membrane structure 530 and the base structure 510 respectively, or depositing the suspension membrane structure 530 on the base structure by physical deposition (e.g., physical vapor deposition) or chemical deposition (e.g., chemical vapor deposition) during the preparation process.

In some embodiments, the stiffness of the vibration unit may be the stiffness of the suspension membrane structure 530.

In some embodiments, the suspension membrane structure 530 may include at least one elastic layer. The elastic layer may be a film-shaped structure made of a semiconductor material. In some embodiments, the semiconductor material may include silicon dioxide, silicon nitride, gallium nitride, zinc oxide, silicon carbide, monocrystalline silicon, polycrystalline silicon, or the like. In some embodiments, the suspension membrane structure 530 may be made of one of the above-mentioned semiconductor materials or two or more of the above-mentioned semiconductor materials stacked and compounded along a thickness direction. For example, the suspension membrane structure 530 may be a composite layer of single crystal silicon (or polycrystalline silicon) and silicon dioxide, a composite layer of single crystal silicon (or polycrystalline silicon) and silicon nitride, or a composite layer of silicon nitride and single crystal silicon (or polycrystalline silicon) and silicon dioxide.

Figure 22:
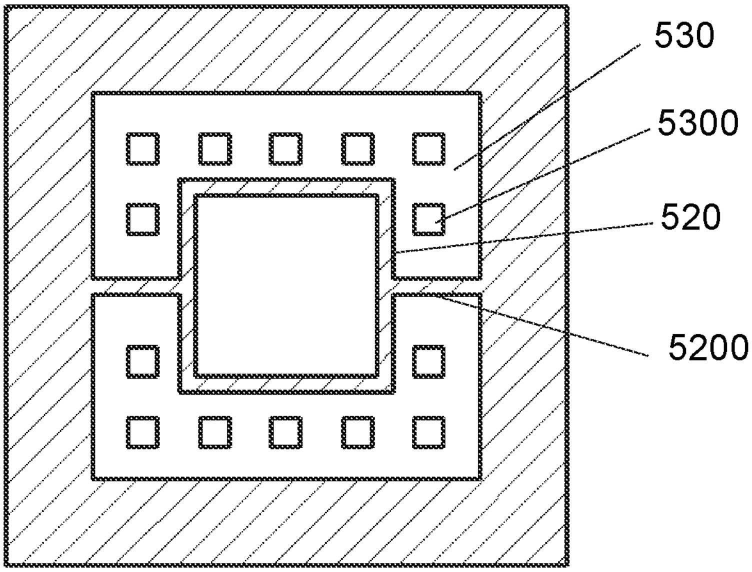
FIG. 22 is a schematic diagram illustrating a suspension membrane structure and holes in a bone conduction microphone according to some embodiments of the present disclosure.
Figure 23:
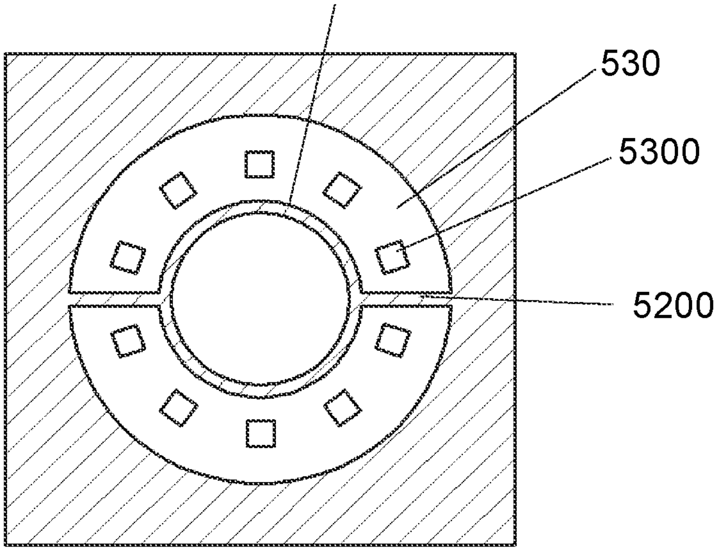
FIG. 23 is a schematic diagram illustrating a suspension membrane structure and holes in another bone conduction microphone according to some embodiments of the present disclosure.

In some embodiments, the shape of the suspension membrane structure 530 may be a circle, an ellipse or a triangle, a quadrangle, a pentagon, a hexagon, and other polygons, or other arbitrary shapes. For example, as shown in FIG. 22, the shape of the suspension membrane structure 530 may be a quadrilateral. In some embodiments, as shown in FIG. 23, the shape of the suspension membrane structure 530 may be a circle. In some embodiments, the shape of the suspension membrane structure 530 may be a circle, and a radius of the suspension membrane structure 530 may be within a range of 500 μm-1500 μm. In some embodiments, the radius of the suspension membrane structure 530 may be within a range of 520 μm-1400 μm. In some embodiments, the radius of the suspension membrane structure 530 may be within a range of 550 μm-1300 μm. In some embodiments, the radius of the suspension membrane structure 530 may be within a range of 570 μm-1200 μm. In some embodiments, the radius of the suspension membrane structure 530 may be within a range of 600 μm-1100 μm. In some embodiments, the radius of the suspension membrane structure 530 may be within a range of 630 μm-1000 μm. In some embodiments, the radius of the suspension membrane structure 530 may be within a range of 650 μm-900 μm. In some embodiments, the radius of the suspension membrane structure 530 may be within a range of 670 μm-850 μm. It should be noted that the shape and dimension (e.g., radius) of the suspension membrane structure 530 in the present disclosure may be the shape and dimension of the cross-section perpendicular to the thickness direction (the direction indicated by the arrow in FIG. 6).

In some embodiments, the acoustic transducer unit 520 may be located on the upper surface or the lower surface of the suspension membrane structure 530.

In some embodiments, the suspension membrane structure 530 may include a hole 5300 arranged on an outer side or an inner side of the acoustic transducer unit 520. In some embodiments, the suspension membrane structure 530 may include a plurality of holes 5300 distributed around the center of the acoustic transducer unit 520 along a circumferential direction (e.g., an outer circumferential direction and/or an inner circumferential direction) of the acoustic transducer unit 520. It can be understood that by setting the plurality of holes 5300 in the suspension membrane structure 530, the stiffness of the suspension membrane structure 530 may be adjusted at different positions, so that the stiffness of the suspension membrane structure 530 in the region near the plurality of holes 5300 may be reduced, and the stiffness of the suspension membrane structure 530 in the region away from the plurality of holes 5300 may be relatively large. When relative motion occurs between the suspension membrane structure 530 and the base structure 510, the deformation degree of the suspension membrane structure 530 in the region near the plurality of holes 5300 may be relatively large, and the deformation degree of the suspension membrane structure 530 in the region away from the plurality of holes 5300 may be small. At this time, the acoustic transducer unit 520 may be placed in the region near the plurality of holes 5300 on the suspension membrane structure 530 to be more conducive to the acquisition of a vibration signal by the acoustic transducer unit 520, thereby effectively improving the sensitivity of the bone conduction microphone 500. At the same time, the structure of each component in the bone conduction microphone 500 may be relatively simple, which is convenient for production or assembly.

Figure 24:
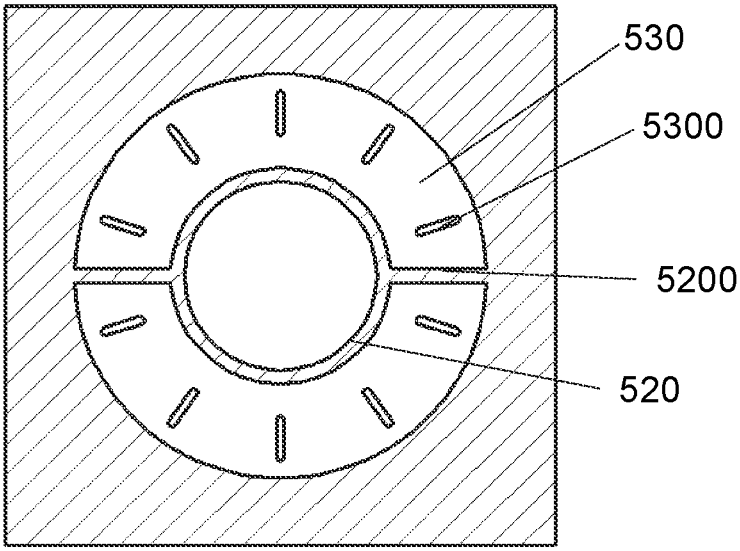
FIG. 24 is a schematic diagram illustrating a suspension membrane structure and holes in another bone conduction microphone according to some embodiments of the present disclosure.
Figure 25:
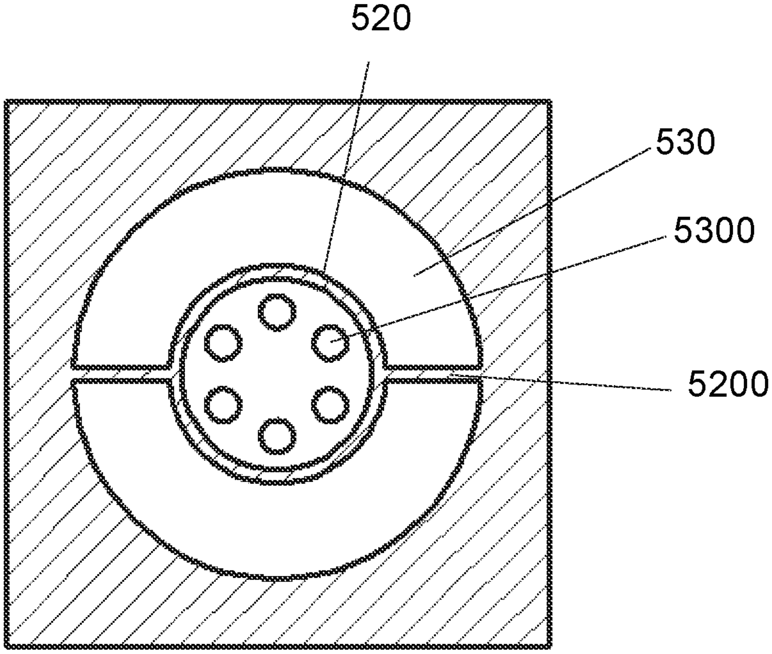
FIG. 25 is a schematic diagram illustrating a suspension membrane structure and holes in another bone conduction microphone according to some embodiments of the present disclosure.
Figure 26:
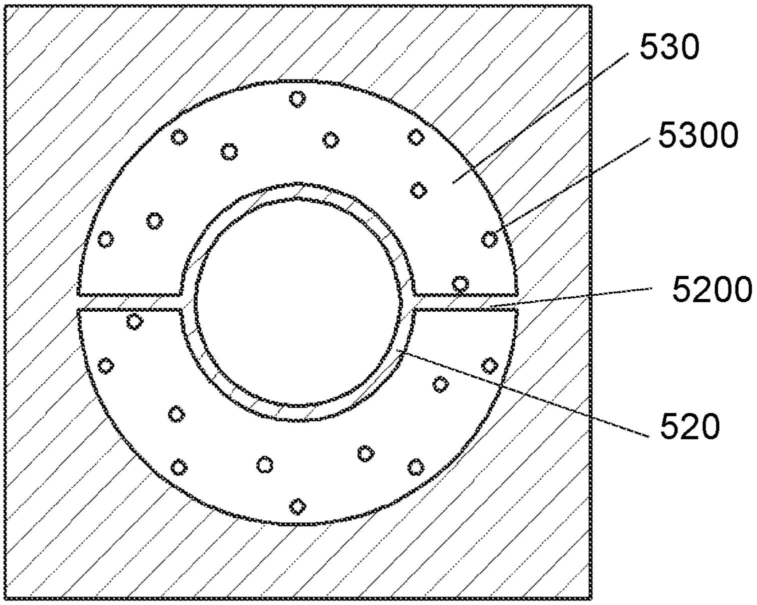
FIG. 26 is a schematic diagram illustrating a suspension membrane structure and holes in another bone conduction microphone according to some embodiments of the present disclosure.

In some embodiments, the holes 5300 on the suspension membrane structure 530 may be in any shape such as a circular hole, an elliptic hole, a square hole, or other polygonal holes. For example, as shown in FIGS. 22 and 23, the holes 5300 may be square holes. For example, as shown in FIG. 24, the holes 5300 may be irregularly shaped holes. Preferably, as shown in FIGS. 25 and 26, the holes 5300 may be circular holes, which may reduce local stress concentration and improve the sensitivity of the bone conduction microphone. In some embodiments, the holes 5300 may be circular holes, and the radii of the holes 5300 may be within a range of 20 μm-300 μm. In some embodiments, the radii of the holes 5300 may be within a range of 25 μm-250 μm. In some embodiments, the holes 5300 may be non-through holes (e.g., grooves in the suspension membrane). In some embodiments, the holes 5300 may be through holes. In some embodiments, the number of holes 5300 may be one or more. For example, the number of holes 5300 may include 2, 4, 6, 8, 10, 12, 14, 16, and 18.

In some embodiments, as shown in FIGS. 22-24, the holes 5300 may be distributed in an outer circumferential direction of the acoustic transducer unit 520. In some embodiments, as shown in FIG. 25, the holes 5300 may also be distributed in an inner circumferential direction of the acoustic transducer unit 520. In some embodiments, the holes 5300 may be evenly or unevenly distributed in an outer circumferential direction and/or inner circumferential direction of the acoustic transducer unit 520. Preferably, as shown in FIGS. 23-25, the holes 5300 may be equidistantly and evenly distributed in an outer circumferential direction and/or inner circumferential direction of the acoustic transducer unit 520. In some embodiments, the holes 5300 may be enclosed in one, two, or more circles. For example, as shown in FIGS. 23-25, the holes 5300 may be enclosed in one circle. As another example, as shown in FIG. 26, the holes 5300 may be enclosed in two circles. Preferably, the holes 5300 may be enclosed in one circle. In some embodiments, the shape enclosed by the holes 5300 may be circular, oval, square, polygonal, or other regular or irregular shapes. It should be noted that the shape enclosed by the holes 5300 in the present disclosure may be the shape enclosed by the center of the circle (or center) of the holes 5300, and the dimension of the shape enclosed by the center of the circle of the holes 5300 may be a distance of the two farthest points on the shape enclosed by the center of the circle of the holes 5300. For example, the shape enclosed by the center of the circle of the holes 5300 may be a circle, and the dimension of the shape enclosed by the center of the circle of the holes 5300 may refer to the diameter of the circle. As another example, the shape enclosed by the center of the circle of the holes 5300 may be a square, and the dimension of the shape enclosed by the center of the circle of the holes 5300 may refer to the length of the diagonal of the square. As another example, the shape enclosed by the center of the circle of the holes 5300 may be an irregular shape, and the dimension of the shape enclosed by the center of the circle of the holes 5300 may refer to the distance between the two farthest vertexes of the irregular shape.

Figure 27:
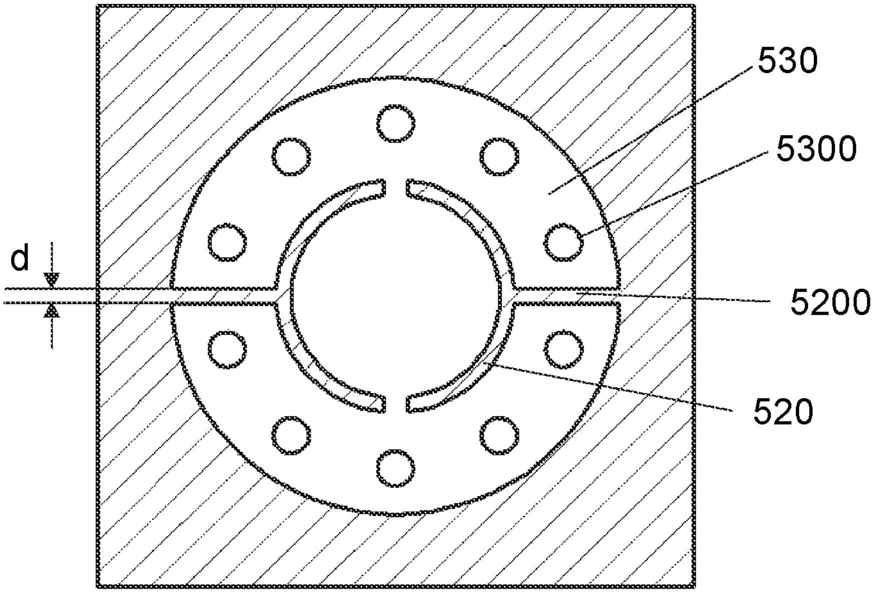
FIG. 27 is a schematic diagram illustrating an acoustic transducer unit in a bone conduction microphone according to some embodiments of the present disclosure.

In some embodiments, the shape of the acoustic transducer unit 520 may include a square, a circle, an ellipse, a curved ring, a polygon, or other regular or irregular shapes. For example, as shown in FIG. 22, the shape of the acoustic transducer unit 520 may be a square. As another example, as shown in FIGS. 23-27, the shape of the acoustic transducer unit 520 may be a ring. In some embodiments, the shape of the acoustic transducer unit 520 may be a ring with one or more openings. For example, as shown in FIG. 27, the shape of the acoustic transducer unit 520 may be a ring with two openings. In some embodiments, the acoustic transducer unit 520 may be a circular closed ring.

It should be noted that the shape of the acoustic transducer unit 520 in one or more embodiments of the present disclosure may refer to the shape of the cross-section perpendicular to the thickness direction (the direction indicated by the arrow in FIG. 6) of the acoustic transducer unit.

In some embodiments, the relevant dimensions of the acoustic transducer unit 520 (e.g., the inner or outer diameter of the acoustic transducer unit) may affect the resonant frequency of a vibration system. In some embodiments, the dimension of the acoustic transducer unit may include an outer diameter and/or an inner diameter of a cross-section of the acoustic transducer unit perpendicular to the thickness direction. In some embodiments, the outer diameter of the acoustic transducer unit 520 may refer to the outer diameter of the cross-section of the acoustic transducer unit 520 perpendicular to the thickness direction. In some embodiments, the inner diameter of the acoustic transducer unit 520 may refer to the inner diameter of the cross-section of the acoustic transducer unit 520 perpendicular to the thickness direction. The outer diameter of the cross-section may refer to the distance between the two furthest points on an outer edge of the cross-section. For example, if the cross-section is circular, the outer diameter of the cross-section may refer to the diameter of the circle. For another example, if the cross-section is an ellipse, the outer diameter of the cross-section may refer to the major diameter of the ellipse. As another example, if the cross-section is a rectangle, the outer diameter of the cross-section may refer to the length of the diagonal of the rectangle. As another example, if the cross-section is a trapezoid, the outer diameter of the cross-section may refer to the distance between the two furthest vertexes of the quadrilateral. The inner diameter of the cross-section may refer to the distance between the two closest points on the inner edge of the cross-section, and a straight line passing through the two closest points may pass through the geometric center of the inner edge. For example, if the shape of the inner edge of the cross-section is a circle, the inner diameter of the cross-section may refer to the diameter of the circle. As another example, if the shape of the inner edge of the cross-section is an ellipse, the inner diameter of the cross-section may refer to the minor diameter of the ellipse. As another example, if the shape of the inner edge of the cross-section is a rectangle, the inner diameter of the cross-section may refer to the length of the short side of the rectangle.

In some embodiments, the acoustic transducer unit 520 may include at least an effective acoustic transducer unit. The effective acoustic transducer unit may refer to a partial structure of the acoustic transducer unit that ultimately contributes an electrical signal. In some embodiments, the inner diameter of the effective acoustic transducer unit 520 may be within a range of 100 μm-700 μm. In some embodiments, the inner diameter of the effective acoustic transducer unit 520 may be within a range of 130 μm-600 μm. In some embodiments, the inner diameter of the effective acoustic transducer unit 520 may be within a range of 150 μm-500 μm. In some embodiments, the inner diameter of the effective acoustic transducer unit 520 may be within a range of 200 μm-400 μm. In some embodiments, the outer diameter of the effective acoustic transducer unit 520 may be within a range of 110 μm-710 μm. In some embodiments, the outer diameter of the effective acoustic transducer unit 520 may be within a range of 150 μm-650 μm. In some embodiments, the outer diameter of the effective acoustic transducer unit 520 may be within a range of 200 μm-620 μm. In some embodiments, the outer diameter of the effective acoustic transducer unit 520 may be within a range of 250 μm-600 μm.

In some embodiments, the shape enclosed by the plurality of holes 5300 may be consistent with the shape of the acoustic transducer unit 520. For example, as shown in FIG. 22, the shape of the acoustic transducer unit 520 may be a square, and the shape enclosed by the plurality of holes 5300 may be a square. For another example, as shown in FIG. 23, the shape enclosed by the plurality of holes 5300 may be a circle, and the shape of the acoustic transducer unit 520 may be a circle. In some embodiments, the shapes of the holes 5300 may be consistent with the shape of the acoustic transducer unit 520. For example, as shown in FIG. 22, the shapes of the plurality of holes 5300 may be squares, and the shape of the acoustic transducer unit 520 may be a square. Preferably, the plurality of holes 5300 may be distributed in a circular shape along the outer circumferential direction of the acoustic transducer unit 520. In some embodiments, the shapes of the plurality of holes 5300 may be consistent or inconsistent. For example, the shape of the plurality of holes 5300 may be one of circular, elliptical, square, polygonal, or irregular shapes. For example, the shapes of the plurality of holes 5300 may include a combination of two or more of circular, oval, square, polygonal, and irregular shapes. In some embodiments, the radius of a circle enclosed by the plurality of holes 5300 may be within a range of 300 μm-700 μm. In some embodiments, the radius of the circle enclosed by the plurality of holes 5300 may be within a range of 350 μm-650 μm.

In some embodiments, the outer diameter of the effective acoustic transducer unit 520 may be less than, equal to, or greater than the dimension of the shape enclosed by the center of the circle of each of the plurality of holes 5300. In some embodiments, the inner diameter of the effective acoustic transducer unit 520 may be less than, equal to, or greater than the dimension of the shape enclosed by the center of the circle of each of the plurality of holes 5300. Preferably, the shape of the acoustic transducer unit 520 may be a ring (i.e., the inner and outer sides of the cross-section of the acoustic transducer unit 520 perpendicular to the thickness direction may be circular), and the shape enclosed by the plurality of holes 5300 may be circular, the radius of the inner edge of the effective acoustic transducer unit 520 (i.e., the radius inside the cross-section of the effective acoustic transducer unit 520 perpendicular to the thickness direction) may be less than the radius of the circle enclosed by the plurality of holes 5300. In some embodiments, the radius of the inner edge of the effective acoustic transducer unit 520 may be less than the radius of the circle enclosed by the plurality of holes 5300, and the difference between the radius of the inner edge of the effective acoustic transducer unit 520 and the radius of the circle enclosed by the plurality of holes 5300 may be within a range of 50 μm-300 μm. In some embodiments, the difference between the radius of the inner edge of the effective acoustic transducer unit 520 and the radius of the circle enclosed by the plurality of holes 5300 may be within a range of 70 μm-250 μm. In some embodiments, the difference between the radius of the inner edge of the effective acoustic transducer unit 520 and the radius of the circle enclosed by the plurality of holes 5300 may be within a range of 90 μm-230 μm.

In some embodiments, the outer diameter of the effective acoustic transducer unit 520 may be less than, equal to, or greater than a dimension of a hollow cavity of the base structure 510. In some embodiments, the inner diameter of the effective acoustic transducer unit 520 may be less than, equal to, or greater than the dimension of the hollow cavity of the base structure 510. The dimension of the hollow cavity of the base structure 510 may be the distance between the two farthest points on the inner edge of the cross-section of the base structure 510 perpendicular to the thickness direction. The shape and dimension of the inner edge of the cross-section on the base structure 510 perpendicular to the thickness direction may be similar to the shape enclosed by the center of the circle of the plurality of holes 5300 and the dimension of the shape, which is not repeated herein. Preferably, the outer diameter of the effective acoustic transducer unit 520 may be less than the dimension of the hollow cavity of the base structure 510. In some embodiments, the outer diameter of the effective acoustic transducer unit 520 may be less than the size of the hollow cavity of the base structure 510, and the difference between the dimension of the hollow cavity of the base structure 510 and the outer diameter of the effective acoustic transducer unit 520 may be within a range of 5 μm-400 μm. In some embodiments, the shape of the acoustic transducer unit 520 and the shape of the hollow cavity of the base structure 510 may be the same or different. In some embodiments, when the shape of the acoustic transducer unit 520 and the shape of the hollow cavity of the base structure 510 are the same, the difference between the dimension of the hollow cavity of the base structure 510 and the outer diameter of the effective acoustic transducer unit 520 may be within a range of 5 μm-400 μm.

For example, the shape of the acoustic transducer unit 520 may be a ring, the shape of the hollow cavity of the base structure 510 may be circular, and the difference between the outer diameter of the effective acoustic transducer unit 520 and the dimension of the hollow cavity of the base structure 510 may be within a range of 5 μm-400 μm. In some embodiments, the difference between the maximum outer diameter of the effective acoustic transducer unit 520 and the maximum dimension of the hollow cavity of the base structure 510 may be within a range of 20 μm-380 μm. In some embodiments, the difference between the maximum outer diameter of the effective acoustic transducer unit 520 and the maximum dimension of the hollow cavity of the base structure 510 may be within a range of 50 μm-350 μm. In some embodiments, the difference between the maximum outer diameter of the effective acoustic transducer unit 520 and the maximum dimension of the hollow cavity of the base structure 510 may be within a range of 80 μm-320 μm.

In some embodiments, the resonant frequency (causing the resonant frequency within a range of 2 kHz-5 kHz) and stress distribution of the bone conduction microphone 500 may also be adjusted by changing the dimension, quantity, distance, and position of the plurality of holes 5300, so as to improve the sensitivity of the bone conduction microphone 500. It should be noted that the resonant frequency may not be limited to the above-mentioned range of 2 kHz-5 kHz, but may also be within a range of 3 kHz-4.5 kHz or 4 kHz-4.5 kHz. The range of resonant frequency may be adjusted according to different application scenarios, which is not further limited herein.

According to FIGS. 5 and 6, in some embodiments, the acoustic transducer unit 520 may include a first electrode layer 52, a piezoelectric layer 522, and a second electrode layer 523 arranged in sequence from top to bottom, the position of the first electrode layer 521 and the position of the second electrode layer 523 may be interchanged. The piezoelectric layer 522 may generate a voltage (potential difference) under deformation stress of the vibration unit (e.g., the suspension membrane structure 530) based on the piezoelectric effect, and the first electrode layer 521 and the second electrode layer 523 may export the voltage (electrical signal). In some embodiments, the material of the piezoelectric layer may include a piezoelectric film material, and the piezoelectric film material may be a film material (e.g., an AlN film material) prepared by a deposition process (such as a magnetron sputtering deposition process). In other embodiments, the material of the piezoelectric layer may include a piezoelectric crystal material and a piezoelectric ceramic material. The piezoelectric crystal may refer to a piezoelectric monocrystal. In some embodiments, the piezoelectric crystal material may include crystal, sphalerite, boracite, tourmaline, zincite, GaAs, barium titanate, and its derivative structure crystals, $KH_2PO_4$, $NaKC_4H_4O_6{\cdot}4H_2O$ (Rochelle salt), sugar, or the like, or any combination thereof. The piezoelectric ceramic material may refer to a piezoelectric polycrystal formed by the random collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate aluminum nitride (AlN), zinc oxide (ZnO), or the like, or any combination thereof. In some embodiments, the piezoelectric layer 522 may also be a piezoelectric polymer material, such as polyvinylidene fluoride (PVDF). In some embodiments, the first electrode layer 521 and the second electrode layer 523 may be made of a conductive material. Exemplarily, the conductive material may include a metal, an alloy material, a metal oxide material, graphene, or the like, or any combination thereof. In some embodiments, the metal and the alloy material may include nickel, iron, lead, platinum, titanium, copper, molybdenum, zinc, or the like, or any combination thereof. In some embodiments, the alloy material may include a copper-zinc alloy, a copper-tin alloy, a copper-nickel-silicon alloy, a copper-chromium alloy, a copper-silver alloy, or the like, or any combination thereof. In some embodiments, the metal oxide material may include $RuO_2$, $MnO_2$, $PbO_2$, NiO, or the like, or any combination thereof.

In some embodiments, the effective acoustic transducer unit may include an overlapping area of the first electrode layer 521, the piezoelectric layer 522, and the second electrode layer 523. For example, the first electrode layer 521, the piezoelectric layer 522, and the second electrode layer 523 have the same shape and area, and partially cover the suspension membrane structure 530. Then the first electrode layer 521, the piezoelectric layer 522, and the second electrode layer 523 may be the effective energy conversion units. As another example, the first electrode layer 521 and the piezoelectric layer 522 may partially cover the suspension membrane structure 530, and the second electrode layer 523 may completely cover the suspension membrane structure 530, then parts of the first electrode layer 521, the piezoelectric layer 522, and the second electrode layer 523 that correspond one to one along the thickness direction may form the effective acoustic transducer unit. It should be noted that the dimension (e.g., inner diameter, outer diameter) and corresponding parameters (e.g., the difference between the radius of the inner edge of the acoustic transducer unit 520 and the radius of the circle enclosed by the plurality of holes 5300, the range of difference between the dimension of the hollow cavity of the base structure 510 and the outer diameter of the acoustic transducer unit 520, the radial distance from the edge of the acoustic transducer unit 520 to the center of each hole 5300) of the acoustic transducer unit may be the dimension and corresponding parameters of the effective acoustic transducer unit.

In some embodiments, the acoustic transducer unit 520 may further include a seed layer. The seed layer may optimize a lattice structure of the first electrode layer 521, the second electrode layer 523, and the piezoelectric layer 522 deposited on the seed layer, so as to ensure the quality of the acoustic transducer unit 520 and increase the membrane adhesion. In some embodiments, a seed layer may be prepared on a silicon substrate by a physical vapor deposition (PVD) method or a chemical vapor deposition (CVD) method. In some embodiments, the thickness of the seed layer may be within a range of 5 nm-200 nm. In some embodiments, the thickness of the seed layer may be within a range of 8 nm-150 nm. It should be noted that the acoustic transducer unit 520 may also have no seed layer. In some embodiments, the second electrode layer 523 may be prepared on the upper surface of the seed layer or the upper surface of the silicon substrate by the PVD method or the CVD method. In some embodiments, the thickness of the second electrode layer 523 may be within a range of 80 nm-250 nm. In some embodiments, the thickness of the second electrode layer 523 may be within a range of 100 nm-200 nm. In some embodiments, the piezoelectric layer 522 may be prepared on the upper surface of the second electrode layer 523 by the PVD method or the CVD method. In some embodiments, the thickness of the piezoelectric layer 522 may be within a range of 0.8 μm-5 μm. In some embodiments, the thickness of the piezoelectric layer 522 may be within a range of 0.8 μm-4 μm. In some embodiments, the first electrode layer 521 may be prepared on the upper surface of the piezoelectric layer 522 by the PVD method or the CVD method. In some embodiments, the thickness of the first electrode layer 521 may be within a range of 80 nm-250 nm. In some embodiments, the thickness of the first electrode layer 521 may be within a range of 90 nm-230 nm. In some embodiments, etching may also be performed sequentially on the first electrode layer 521, the piezoelectric layer 522, and the second electrode layer 523. In some embodiments, the etching of the first electrode layer 521, the piezoelectric layer 522, and the second electrode layer 523 may be performed by dry etching or wet etching.

As shown in FIG. 5, in some embodiments, a plurality of holes 5300 may enclose a circular region. In order to improve the sound pressure output effect of the acoustic transducer unit 520, the acoustic transducer unit 520 may be arranged in the region of the suspension membrane structure 530 close to the plurality of holes. Further, the acoustic transducer unit 520 may be a ring structure and distributed along the inner side of the circular region enclosed by the plurality of holes 5300. As shown in FIGS. 23-24, the acoustic transducer units 520 may be distributed along the inner side of the circular region enclosed by the plurality of holes 5300. In some embodiments, the acoustic transducer unit 520 in the ring structure may also be distributed along the outer side of the circular region enclosed by the plurality of holes 5300. As shown in FIG. 25, the acoustic transducer unit 520 may be distributed along the outer side of the circular region enclosed by the plurality of holes 5300. Preferably, the acoustic transducer unit 520 in the ring structure may be distributed along the inner side of the circular region enclosed by the plurality of holes 5300, and the circular region enclosed by the plurality of holes 5300 may be distributed inside the base structure 510. In some embodiments, the piezoelectric layer 522 of the acoustic transducer unit 520 may be a piezoelectric ring, and the first electrode layer 521 and the second electrode layer 523 located on the upper and lower surfaces of the piezoelectric ring may be electrode rings.

In some embodiments, the equivalent stiffness and the equivalent mass of the bone conduction microphone 500 may be adjusted by adjusting the dimension, quantity, and distribution position of the plurality of holes 5300 of the suspension membrane structure 530, as well as the shape, dimension, and position of the acoustic transducer unit 520, so as to adjust the resonant frequency and the stress distribution of the bone conduction microphone 500, and further adjust the output electrical signal of the bone conduction microphone 500 to improve the sensitivity of the bone conduction microphone 500. In some embodiments, the holes 5300 in the suspension membrane structure 530 may be prepared by an etching process. In some embodiments, the etching process may include a dry etching process or a wet etching process.

In some embodiments, the acoustic transducer unit 520 may be further provided with a lead structure 5200, which is used to transmit the electrical signal acquired by the electrode rings (e.g., the first electrode layer 521 and the second electrode layer 523) to subsequent circuits. In some embodiments, the first electrode layer 521 and the second electrode layer 523 may be connected to the base structure 510 through the lead structure 5200. In some embodiments, the lead structure 5200 may include a first lead and a second lead. One end of the first lead may be connected to the first electrode layer 521, and the other end of the first lead may be connected to the base structure 510. One end of the second lead may be connected to the second electrode layer 521, and the other end of the second lead may be connected to the base structure 510.

In some embodiments, the resonant frequency may also be reduced by adjusting the shape, dimension (e.g., length, width, thickness), and material of the lead structure 5200 to increase the output electrical signal of the bone conduction microphone 500, thereby improving the sensitivity of the bone conduction microphone 500.

Figure 28:
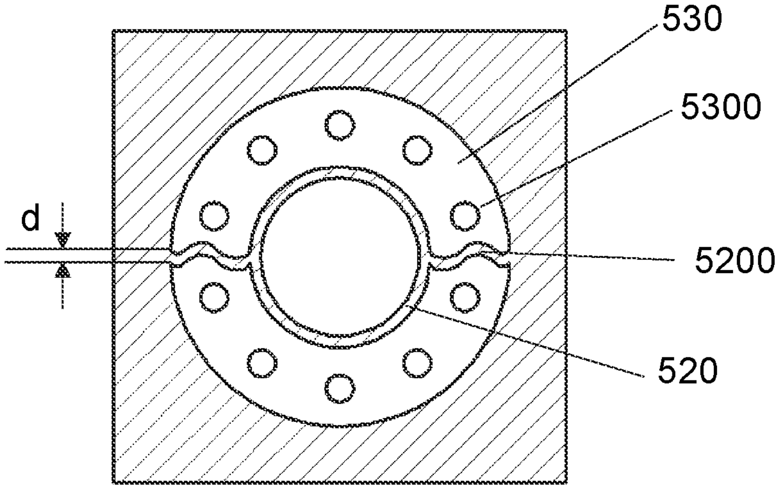
FIG. 28 is a schematic diagram illustrating a lead structure in a bone conduction microphone according to some embodiments of the present disclosure.

In some embodiments, the lead structure 5200 may include a straight line, a broken line, or a curved line. Preferably, as shown in FIGS. 22-27, the lead structure 5200 may be the straight line. As another example, as shown in FIG. 28, the lead structure 5200 may be the curved line. In some embodiments, the width of the lead structure 5200 (width d as shown in FIGS. 27 and 28) may be within a range of 2 μm-100 μm. In some embodiments, the width of the lead structure 5200 may be within a range of 10 μm-100 μm. In some embodiments, the width of the lead structure 5200 may be within a range of 15 μm-90 μm. In some embodiments, the width of the lead structure 5200 may be within a range of 20 μm-80 μm.

Figure 29:
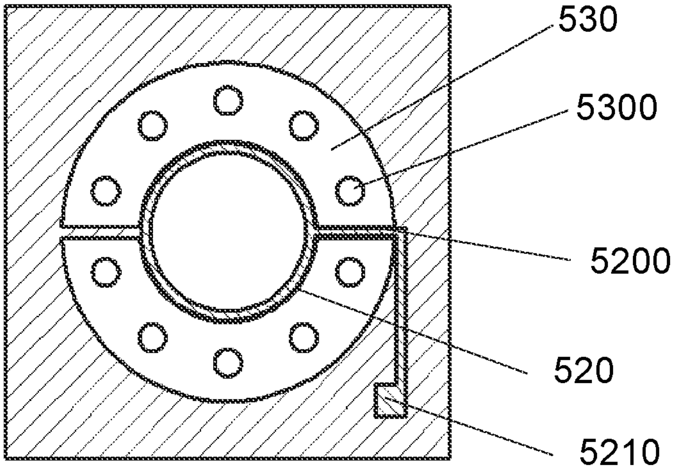
FIG. 29 is a schematic diagram illustrating a lead structure in another bone conduction microphone according to some embodiments of the present disclosure.

FIG. 29 is a schematic diagram illustrating a lead structure in another bone conduction microphone according to some embodiments of the present disclosure. In some embodiments, the first electrode layer 521 may be connected to the upper surface, the lower surface, or the side surface of the base structure 510 through the lead structure 5200. In some embodiments, as shown in FIG. 29, the first electrode layer 521 may be connected to a bonding pad 5210 through the lead structure 5200. The bonding pad 5210 may be located on the upper surface, the lower surface, or the side surface of the base structure 510. As shown in FIG. 29, the bonding pad 5210 may be located on the upper surface of the base structure 510 to export the electrical signal between the acoustic transducer unit 520 and the housing or the lead structure 5200, etc. The first electrode layer 521 may be connected to the bonding pad 5210 through the lead structure 5200 to reduce the electrical signal between the acoustic transducer unit 520 and the housing or the lead structure 5200, thereby reducing parasitic capacitance and improving the sensitivity of the bone conduction microphone 500. In some embodiments, the shape of the bonding pad 5210 may be a circle, an ellipse, a triangle, a polygon, or an irregular shape. In some embodiments, the maximum dimension of the bonding pad 5210 may be within a range of 80 μm-500 μm. The maximum dimension may be the side length or diameter. For example, the shape of the bonding pad 5210 may be rectangular, and the maximum side length of the bonding pad 5210 may be within a range of 80 μm-500 μm. As another example, the shape of the bonding pad 5210 may be circular, and the maximum diameter of the bonding pad 5210 may be within a range of 80 μm-500 μm. In some embodiments, the maximum dimension of the bonding pad 5210 may be within a range of 85 μm-450 μm. In some embodiments, the maximum dimension of the bonding pad 5210 may be within a range of 90 μm-400 μm. It should be noted that the shape and dimension of the bonding pad 5210 in the present disclosure may be the shape and dimension of the cross-section perpendicular to the thickness direction. In some embodiments, the bonding pad 5210 may be prepared by depositing one or more layers of metal (e.g., Pt, Au, Ti, Cr, Ti/Au, etc.) that are easy to weld. Preferably, the metal deposited on the bonding pad 5210 may be Ti/Au or Gr/Au. In some embodiments, the bonding pad 5210 may be prepared by a metal lift-off process (LIFT-OFF). In some embodiments, the deposition thickness of the bonding pad 5210 may be within a range of 100 nm-300 nm. Preferably, the deposition thickness of the bonding pad may be within a range of 150 nm-250 nm. In some embodiments, coating and photolithography development may also be performed on the back of the silicon substrate to obtain a patterned deep silicon release window. Silicon may be etched to the oxide layer of the silicon substrate using a deep silicon etching process, and then the oxide layer of the silicon substrate may be removed to obtain the bone conduction microphone 3100.

In some embodiments, in order to improve the output electrical signal of the bone conduction microphone 500, the radial distance from the edge of the effective acoustic transducer unit 520 (e.g., a ring structure) to the center of each hole 5300 may be within a range of 50 μm-400 μm. The edge of the effective acoustic transducer unit 520 (e.g., the ring structure) may be an inner edge or an outer edge. In some embodiments, the radial distance from the edge of the effective acoustic transducer unit 520 (e.g., the ring structure) to the center of each hole 5300 may be within a range of 100 μm-350 μm. Preferably, the radial distance from the edge of the effective acoustic transducer unit 520 (e.g., the ring structure) to the center of each hole 5300 may be within a range of 150 μm-300 μm. Further preferably, the radial distance from the edge of the effective acoustic transducer unit 520 (e.g., the ring structure) to the center of each hole 5300 may be within a range of 150 μm-250μ m.

In some embodiments, the thickness or the density of different regions of the suspension membrane structure 530 may be the same. In some embodiments, the thickness of the suspension membrane structure 530 may be within a range of 0.5 μm-10 μm. Preferably, the thickness of the suspension membrane structure may be within a range of 0.5 μm-5 μm. In some alternative embodiments, the deformation stress at different locations of the suspension membrane structure 530 may also be changed by adjusting the thickness or the density of different regions of the suspension membrane structure 530. For illustrative purposes only, in some embodiments, the acoustic transducer unit 520 may be configured as a ring structure, and the thickness of the suspension membrane structure 530 on the inner side of the ring structure may be greater than the thickness on the outer side of the ring structure. The thickness of the inner region or the outer region of the ring structure may be the dimension in the thickness direction in FIG. 6. In other embodiments, the density of the suspension membrane structure 530 in the region inside the ring structure may be greater than the density in the region outside the ring structure. By changing the density or the thickness of the suspension membrane structure 530 at different positions, the mass of the suspension membrane located in the inner region of the ring structure may be greater than the mass of the suspension membrane located in the outer region of the ring structure, or the stiffness of the suspension membrane located in the inner region of the ring structure may be less than the stiffness of the suspension membrane located in the outer region of the ring structure. When relative motion occurs between the suspension membrane structure 530 and the base structure 510, the deformation degree of the suspension membrane structure 530 (i.e., the inner region of the suspension membrane structure 530) near the ring structure of the acoustic transducer unit 520 may be relatively large, and the resulting deformation stress may also large, so that the electrical signal outputted by the bone conduction microphone 500 may be large, and the sensitivity of the bone conduction microphone 500 may be higher.

It should be noted that the shape of the region enclosed by the plurality of holes 5300 may be not limited to the circle shown in FIG. 5, and may also be a semicircle, ¼ circle (fan with a central angle of) 90°, an ellipse, a semi-ellipse, a triangle, a rectangle, or other regular or irregular shapes. The shape of the acoustic transducer unit 520 may be adaptively adjusted according to the shape of the region enclosed by the plurality of holes 5300. For example, when the shape of the region enclosed by the plurality of holes 5300 is the rectangle, the shape of the acoustic transducer unit 520 may be the rectangle, and the acoustic transducer unit 520 in the rectangular shape may be distributed along the inner side or the outer side of the rectangle enclosed by the plurality of holes 5300. As another example, when the shape of the region enclosed by the plurality of holes 5300 is a semicircle, the shape of the acoustic transducer unit 520 may be a semicircular shape, and the acoustic transducer unit 520 in the semicircular shape may be distributed along the inner side or the outer side of the rectangular shape enclosed by the plurality of holes 5300. In some embodiments, the suspension membrane structure 530 in FIG. 5 may have no hole.

Figure 7:
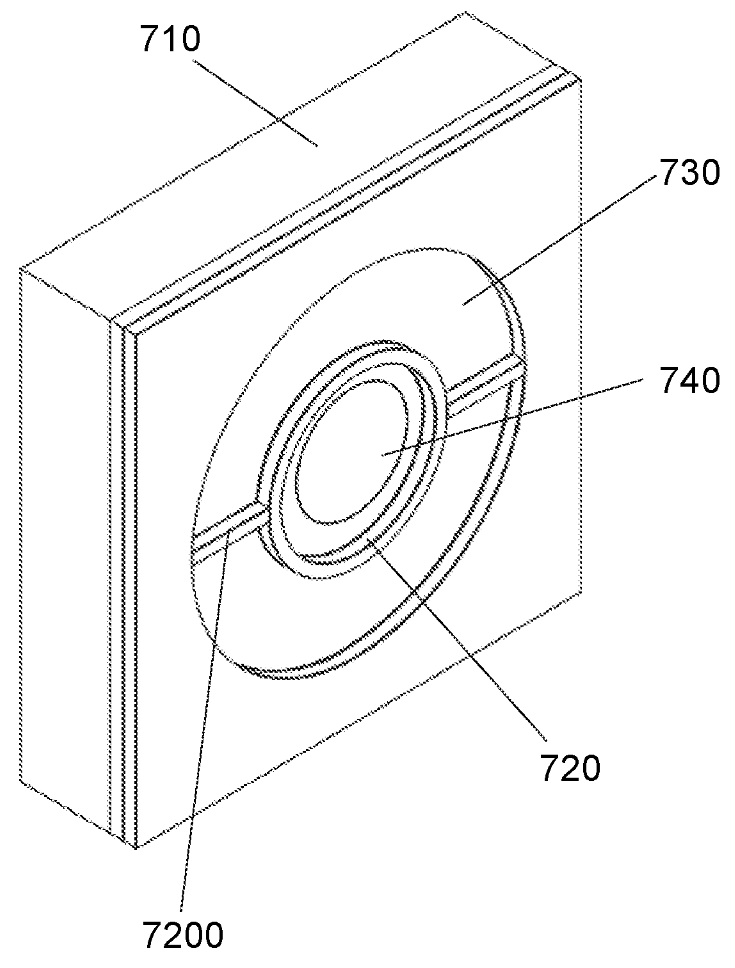
FIG. 7 is a schematic structural diagram illustrating a bone conduction microphone according to some embodiments of the present disclosure.
Figure 30:
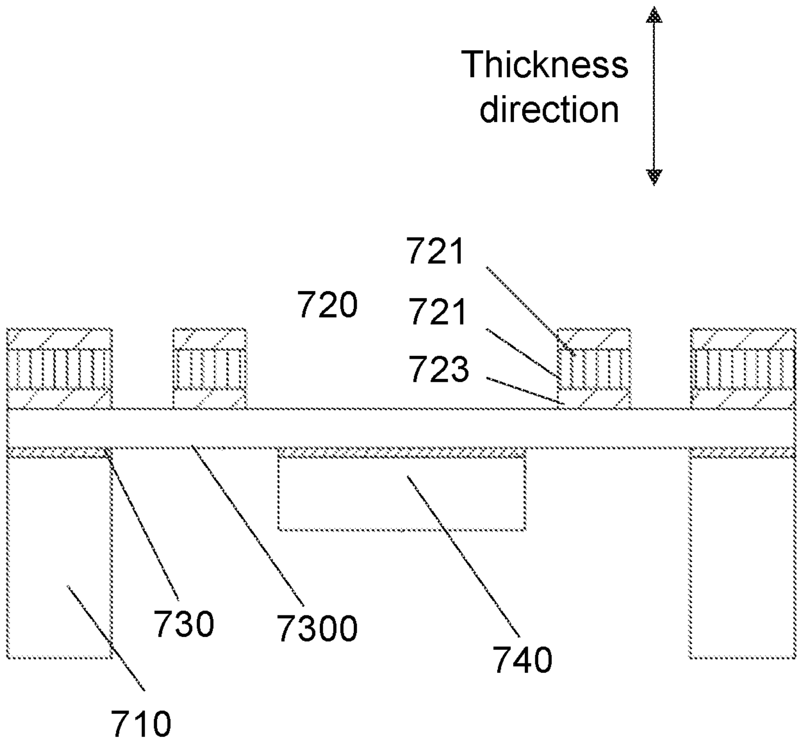
FIG. 30 is a sectional view of a partial structure of a bone conduction microphone in FIG. 7 according to some embodiments of the present disclosure.

FIG. 7 is a schematic structural diagram illustrating a bone conduction microphone according to some embodiments of the present disclosure. FIG. 30 is a sectional view of a partial structure of a bone conduction microphone in FIG. 7 according to some embodiments of the present disclosure.

The structure of the bone conduction microphone 700 shown in FIG. 7 is substantially the same as that of the bone conduction microphone 500 shown in FIG. 5. The difference is that the vibration unit of the bone conduction microphone 700 shown in FIG. 7 may include a suspension membrane structure 730 and a mass element 740.

As shown in FIGS. 7 and 30, the bone conduction microphone 700 may include a base structure 710 and a laminated structure, and at least part of the laminated structure is connected to the base structure 710. In some embodiments, the base structure 710 may be a hollow frame structure, and part of the laminate structure may be located in a hollow position of the hollow frame structure. It should be noted that the frame structure may not be limited to the cuboid shape shown in FIG. 7. In some embodiments, the frame structure may be a regular or irregular structure such as a prism or a cylinder.

In some embodiments, the laminated structure may include an acoustic transducer unit 720 and a vibration unit. In some embodiments, the vibration unit may be arranged on the upper surface or the lower surface of the acoustic transducer unit 720. As shown in FIG. 7, the vibration unit may include the suspension membrane structure 730 and the mass element 740. The mass element 740 may be located on the upper surface or the lower surface of the suspension membrane structure 730. In some embodiments, the suspension membrane structure 730 may be located on the upper surface or the lower surface of the base structure 710. In some embodiments, a peripheral side of the suspension membrane structure 730 may also be connected to an inner wall of the hollow position of the base structure 710. The "connection" here can be understood as fixing the suspension membrane structure 730 to the upper surface or the lower surface of the base structure 710, or the side wall of the hollow position of the base structure 710 by means of mechanical fixing (e.g., strong bonding, riveting, clamping, inlaying, etc.) after preparing the suspension membrane structure 730 and the base structure 710 respectively, or depositing the suspension membrane structure 730 on the base structure 710 by physical deposition (e.g., physical vapor deposition) or chemical deposition (e.g., chemical vapor deposition) during the manufacturing process.

Figure 31A:
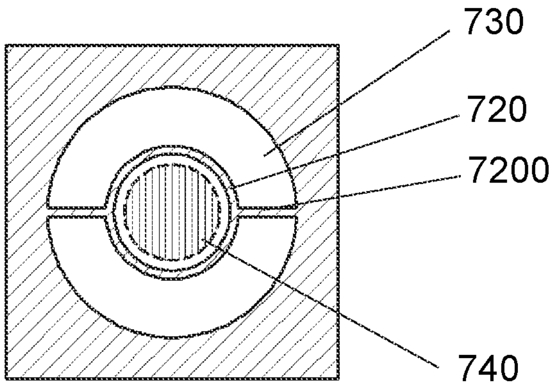
FIGS. 31A-31C are schematic diagrams illustrating different mass elements in a bone conduction microphone according to some embodiments of the present disclosure.
Figure 31B:
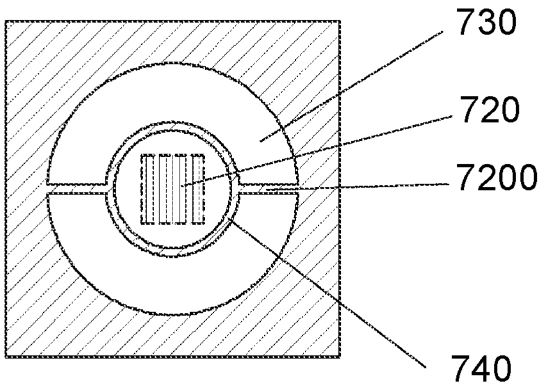
Figure 31C:
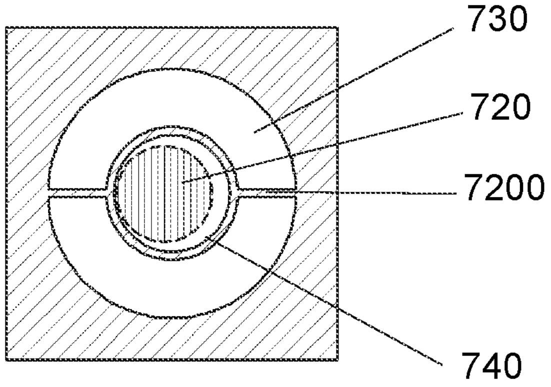

In some embodiments, the shape of the suspension membrane structure 730 may be a circle, an ellipse, a triangle, a quadrangle, a pentagon, a hexagon, or other polygons, or any other shape. Preferably, as shown in FIGS. 31A-31C, the shape of the suspension membrane structure 730 may be circular. For more details about the suspension membrane structure 730, please refer to the description of the suspension membrane structure 530 in FIG. 5, which is not repeated herein.

In some embodiments, the mass of the laminated structure may include the mass of the mass element 740. When relative motion occurs between the vibration unit and the base structure 710, the weight of the mass element 740 and the weight of the suspension membrane structure 730 may be different, and the deformation degree of the region of the suspension membrane structure 730 near the mass element 740 or where the mass element 740 is located may be greater than the deformation degree of the region of the suspension membrane structure 730 away from the mass element. In order to increase the output sound pressure of the bone conduction microphone 700, the acoustic transducer unit 720 may be distributed along a circumferential direction of the mass element 740. In some embodiments, the shape of the acoustic transducer unit 720 may be the same as or different from that of the mass element 740. Preferably, the shape of the acoustic transducer unit 720 may be the same as that of the mass element 740, so that the acoustic transducer unit 720 at each position may be close to the mass element 740, thereby further improving the output electrical signal of the bone conduction microphone 700. For example, the mass element 740 may be a cylindrical structure, the acoustic transducer unit 720 may be a ring structure, and the inner diameter of the acoustic transducer unit 720 in the ring shape may be greater than the radius of the mass element 740, so that the acoustic transducer unit 720 may be arranged along the circumferential direction of mass element 740. It should be noted that the shape and dimension of the acoustic transducer unit 720 and the mass element 740 in the present disclosure may be the shape and dimension of the cross-section perpendicular to the thickness direction.

In some embodiments, the acoustic transducer unit 720 may include a first electrode layer 721, a second electrode layer 723, and a piezoelectric layer 722 located between the two electrode layers. The first electrode layer 721, the piezoelectric layer 722, and the second electrode layer 723 may be combined to form a structure adapted to the shape of the mass element 740. For example, the mass element 740 may be a cylindrical structure, and the acoustic transducer unit 720 may be a ring structure. At this time, the first electrode layer 721, the piezoelectric layer 722, and the second electrode layer 723 may all be ring structures and may be arranged and combined sequentially from top to bottom to form the ring structure.

Figure 32A:
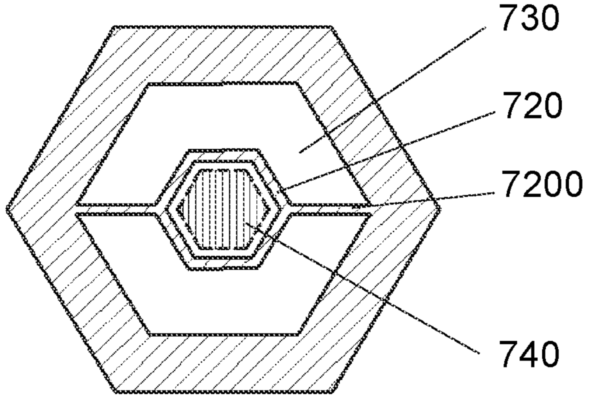
FIGS. 32A-32D are schematic diagrams illustrating different acoustic transducer units in a bone conduction microphone according to some embodiments of the present disclosure.
Figure 32B:
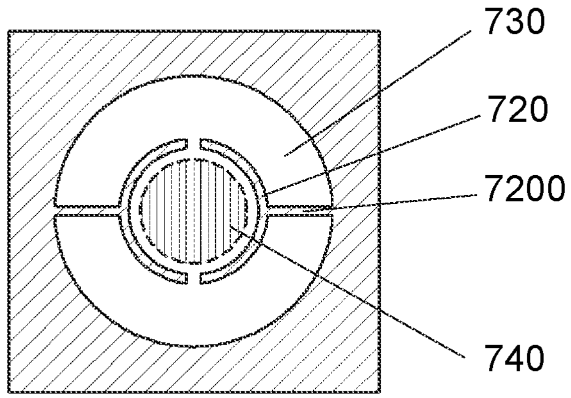
Figure 32C:
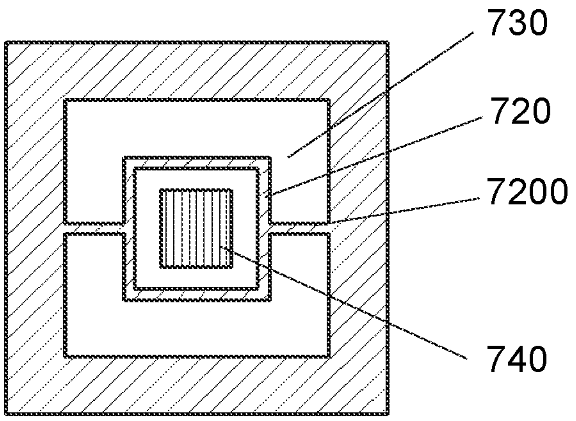
Figure 32D:
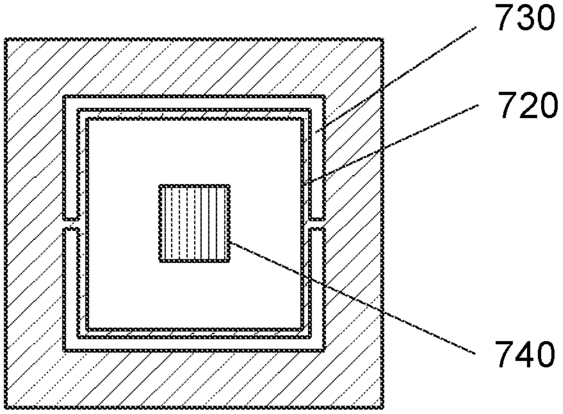

In some embodiments, the shape of the acoustic transducer unit 720 may be a circular ring, a polygonal ring, or a curved ring. For example, as shown in FIGS. 31A-31C, the shape of the acoustic transducer unit 720 may be the circular ring. As another example, as shown in FIG. 32A, the shape of the acoustic transducer unit 720 may be a regular hexagonal ring. As another example, as shown in FIGS. 32C-32D, the shape of the acoustic transducer unit 720 may be a regular quadrilateral ring. In some embodiments, the shape of the acoustic transducer unit 720 may be a closed ring, a split ring, or a multi-segment ring. For example, as shown in FIG. 32A, the shape of the acoustic transducer unit 720 may be the closed ring. As another example, as shown in FIG. 32B, the shape of the acoustic transducer unit 720 may be a circular two-segment ring. Preferably, as shown in FIGS. 31A-31C, the shape of the acoustic transducer unit 720 may be a circular closed ring.

In some embodiments, the inner diameter and outer diameter of the acoustic transducer unit 720 may affect the resonant frequency of a vibration system. In some embodiments, the inner diameter of the acoustic transducer unit 720 may be within a range of 100 μm-700 μm. In some embodiments, the outer diameter of the acoustic transducer unit 720 may be within a range of 110 μm-710 m. The inner diameter and the outer diameter of the acoustic transducer unit 720 may be similar to those of the acoustic transducer unit 520. For more details, please refer to the relevant descriptions in FIG. 5, which are not repeated herein.

In some embodiments, the outer diameter of the acoustic transducer unit 720 may be less than, equal to, or greater than the cross-section of the mass element 740 perpendicular to the thickness direction. In some embodiments, the inner diameter of the acoustic transducer unit 720 may be less than, equal to, or greater than the cross-section of the mass element 740 perpendicular to the thickness direction. Preferably, the cross-section of the mass element 740 perpendicular to the thickness direction may be circular, and the inner diameter of the acoustic transducer unit 720 may be slightly greater than the diameter of the cross-section of the mass element 740 perpendicular to the thickness direction. In some embodiments, the inner diameter of the acoustic transducer unit 720 may be greater than the diameter of the cross-section of the mass element 740 perpendicular to the thickness direction, and the difference between the inner diameter of the acoustic transducer unit 720 and the diameter of the cross-section of the mass element 740 perpendicular to the thickness direction may be within a range of 5 μm-200 μm. In some embodiments, the inner diameter of the acoustic transducer unit 720 may be 10 μm-180 μm greater than the diameter of the mass element. In some embodiments, the inner diameter of the acoustic transducer unit 720 may be 20 μm-160 μm greater than the diameter of the mass element. In some embodiments, the inner diameter of the acoustic transducer unit 720 may be 30 μm-140 μm greater than the diameter of the mass element. In some embodiments, the inner diameter of the acoustic transducer unit 720 may be 40 μm-120 μm greater than the diameter of the mass element.

In some embodiments, the outer diameter of the acoustic transducer unit 720 may be less than, equal to, or greater than the dimension of the hollow cavity of the base structure. In some embodiments, the inner diameter of the acoustic transducer unit 720 may be less than, equal to, or greater than the dimension of the hollow cavity of the base structure. The hollow cavity of the base structure may be similar to the hollow cavity of the base structure 510. For more details, please refer to the relevant descriptions in FIG. 5, which are not repeated herein. Preferably, the outer diameter of the acoustic transducer unit 720 may be less than the dimension of the hollow cavity of the base structure. In some embodiments, the outer diameter of the acoustic transducer unit 720 may be less than the dimension of the hollow cavity of the base structure, and the difference between the dimension of the hollow cavity of the base structure and the outer diameter of the acoustic transducer unit 720 may be within a range of 5 μm-400 μm. For the dimension of the acoustic transducer unit 720 and the dimension of the hollow cavity of the base structure, please refer to the description in FIG. 5, which is not repeated herein.

In some embodiments, the number of the mass elements 740 may be one or more. In some embodiments, a plurality of mass elements 740 may be evenly arranged along the inner side of the acoustic transducer unit 720. In some embodiments, the shape of the mass element 740 may be cylindrical, polygonal, spherical, or irregular shape. For example, as shown in FIG. 32A, the shape of the mass element 740 may be a regular hexagonal prism. For example, as shown in FIG. 32B, the shape of the mass element 740 may be cylindrical. For example, as shown in FIGS. 32C-32D, the shape of the mass element 740 may be a quadrangular prism. It should be noted that the description of the shape of each component in the bone conduction microphone in the present specification may refer to the external shape of each component, or the shape of the cross-section of each component perpendicular to the thickness direction.

In some embodiments, the shape of the mass element 740 may be cylindrical, and the radius of the cross-section of the mass element 740 perpendicular to the thickness direction may be within a range of 100 μm-700 μm. In some embodiments, the radius of the cross-section of the mass element 740 perpendicular to the thickness direction may be within a range of 120 μm-600 μm. In some embodiments, the radius of the cross-section of the mass element 740 perpendicular to the thickness direction may be within a range of 140 μm-500 μm. In some embodiments, the radius of the cross-section of the mass element 740 perpendicular to the thickness direction may be within a range of 160 μm-400 μm. In some embodiments, the radius of the cross-section of the mass element 740 perpendicular to the thickness direction may be within a range of 200 μm-350 μm. In some embodiments, the axial thickness (or referred to as the thickness along the thickness direction) of the mass element 740 may be within a range of 20 μm-400 μm. In some embodiments, the axial thickness may be within a range of 25 μm-300 μm. In some embodiments, the axial thickness may be within a range of 30 μm-200 μm. In some embodiments, the axial thickness may be within a range of 35 μm-150 μm.

In some embodiments, the mass element 740 may be a single-layer structure or a multi-layer structure. In some embodiments, when the mass element 740 is a single-layer structure, the mass element 740 may be made of a single material. In some embodiments, the single material may include, but is not limited to, any one of silicon-based materials such as monocrystalline silicon, polycrystalline silicon, silicon dioxide, silicon nitride, or silicon carbide. Preferably, the mass element 740 may be monocrystalline silicon or polycrystalline silicon. In some embodiments, when the mass element 740 is the multi-layer structure, the mass element 740 may be made of various materials. In some embodiments, the various materials may include, but are not limited to, two or more of silicon-based materials such as monocrystalline silicon, polycrystalline silicon, silicon dioxide, silicon nitride, or silicon carbide.

In some embodiments, the acoustic transducer unit 720 and the mass element 740 may be located on different sides of the suspension membrane structure 730, or located on the same side of the suspension membrane structure 730. For example, both the acoustic transducer unit 720 and the mass element 740 may be located on the upper surface or the lower surface of the suspension membrane structure 730. The acoustic transducer unit 720 may be distributed along the circumferential direction of the mass element 740. As another example, the acoustic transducer unit 720 may be located on the upper surface of the suspended membrane structure 730. The mass element 740 may be located on the lower surface of the suspension membrane structure 730. At this time, the projection of the mass element 740 on the suspension membrane structure 730 may be within the region of the acoustic transducer unit 720. As another example, the acoustic transducer unit 720 may be located on the lower surface of the suspension membrane structure 730. The mass element 740 may be located on the upper surface of the suspension membrane structure 730. At this time, the projection of the mass element 740 on the suspension membrane structure 730 may be within the region of the acoustic transducer unit 720.

In some embodiments, the mass element 740 may be arranged coaxially with the acoustic transducer unit 720 or the hollow cavity of the base structure 710. For example, as shown in FIGS. 31A-31B, the mass element 740 may be arranged coaxially with the acoustic transducer unit 720. In some embodiments, the mass element 740 may not be arranged coaxially with the acoustic transducer unit 720 or the hollow cavity of the base structure 710. For example, as shown in FIG. 31C, the mass element 740 may not be arranged coaxially with the acoustic transducer unit 720. In some embodiments, an axis deviation between the mass element 740 and the acoustic transducer unit 720 may be within a range of 0 μm-50 μm. In some embodiments, the axis deviation between the mass element 740 and the acoustic transducer unit 720 may be within a range of 5 μm-45 μm. In some embodiments, the axis deviation may be within a range of 10 μm-40 μm. In some embodiments, the axis deviation may be within a range of 15 μm-35 μm. In some embodiments, the axis deviation may be within a range of 20 μm-30 μm. Since the mass element 740 and the acoustic transducer unit 720 are not coaxial, the output voltage and the output electrical signal may decrease. Preferably, the axis deviation between the mass element 740 and the acoustic transducer unit 720 may be 0 μm, i.e., the mass element 740 and the acoustic transducer unit 720 may be arranged coaxially.

In some embodiments, the mass element 740 may be prepared on the base material (the same material as the material of the base structure 710) by photolithography, etching, or other processes. Further, wafer-level bonding may be performed on the base material prepared with the mass element 740 and the base material prepared with the suspension membrane structure 730 and the base structure 710. In some embodiments, the bonding region may be a region of the mass element 740. In some other embodiments, the bonding region may include the region of the mass element 740 and a part of the base structure 710. The holes may need to be reserved in the acoustic transducer unit and the bonding pad region on the base structure 710. In some embodiments, the area of the bonding region on the base structure 710 may account for 10%-90% of the area of the base structure 710 along a cross-section perpendicular to the thickness direction. In some embodiments, the wafer thinning process may be used to remove excess materials on the substrate material where the mass element 740 is located except the mass element 740. In other embodiments, the mass element 740 may be further prepared on the substrate material of the acoustic transducer unit 720. Specifically, on the other side of the substrate material of the acoustic transducer unit 720 (the side opposite to the acoustic transducer unit 720), operations such as coating, photolithography and development may be performed, and then a certain depth may be etched using a deep silicon etching process. Then, the mass element 740 may be etched using the deep silicon etching process.

In some embodiments, an etch barrier layer may be prepared on the substrate material. The etch barrier layer may facilitate the precise control of the dimension of the electrode layer (e.g., the first electrode layer or the second electrode layer), and the etch barrier layer may also prevent subsequent etching process from damaging the substrate material. Specifically, the etch barrier layer may be prepared on the substrate material by means of chemical vapor deposition (CVD) or thermal oxidation. In some embodiments, the thickness of the etch barrier layer may be within a range of 100 nm-2 μm. In some embodiments, the thickness of the etch barrier layer may be within a range of 300 nm-1 μm. In some embodiments, the etch barrier layer may also be removed by photolithography and etching processes to obtain the bone conduction microphone.

In some embodiments, the output electrical signal of the bone conduction microphone 700 may be improved by changing the dimension, shape, and position of the mass element 740 and the position, shape, and dimension of the piezoelectric layer. In some embodiments, the sound pressure output effect of the bone conduction microphone 700 may also be improved by changing the shape, material, and dimension of the suspension membrane structure 730. Here, the structures and parameters of the first electrode layer 721, the second electrode layer 723, and the piezoelectric layer 722 of the acoustic transducer unit 720 may be similar to the structures and parameters of the first electrode layer 521, the second electrode layer 523, and the piezoelectric layer 522 of the acoustic transducer unit 520 in FIG. 5. The structures and parameters of the suspension membrane structure 730 are similar to the structures and parameters of the suspension membrane structure 530. The structure of the lead structure 7200 may be similar to the structure of the lead structure 5200.

In some embodiments, the acoustic transducer unit 720 may be further provided with the lead structure 7200. The lead structure 7200 may be configured to transmit the electrical signal acquired by the electrode rings (e.g., the first electrode layer 721 and the second electrode layer 723) to subsequent circuits. In some embodiments, the first electrode layer 721 and the second electrode layer 723 may be connected to the base structure 710 through the lead structure 7200. Specifically, the lead structure 7200 may include a first lead and a second lead. One end of the first lead may be connected to the first electrode layer 721, and the other end of the first lead may be connected to the base structure, one end of the second lead may be connected to the second electrode layer 721, and the other end of the second lead may be connected to the base structure.

In some embodiments, the equivalent stiffness and the equivalent mass of the bone conduction microphone 500 may also be adjusted by adjusting the shape, dimension (e.g., length, width, and thickness), and material of the lead structure 7200 to improve the output electrical signal of the bone conduction microphone 700, thereby improving the sensitivity of the bone conduction microphone 500.

Figure 33A:
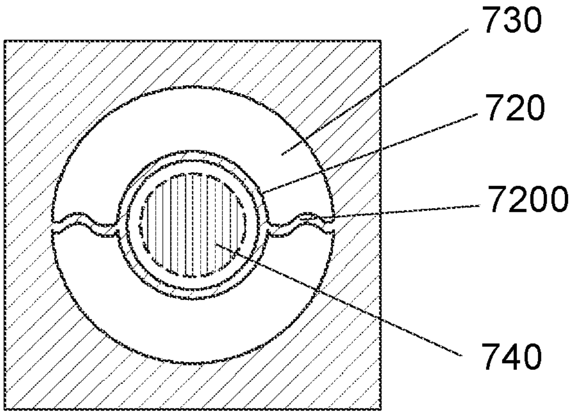
FIGS. 33A-33B are schematic diagrams illustrating different lead structures in a bone conduction microphone according to some embodiments of the present disclosure.
Figure 33B:
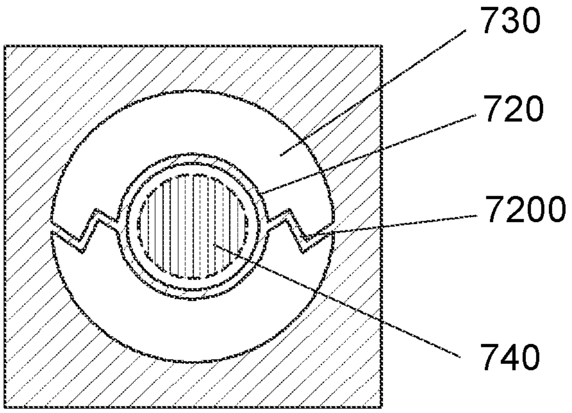

In some embodiments, the lead structure 7200 may include a straight line, a broken line, or a curved line. For example, as shown in FIGS. 31A-31C, the lead structure 7200 may be a straight line. As another example, as shown in FIG. 33A, the lead structure 7200 may be the curved line. As another example, as shown in FIG. 33B, the lead structure 7200 may be the broken line. In some embodiments, the width of the lead structure 7200 may be within a range of 10 μm-100 μm. In some embodiments, the width of the lead structure 7200 may be within a range of 15 μm-90 μm. In some embodiments, the width may be within a range of 20 μm-80 μm.

Figure 34:
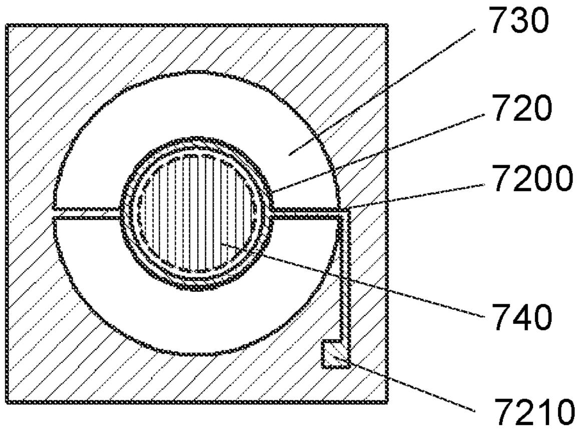
FIG. 34 is a schematic diagram illustrating a lead structure in another bone conduction microphone according to some embodiments of the present disclosure.

FIG. 34 is a schematic diagram illustrating a lead structure in another bone conduction microphone according to some embodiments of the present disclosure. In some embodiments, as shown in FIG. 34, the first electrode layer 721 may be connected to a bonding pad 7210 through the lead structure 7200. The bonding pad 7210 may be located on the upper surface, the lower surface, or the side surface of the base structure 710. As shown in FIG. 34, the bonding pad 7210 may be located on the upper surface of the base structure 710 to export an electrical signal between the acoustic transducer unit 720 and the housing or the lead structure 7200. By connecting the first electrode layer 721 to the bonding pad 7210 through the lead structure 7200, the electrical signal between the acoustic transducer unit 720 and the housing or the lead structure 7200 may be reduced, thereby reducing parasitic capacitance and improving the sensitivity of the bone conduction microphone 700. In some embodiments, the shape of the bonding pad 7210 may be a circle, an ellipse, a triangle, a polygon, or an irregular shape. For more description about the bonding pad 7210, please refer to the descriptions of the bonding pad 5210 in FIG. 5, which is not repeated herein.

The structures and parameters of the first electrode layer 721, the second electrode layer 723, and the piezoelectric layer 722 of the acoustic transducer unit 720 in FIG. 7 may be similar to the structures and parameters of the first electrode layer 521, the second electrode layer 523, and the piezoelectric layer 522 of the acoustic transducer unit 520 in FIG. 5. The structures and parameters of the suspension membrane structure 730 may be similar to the structures and parameters of the suspension membrane structure 530. The structure of the lead structure 7200 may be similar to the structure of the lead structure 5200. For more details, please refer to the relevant descriptions in FIG. 5, which are not repeated herein.

The structures in one or more of the above embodiments may be combined with each other. For example, the vibration unit may include the suspension membrane structure and the mass unit, and the suspension membrane structure may include at least one hole. For details, please refer to descriptions of FIGS. 35 and 36.

Figure 35:
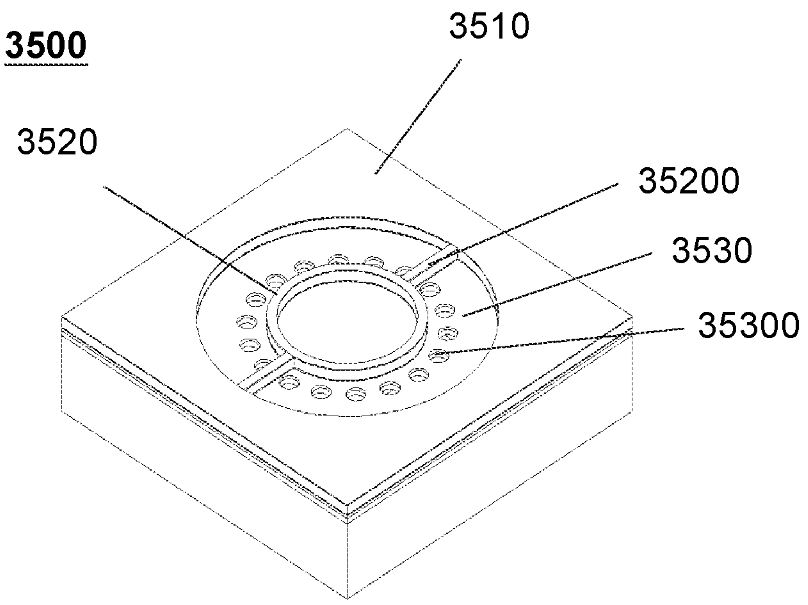
FIG. 35 is a schematic structural diagram illustrating a bone conduction microphone according to some embodiments of the present disclosure.
Figure 36:
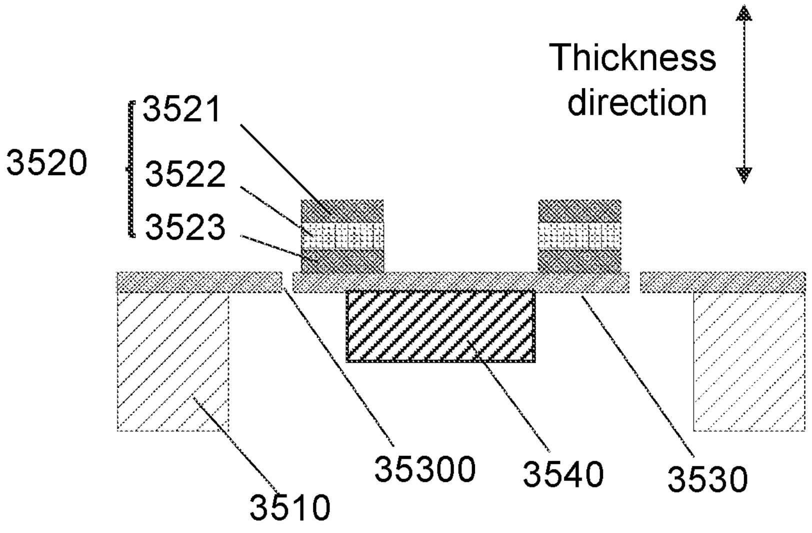
FIG. 36 is a sectional view of a partial structure of a bone conduction microphone in FIG. 35 according to some embodiments of the present disclosure.

FIG. 35 is a schematic structural diagram illustrating a bone conduction microphone according to some embodiments of the present disclosure. FIG. 36 is a sectional view of a partial structure of a bone conduction microphone in FIG. 35 according to some embodiments of the present disclosure. As shown in FIGS. 35 and 36, the bone conduction microphone 3500 may include a base structure 3510 and a laminated structure, and at least part of the laminated structure is connected to the base structure 3510. In some embodiments, the base structure 3510 may be a hollow frame structure, and part of the laminate structure may be located in a hollow position of the hollow frame structure. It should be noted that the frame structure may not limited to the cuboid shape shown in FIG. 35. In some embodiments, the frame structure may be a regular or irregular structure such as a prism or a cylinder.

In some embodiments, the laminated structure may include an acoustic transducer unit 3520 and a vibration unit. As shown in FIG. 35, the vibration unit may include a suspension membrane structure 3530. The suspension membrane structure 3530 may be fixed on the base structure 3510 by connecting a peripheral side with the base structure 3510.

The central region of the suspension membrane structure 3530 may be suspended in the hollow position of the base structure 3510. In some embodiments, the suspension membrane structure 3530 may be located on the upper surface or the lower surface of the base structure 3510. In some embodiments, the peripheral side of the suspension membrane structure 3530 may also be connected to an inner wall of the hollow position of the base structure 3510.

In some embodiments, the suspension membrane structure 3530 may include at least one elastic layer. The elastic layer may be a membrane-shaped structure made of a semiconductor material. In some embodiments, the semiconductor material may include silicon dioxide, silicon nitride, gallium nitride, zinc oxide, silicon carbide, monocrystalline silicon, polycrystalline silicon, or the like. In some embodiments, the suspension membrane structure 3530 may include a plurality of holes 35300 distributed around the center of the acoustic transducer unit 3520 along a circumferential direction (e.g., an outer circumferential direction and/or an inner circumferential direction) of the acoustic transducer unit 3520. The structure and parameters of the suspension membrane structure 3530 and the suspension membrane structure 530 may be similar. For details, please refer to the relevant descriptions in FIG. 5, which is not repeated herein.

In some embodiments, the acoustic transducer unit 3520 may be located on the upper surface or the lower surface of the suspension membrane structure 3530. For example, as shown in FIGS. 35 and 36, the acoustic transducing unit 3520 may be located on the upper surface of the suspension membrane structure 3530. According to FIGS. 35 and 36, in some embodiments, the acoustic transducer unit 3520 may include a first electrode layer 3521, a piezoelectric layer 3522, and a second electrode layer 3523 arranged in sequence from top to bottom. The position the first electrode layer and the position of the second electrode layer 3523 may be interchanged. The structure and parameters of the acoustic transducer unit 3520 may be similar to the structure and parameters of the acoustic transducer unit 520 or the structure and parameters of the acoustic transducer unit 720. For details, please refer to the relevant descriptions in FIG. 5 or FIG. 7, which is not repeated herein.

In some embodiments, the vibration unit may further include a mass element 3540 (not shown in FIG. 35), and the mass element 3540 may be located on the upper surface or the lower surface of the suspension membrane structure 3530. For example, as shown in FIG. 36, the mass element 3540 may be located on the lower surface of suspension membrane structure 3530. The structure and parameters of the mass element 3540 may be similar to the structure and parameters of the mass element 740. For details, please refer to the relevant descriptions in FIG. 7, which is not repeated herein.

Figure 37:
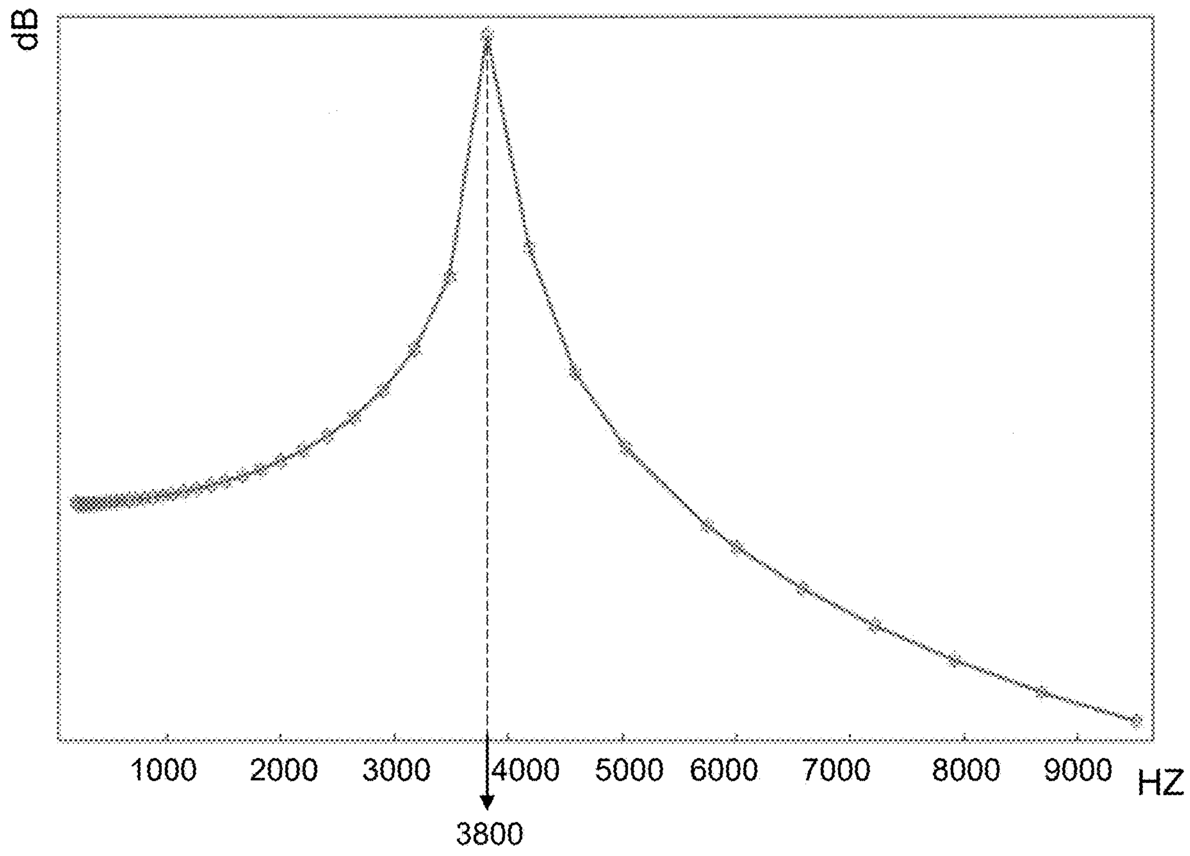
FIG. 37 is a resonant frequency curve of a bone conduction microphone according to some embodiments of the present disclosure.
Figure 38:
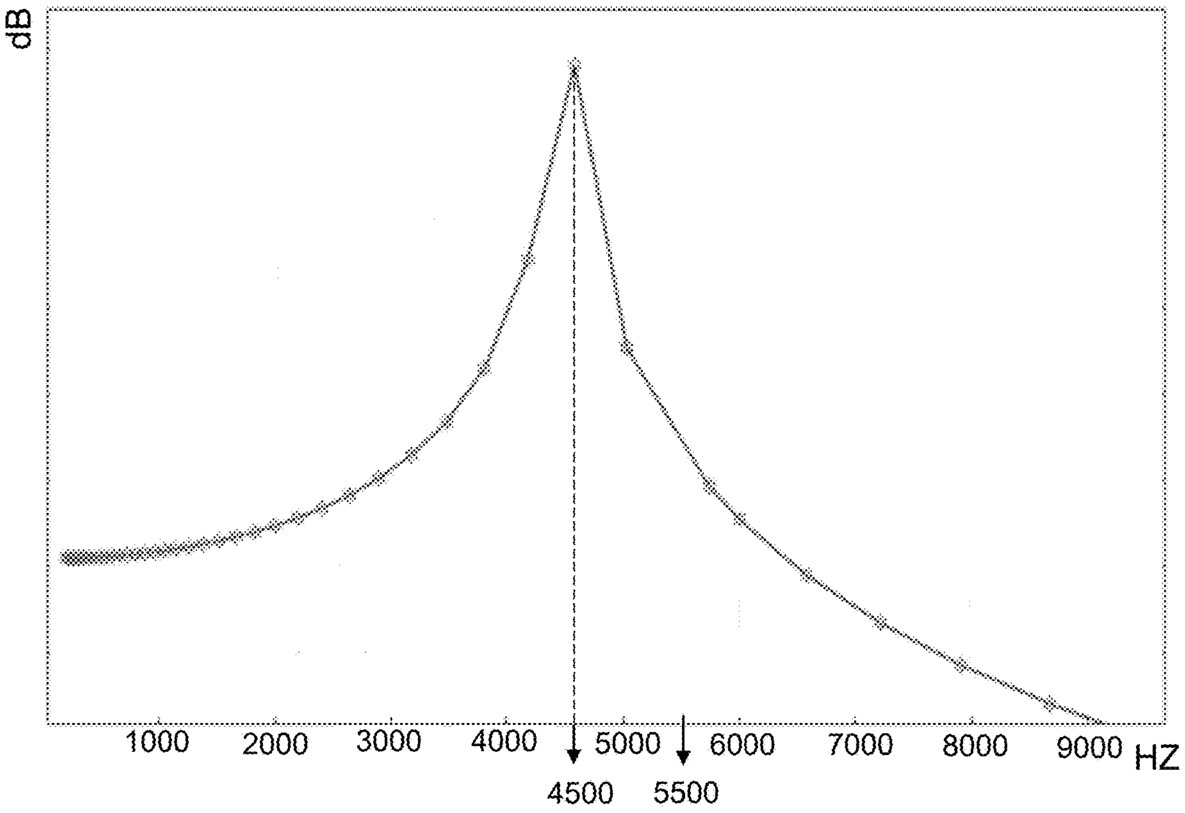
FIG. 38 is a resonant frequency curve of another bone conduction microphone according to some embodiments of the present disclosure.

Based on one or more of the above-mentioned embodiments, resonant frequency curves of the bone conduction microphone with the plurality of circular holes in the suspension membrane structure and the bone conduction microphone with the mass element under the suspension membrane structure may be respectively described through FIGS. 37 and 38. It should be noted that the structural settings of the bone conduction microphone corresponding to FIGS. 37 and 38 may be only to illustrate that the resonant frequency of the bone conduction microphone may be adjusted by setting the holes and the mass element in the suspension membrane structure, and may not limit the scope of protection of the present disclosure.

FIG. 37 is a resonant frequency curve of a bone conduction microphone according to some embodiments of the present disclosure. FIG. 38 is a resonant frequency curve of another bone conduction microphone according to some embodiments of the present disclosure. It should be noted that the resonant frequency curve may be a frequency response curve. The bone conduction microphone corresponding to the resonant frequency curve in FIG. 37 may be a circular suspension membrane structure in FIG. 28 and a circular structure enclosed by a plurality of circular through holes. The number of holes may be 2-18, and the holes are enclosed in one or two circles and distributed in a circle. The radii of the holes may be within a range of 20 μm-300 μm, and the radii of the circle enclosed by the holes may be within a range of 300 μm-700 μm. The thickness of the suspension membrane structure may be within a range of 0.5 μm-10 μm. The shape of the suspension membrane structure may be circular, and the radius of the suspension membrane structure may be within a range of 500 μm-1500 μm. The acoustic transducer unit may be a circular closed ring with an inner diameter of 100 μm-700 μm and an outer diameter of 110 μm-710 μm. The bone conduction microphone corresponding to the resonance frequency curve in FIG. 38 may be the structure of the circular suspension membrane structure and the circular mass element in FIG. 31A. The number of mass elements may be 1-3, and the shape of the mass element may be cylindrical. The thickness of the mass element may be within a range of 20 μm-400 μm, the radius of the cross-section of the mass element perpendicular to the thickness direction may be within a range of 100 μm-700 μm, and the mass element and the acoustic transducer unit may be arranged coaxially. The thickness of the suspension membrane structure may be within a range of 0.5 μm-10 μm. The shape of the suspension membrane structure may be circular. The radius of the suspension membrane structure may be within a range of 500 μm-1500 μm. The acoustic transducer unit may be a circular closed ring with an inner diameter of 100 μm-700 μm and an outer diameter of 110 μm-710 μm.

It can be seen from FIG. 37 that the resonant frequency range may be within a range of 2 KHZ-5 KHZ (the peak of the resonant frequency may be at 3.8 kHz). It can be seen from FIG. 38 that the resonant frequency may be within a range of 3 KHZ-5.5 KHZ (the peak of the resonant frequency may be at 4.5 kHz). The resonant frequency of the bone conduction microphone may be adjusted to be within a range of 3 kHz-4.5 kHz by adjusting the number, dimension, distribution position of the holes, and the dimension, shape, position, weight, etc. of the mass element, thereby adjusting the output electrical signal of the bone conduction microphone, and improving the sensitivity of the bone conduction microphone.

Figure 8:
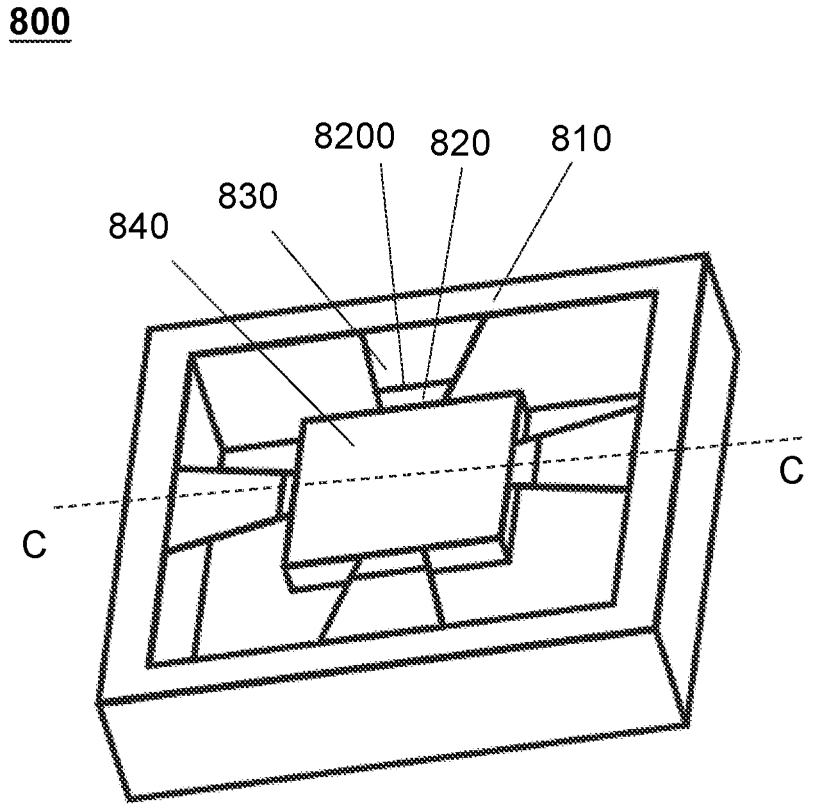
FIG. 8 is a schematic structural diagram illustrating a bone conduction microphone according to some embodiments of the present disclosure.
Figure 9:
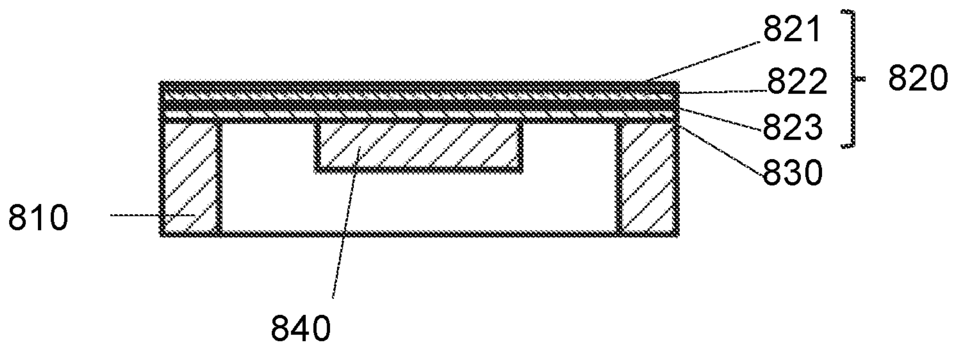
FIG. 9 is a sectional view of a bone conduction microphone in FIG. 8 along a C-C axis according to some embodiments of the present disclosure.

FIG. 8 is a schematic structural diagram illustrating a bone conduction microphone according to some embodiments of the present disclosure. FIG. 9 is a sectional view of a bone conduction microphone in FIG. 8 along a C-C axis according to some embodiments of the present disclosure. As shown in FIG. 8, the base structure 810 may be a cuboid frame structure. In some embodiments, the interior of the base structure 810 may include a hollow position configured to place an acoustic transducer unit 820 and a vibration unit. In some embodiments, the shape of the hollow position may be a circle, a quadrangle (e.g., a rectangle, a parallelogram), a pentagon, a hexagon, a heptagon, an octagon, and other regular or irregular shapes. In some embodiments, the dimension of one side of a rectangular cavity may be within a range of 0.8 mm-2 mm. Preferably, the dimension of one side of the rectangular cavity may be within a range of 1 mm-1.5 mm. In some embodiments, the vibration unit may include four support arms 830 and a mass element 840. One end of each of the four support arms 830 may be connected to an upper surface or a lower surface of the base structure 810 or a side wall where the hollow position of the base structure 810 is located, and the other end of each of the four support arms 830 may be connected to the upper surface, the lower surface, or a circumferential side wall of the mass element 840. In some embodiments, the mass element 840 may protrude upward and/or downward relative to the support arms 830. For example, when the ends of the four support arms 830 are connected to the upper surface of the mass element 840, the mass element 840 may protrude downward relative to the support arms 830. As another example, when the ends of the four support arms 830 are connected to the lower surface of the mass element 840, the mass element 840 may protrude upward relative to the support arms 830. As another example, when the ends of the four support arms 830 are connected to the circumferential side wall of the mass element 840, the mass element 840 may protrude upward and downward relative to the support arms 830. In some embodiments, the shapes of the support arms 830 may be trapezoidal. The end of each of the support arms 830 with a smaller width may be connected to the mass element 840, and the end of each of the support arms 830 with a larger width may be connected to the base structure 810.

In some embodiments, each of the support arms 830 may include at least one elastic layer. The elastic layer may be a plate-shaped structure made of a semiconductor material. In some embodiments, the semiconductor material may include silicon, silicon dioxide, silicon nitride, gallium nitride, zinc oxide, silicon carbide, or the like. In some embodiments, the materials of different elastic layers of the support arms 830 may be the same or different. Further, the bone conduction microphone 800 may include an acoustic transducer unit 820. The acoustic transducer unit 820 may include a first electrode layer 821, a piezoelectric layer 822, and a second electrode layer 823 arranged in sequence from top to bottom. The first electrode layer 821 or the second electrode layer 823 may be connected to the upper surface or the lower surface of the support arms 830 (e.g., the elastic Layer). In some embodiments, when the support arms 830 include a plurality of elastic layers, the acoustic transducer unit 820 may also be located among the plurality of elastic layers. The piezoelectric layer 822 may generate a voltage (potential difference) under a deformation stress of the vibration unit (e.g., the support arms 830 and the mass element 840) based on the piezoelectric effect, and the first electrode layer 821 and the second electrode layer 823 may export the voltage (electrical signal). In order to make a resonant frequency of the bone conduction microphone 800 within a specific frequency range (e.g., 2000 Hz-5000 Hz), the materials and the thickness of the acoustic transducer unit 820 (e.g., the first electrode layer 821, the second electrode layer 823, and the piezoelectric layer 822), vibration unit (e.g., the support arms 830) may be adjusted. In some embodiments, the acoustic transducer unit 820 may also include a wiring electrode layer (PAD layer) located on the first electrode layer 821 and the second electrode layer 823. The first electrode layer 821 and the second electrode layer 823 may be connected with an external circuit through an external wiring (e.g., a gold wires, an aluminum wire, etc.), so as to lead a voltage signal between the first electrode layer 821 and the second electrode layer 823 to a back-end processing circuit. In some embodiments, the material of the wiring electrode layer may include copper foil, titanium, copper, or the like. In some embodiments, the thickness of the wiring electrode layer may be within a range of 100 nm-200 nm. Preferably, the thickness of the wiring electrode layer may be within a range of 150 nm-200 nm. In some embodiments, the acoustic transducer unit 820 may further include a seed layer. The seed layer may be located between the second electrode layer 823 and the support arms 830. In some embodiments, the material of the seed layer may be the same as that of the piezoelectric layer 822. For example, when the material of the piezoelectric layer 822 is AlN, the material of the seed layer may also be AlN. In some embodiments, the material of the seed layer may also be different from the material of the piezoelectric layer 822. It should be noted that the specific frequency of the resonant frequency of the above-mentioned bone conduction microphone 800 may not be limited to the range of 2000 Hz-5000 Hz, and may also be within a range of 4000 Hz-5000 Hz or 2300 Hz-3300 Hz, etc. The specific frequency range may be adjusted according to the actual situation. In addition, when the mass element 840 protrudes upward relative to the support arms 830, the acoustic transducer unit 820 may be located on the lower surface of the support arms 830, and the seed layer may be located between the mass element 840 and the support arms 830.

In some embodiments, mass element 840 may be a single-layer structure or a multi-layer structure. In some embodiments, the mass element 840 may be the multi-layer structure. The number of layers of the mass element 840, the material and the parameters corresponding to each layer structure may be the same as or different from those of the elastic layer of the support arms 830 and the acoustic transducer unit 820. In some embodiments, the shape of the mass element 840 may be a circle, a semicircle, an ellipse, a triangle, a quadrangle, a pentagon, a hexagon, a heptagon, an octagon, or other regular or irregular shapes. In some embodiments, the thickness of the mass element 840 may be the same as or different from the total thickness of the support arms 830 and the acoustic transducer unit 820. For the material and dimension of the mass element 840 when it is the multi-layer structure, please refer to descriptions of the elastic layer of the support arms 830 and the acoustic transducer unit 820, which is not repeated herein. In addition, the materials and parameters of each layer structure of the elastic layer and the acoustic transducer unit 820 may also be applied to the bone conduction microphone shown in FIGS. 1, 3-5, and 7.

In some embodiments, the acoustic transducer unit 820 may include at least an effective acoustic transducer unit. The effective acoustic transducer unit may refer to a partial structure of the acoustic transducer unit that ultimately contributes an electrical signal. For example, the first electrode layer 821, the piezoelectric layer 822, and the second electrode layer 823 may have the same shape and area, and partially cover the support arms 830 (elastic layer), then the first electrode layer 821, the piezoelectric layer 822, and the second electrode layer 823 may be the effective transducer units. As another example, the first electrode layer 821 and the piezoelectric layer 822 may partially cover the support arms 830, and the second electrode layer 823 may completely cover the support arms 830, then the first electrode layer 821, the piezoelectric layer 822, and the parts of the second electrode layer 823 corresponding to the first electrode layer 821 may constitute the effective acoustic transducer unit. As another example, the first electrode layer 821 may partially cover the support arms 830, and the piezoelectric layer 822 and the second electrode layer 823 may completely cover the support arms 830, then the first electrode layer 821, the parts of the piezoelectric layer 822 corresponding to the first electrode layer 821, and the part of the second electrode layer 823 corresponding to the first electrode layer 821 may constitute the effective transducer unit. As another example, the first electrode layer 821, the piezoelectric layer 822, and the second electrode layer 823 may completely cover the support arms 830, but the first electrode layer 821 may be divided into a plurality of independent electrodes through arranging insulated trenches (e.g., electrode insulated trenches 8200), then the independent electrode part of the first electrode layer 821 that leads out an electrical signal, the corresponding piezoelectric layer 822, and the part of the second electrode layer 823 may be the effective transducer units. The independent electrode region in the first electrode layer 821 that does not lead out the electrical signal, the independent electrode in the first electrode layer 821 that does not lead out the electrical signal, and the piezoelectric layer 822 corresponding to the insulated trenches, and the region of the second electrode layer 823 may not provide the electrical signal, and may mainly provide a mechanical effect. In order to improve the SNR of the bone conduction microphone 800, the effective acoustic transducer unit may be arranged at the position of the support arms 830 near the mass element 840 or near the connection between the support arms 830 and the base structure 810. Preferably, the effective acoustic transducer unit may be arranged at a position where the support arms 830 are close to the mass element 840. In some embodiments, when the effective acoustic transducer unit is arranged at the position of the support arms 830 near the mass element 840 or near the connection between the support arms 830 and the base structure 810, a ratio of the cover area of the effective acoustic transducer unit at the support arms 830 to the area of the support arms 830 may be within a range of 5%-40%. Preferably, the ratio of the cover area of the effective acoustic transducer unit at the support arms 830 to the area of the support arms 830 may be within a range of 10%-35%. Further preferably, the ratio of the cover area of the effective acoustic transducer unit at the support arms 830 to the area of the support arms 830 may be within a range of 15%-20%.

The SNR of the bone conduction microphone 800 may be positively correlated with the intensity of an output electrical signal. When the laminated structure moves relative to the base structure, the deformation stress at the connection between the support arms 830 and the mass element 840 and the connection between the support arms 830 and the base structure 810 may be larger relative to the deformation stress in the middle region of the support arms 830. Correspondingly, the intensity of the output voltage at the connection between the support arms 830 and the mass element 840 and the connection between the support arms 830 and the base structure 810 may be relatively higher than the intensity of the output voltage in the middle region of the support arms 830. In some embodiments, when the acoustic transducer unit 820 completely or nearly completely covers the upper surface or the lower surface of the support arms 830, in order to improve the SNR of the bone conduction microphone 800, an electrode insulated trench may be arranged in the first electrode layer 821. The electrode insulated trench 8200 may divide the first electrode layer 821 into two parts, so that a part of the first electrode layer 821 may be close to the mass element 840, and the other part of the first electrode layer 821 may be close to the connection between the support arms 830 and the base structure 810. The first electrode layer 821 and the corresponding piezoelectric layer 822, and the part of the two parts separated by the electrode insulated trench 8200 in the second electrode layer 823 from which the electric signal is led out is an effective acoustic energy conversion unit. In some embodiments, the electrode insulated trench 8200 may be a straight line extending along a width direction of the support arms 830. In some embodiments, the width of the electrode insulated trench 8200 may be within a range of 2 μm-20 μm. Preferably, the width of the electrode insulated trench 8200 may be within a range of 4 μm-10 μm.

It should be noted that the electrode insulated trench 8200 may be not limited to a straight line extending along the width direction of the support arms 830, and may also be a curved line, a bent line, a wavy line, or the like. In addition, the electrode insulated trench 8200 may not extend along the width direction of the support arms 830, such as the electrode insulated trench 8201 shown in FIG. 10. The electrode insulated trench may only be used to divide the acoustic transducer unit 820 into multiple parts, which is not further limited herein.

Figure 10:
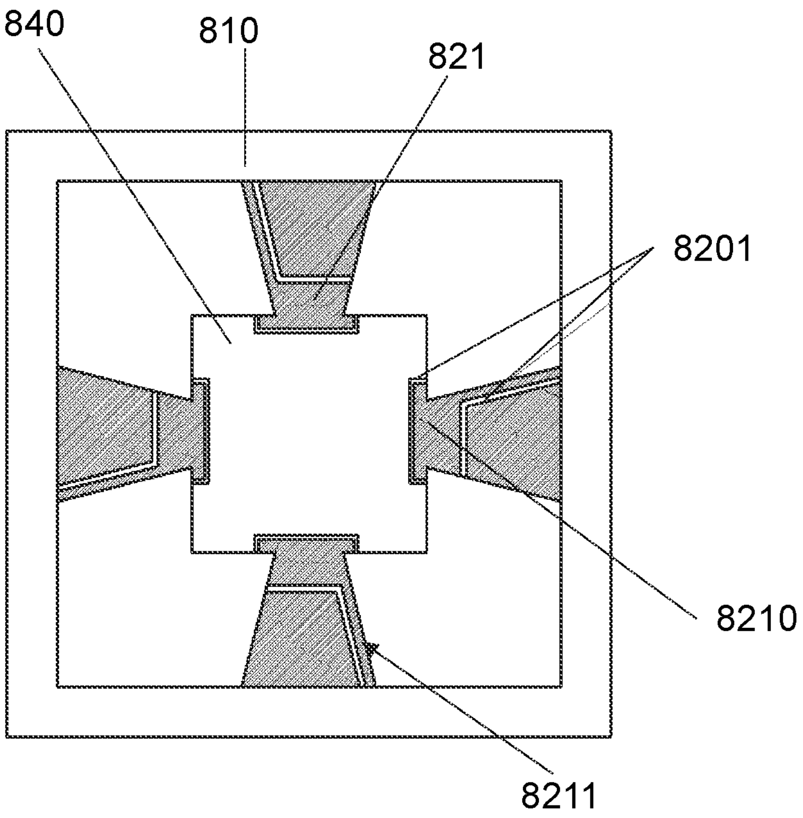
FIG. 10 is a schematic structural diagram illustrating a bone conduction microphone according to some embodiments of the present disclosure.

As shown in FIG. 10, when the partial structure of the acoustic transducer unit 820 (e.g., the acoustic transducer unit between the electrode insulated trench 8201 and the mass element 840 in FIG. 10) is set at a position where the support arms 830 are close to the mass element 840, the first electrode layer 821 and/or the second electrode layer 823 may further include an electrode lead. Taking the first electrode layer 821 as an example, the electrode insulated trench 8201 may divide the first electrode layer 821 into two parts. A part of the first electrode layer 821 may be connected to the mass element 840 or close to the mass element 840, and the other part of the first electrode layer 821 may be close to the connection between the support arms 830 and the base structure 810. In order to output the voltage of the acoustic transducer unit 820 close to the mass element 840, a partial region (a region of the first electrode layer 821 located at the edge of the support arms 830 shown in the figure) may be divided from the first electrode layer close to the connection between the support arms 830 and the base structure 810. The partial region may electrically connect the part of the acoustic transducer unit 820 connected to the mass element 840 or close to the mass element 840 with a processing unit of the bond conduction microphone 800. In some embodiments, the width of the electrode lead may be within a range of 4 μm-20 μm. Preferably, the width of the electrode lead may be within a range of 4 μm-10 μm. In some embodiments, the electrode lead may be located at any position in the width direction of the support arms 830. For example, the electrode lead may be located at the center of the support arms 830 or near the edge in the width direction. Preferably, the electrode lead may be located near the edge of the support arms 830 in the width direction. The use of conductive wires in the acoustic transducer unit 820 may be avoided by arranging the electrode leads 8211, and the structure is relatively simple, which is convenient for subsequent production and assembly.

Considering that the piezoelectric material of the piezoelectric layer 822 may be roughened in the region near the edge of the support arm 830 due to etching, the quality of the piezoelectric material may be deteriorated. In some embodiments, when the area of the piezoelectric layer 822 is equal to the area of the second electrode layer 823, in order to make the first electrode layer 821 be located in the piezoelectric material region with better quality, the area of the piezoelectric layer 822 may be less than the area of the first electrode layer 821, so that the edge region of the first electrode layer 821 may avoid the edge region of the piezoelectric layer 822, and an electrode retraction trench (not shown in the figure) may be formed between the first electrode layer 821 and the piezoelectric layer 822. The region with poor edge quality of the piezoelectric layer 822 may be avoided from the first electrode layer 821 and the second electrode layer 823 by setting the electrode retraction trench, thereby improving the SNR of the bone conduction microphone. In some embodiments, the width of the electrode retraction trench may be within a range of 2 μm-20 μm. Preferably, the width of the electrode retraction trench may be within a range of 2 μm-10 μm.

As shown in FIG. 10, taking that the mass element 840 protrudes downward relative to the support arms 830 as an example, the acoustic transducer unit 820 may further include an extension region 8210 extending along a length direction of the support arms 830. The extension region 8210 may be located on the upper surface of the mass element 840. In some embodiments, the electrode insulated trench 8201 may be arranged at the edge of the upper surface of the extension region 8210 on the upper surface of the mass element 840 to prevent excessive stress concentration of the support arm 830, thereby improving the stability of the support arms 830. In some embodiments, the length of the extension region 8210 may be greater than the width of the support arms 830. The length of the extension region 8210 may correspond to the width of the support arms 830. In some embodiments, the length of the extension region 8210 may be within a range of 4 μm-30 μm. Preferably, the length of the extension region 8210 may be within a range of 4 μm-15 μm. In some embodiments, the length of the extension area 8210 on the mass element 840 may be 1.2-2 times of the width of a connecting part between the support arms 830 and the edge of the mass element 840. Preferably, the length of the extension region 8210 on the mass element 840 may be 1.2-1.5 times of the width of the connecting part between the support arms 830 and the edge of the mass element 840.

Figure 11:
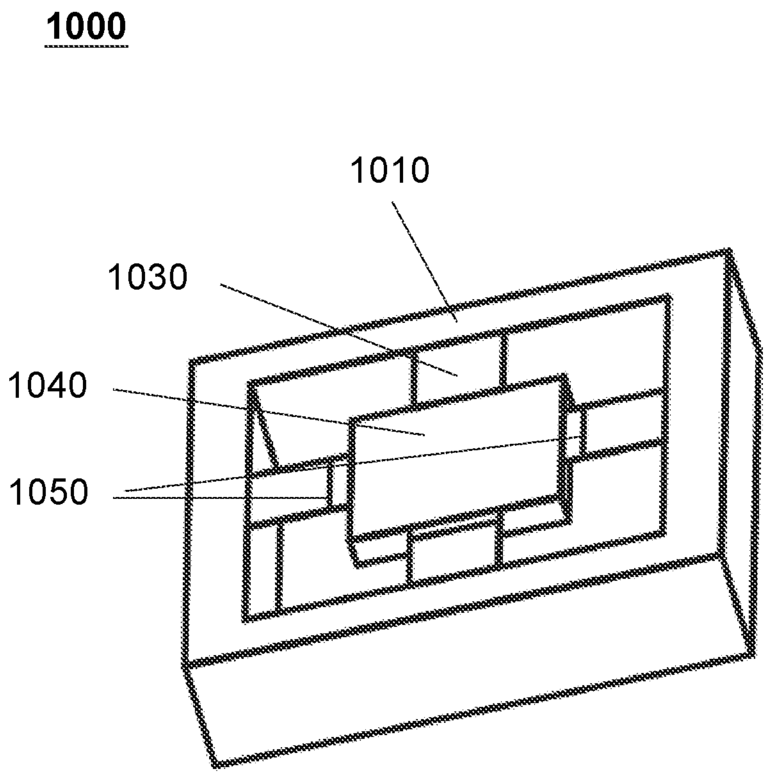
FIG. 11 is a schematic structural diagram illustrating a bone conduction microphone according to some embodiments of the present disclosure.

FIG. 11 is a schematic structural diagram illustrating a bone conduction microphone according to some embodiments of the present disclosure. The overall structure of the bone conduction microphone 1000 shown in FIG. 11 is substantially the same as that of the bone conduction microphone 800 shown in FIG. 8. The difference is that the shapes of the support arms may be different. As shown in FIG. 11, a base structure 1010 may be a cuboid frame structure. In some embodiments, the interior of the base structure 1010 may include a hollow position configured to suspend an acoustic transducer unit and a vibration unit. In some embodiments, the shape of the hollow position may be a circle, a quadrangle (e.g., a rectangle, a parallelogram), a pentagon, a hexagon, a heptagon, an octagon, or other regular or irregular shapes. In some embodiments, the vibration unit may include four support arms 1030 and a mass element 1040. One end of each of the four support arms 1030 may be connected to an upper surface or a lower surface of the base structure 1010, or a side wall where the hollow position of the base structure 1010 is located, and the other end of each of the four support arms 1030 may be connected to the upper surface, the lower surface, or a circumferential side wall of the mass element 1040. In some embodiments, the mass element 1040 may protrude upward and/or downward relative to the support arms 1030. For example, when the ends of the four support arms 1030 are connected to the upper surface of the mass element 1040, the mass element 1040 may protrude downward relative to the support arms 1030. As another example, when the ends of the four support arms 1030 are connected to the lower surface of the mass element 1040, the mass element 1040 may protrude upward relative to the support arms 1030. As another example, when the ends of the four support arms 1030 are connected to the circumferential side walls of the mass element 1040, the mass element 1040 may protrude upward and downward relative to the support arms 1030. In some embodiments, the shapes of the support arms 1030 may be rectangle. One end of each of the support arms 1030 may be connected to the mass element 1040, and the other end of each of the support arms 1030 may be connected to the base structure 1010.

In some embodiments, in order to improve the SNR of the bone conduction microphone 1000, an effective acoustic transducer unit may be arranged at a position of the support arms 1030 close to the mass element 1040 or close to a connection between the support arms 1030 and the base structure 1010. Preferably, the effective acoustic transducer unit may be arranged at a position of the support arms 1030 close to the mass element 1040. In some embodiments, when the effective acoustic transducer unit is arranged at the position of the support arms 1030 close to the mass element 1040 or close to the connection between the support arms 1030 and the base structure 1010, a ratio of a cover area of the effective acoustic transducer unit at the support arms 1030 to an area of the support arms 1030 may be within a range of 5%-40%. Preferably, the ratio of the cover area of the effective acoustic transducer unit at the support arms 1030 to the area of the support arms 1030 may be within a range of 10%-35%. Further preferably, the ratio of the cover area of the effective acoustic transducer unit 1020 at the support arms 1030 to the area of the support arms 1030 may be within a range of 15%-20%.

The SNR of the bone conduction microphone 1000 may be positively correlated with the strength of an output electrical signal. When the laminated structure moves relative to the base structure, the deformation stress at the connection between the support arms 1030 and the mass element 1040 and the connection between the support arms 1030 and the base structure 1010 may be larger relative to the deformation stress in the middle region of the support arms 1030. Furthermore, the intensity of the output voltage at the connection between the support arms 1030 and the mass element 1040 and the connection between the support arms 1030 and the base structure 1010 may be relatively higher than the intensity of the output voltage in the middle region of the support arms 1030. In some embodiments, when the acoustic transducer unit completely or nearly completely covers the upper surface or the lower surface of the support arms 1030, in order to improve the SNR of the bone conduction microphone 1000, an electrode insulated trench 1050 may be arranged in the first electrode layer. The electrode insulated trench 1050 may divide the first electrode layer into two parts, so that a part of the first electrode layer may be close to the mass element 1040, and the other part of the first electrode layer may be close to the connection between the support arms 1030 and the base structure 1010. In some embodiments, the electrode insulated trench 1050 may be a straight line extending along a width direction of the support arms 1030. In some embodiments, the width of the electrode insulated trench may be within a range of 2 μm-20 μm. Preferably, the width of the electrode insulated trench 1050 may be within a range of 4 μm-10 μm.

It should be noted that the electrode insulated trench 1050 may be not limited to the straight line extending along the width direction of the support arm 1030, but may also be a curved line, a bent line, a wavy line, or the like. In addition, the electrode insulated trench 1050 may not extend along the width direction of the support arms 1030, such as an electrode insulated trench 11200 shown in FIG. 12. The electrode insulated trench may only be used to divide the acoustic transducer unit into multiple parts, which is not further limited herein.

Figure 12:
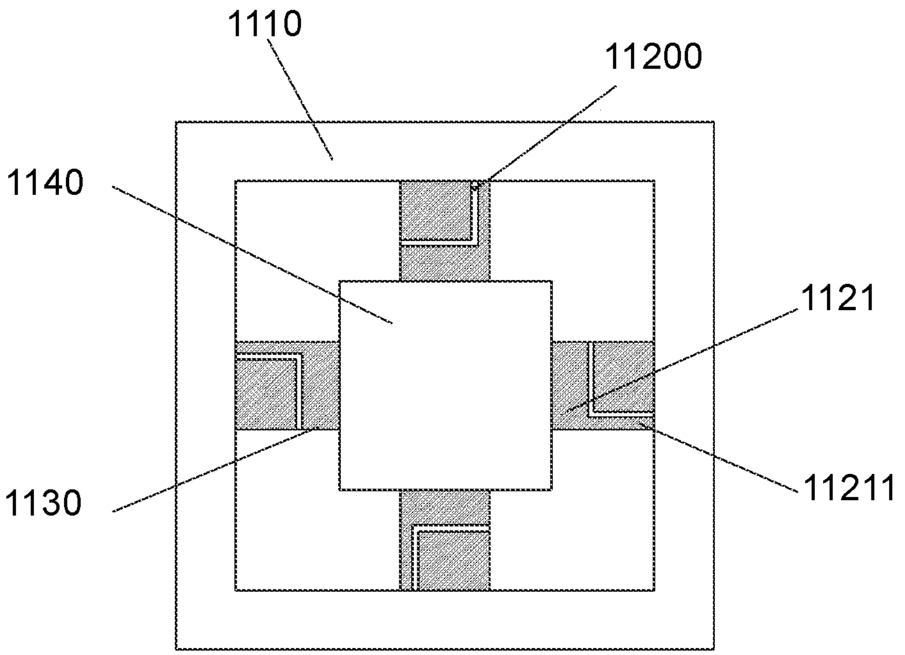
FIG. 12 is a schematic structural diagram illustrating a bone conduction microphone according to some embodiments of the present disclosure.

As shown in FIG. 12, when the partial structure of the acoustic transducer unit (e.g., the acoustic transducer unit between the electrode insulated trench 11200 and the mass element 1140 in FIG. 12) is arranged at the position of the support arms 1130 close to the mass element 1140, the first electrode layer 1121 and/or the second electrode layer may also include an electrode lead. Taking the first electrode layer 1121 as an example, the electrode insulated trench 11200 may divide the first electrode layer 1121 into two parts. A part of the first electrode layer 1121 may be connected to the mass element 1140 or is close to the mass element 1140, and the other part of the first electrode layer 1121 may be close to the connection between the support arms 1130 and the base structure 1110. In order to output the voltage of the acoustic transducer unit close to the mass element 1140, a part region (a region of the first electrode layer 1120 located at the edge of the support arms 1130 shown in the figure) may be divided out from the first electrode layer 1121 close to the connection between the support arms 1130 and the base structure 1110 through the electrode insulated trench 11200. This part of the region may electrically connect the part of the acoustic transducer unit connected to the mass element 1140 or close to the mass element 1140 with a processing unit of the bone conduction microphone. In some embodiments, the width of the electrode lead may be within a range of 4 μm-20 μm. Preferably, the width of the electrode lead may be within a range of 4 μm-10 μm. In some embodiments, the electrode lead may be located at any position in the width direction of the support arms 1130. For example, the electrode lead may be located at the center of the support arms 1130 or near the edge in the width direction. Preferably, the electrode lead may be located near the edge of the support arms 1130 in the width direction. The use of conductive wires in the acoustic transducer unit can be avoided by arranging the electrode leads, and the structure is relatively simple, which is convenient for subsequent production and assembly.

Figure 13:
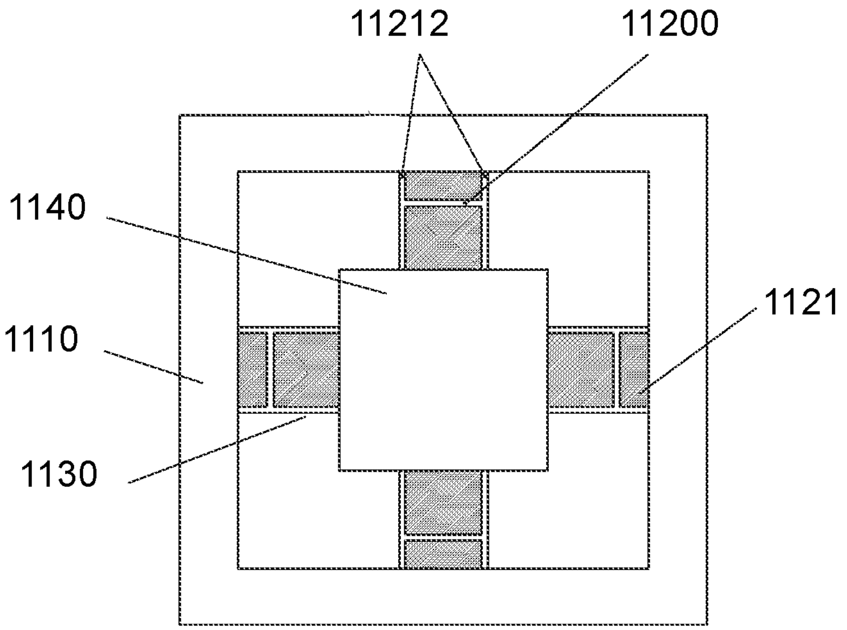
FIG. 13 is a schematic structural diagram illustrating a bone conduction microphone according to some embodiments of the present disclosure.

As shown in FIG. 13, the quality of the piezoelectric material may deteriorate because the region of the piezoelectric material of the piezoelectric layer close to the edge of the support arms may be roughened due to etching. In some embodiments, when the area of the piezoelectric layer is equal to the area of the second electrode layer, in order to make the first electrode layer be located in the piezoelectric material region with better quality, the area of the piezoelectric layer may be less than the area of the first electrode layer, so that the edge region of the first electrode layer may avoid the edge region of the piezoelectric layer, and an electrode retraction trench 11212 may be formed between the first electrode layer 1121 and the piezoelectric layer. By setting the electrode retraction trench 11212, the region with poor edge quality of the piezoelectric layer may be avoided from the first electrode layer and the second electrode layer, thereby improving the SNR of the bone conduction microphone. In some embodiments, the width of the electrode retraction trench 11212 may be within a range of 2 μm-20 μm. Preferably, the width of the electrode retraction trench 11212 may be within a range of 2 μm-10 μm.

Figure 14:
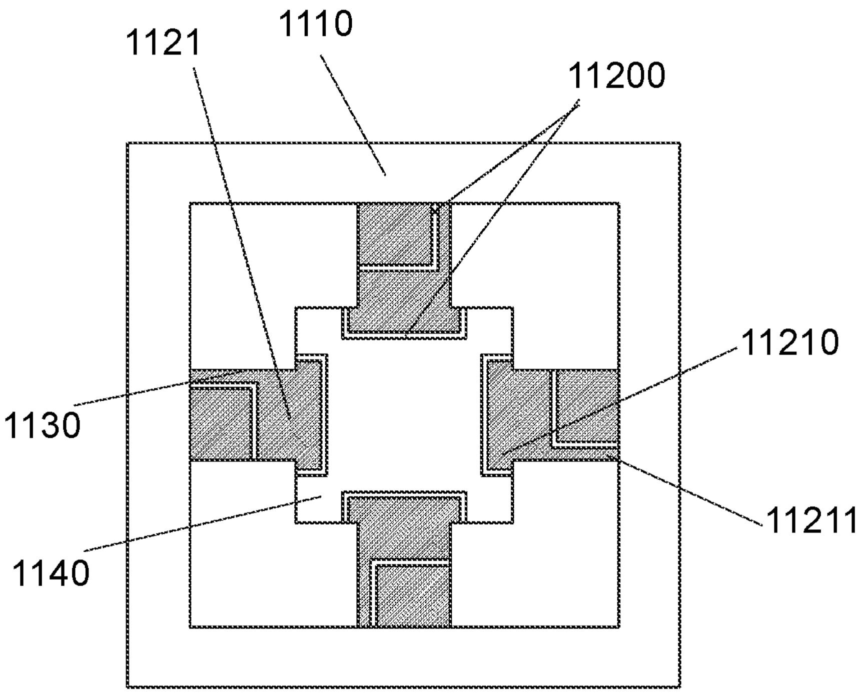
FIG. 14 is a schematic structural diagram illustrating a bone conduction microphone according to some embodiments of the present disclosure.

As shown in FIG. 14, in some embodiments, taking the mass element 1140 protruding downward relative to the support arms 1130 as an example, the acoustic transducer unit may further include an extension region 11210 extending along ae length direction of the support arms 1130. The extension region 11210 may be located on the upper surface of the mass element 1140. In some embodiments, an electrode insulated trench 11200 may be arranged at the edge of the extension region 11210 on the upper surface of the mass element 1140 to prevent excessive stress concentration of the support arms 1130, thereby improving the stability of the support arms 1130. In some embodiments, the length of the extension region 11210 may be greater than the width of the support arms 1130. The length of the extension region 11210 may correspond to the width of the support arms 1130. In some embodiments, the length of the extension region 11210 may be within a range of 4 μm-30 μm. Preferably, the length of the extension region 11210 may be within a range of 4 μm-15 μm. In some embodiments, the length of the extension region 11210 on the mass element 1140 may be 1.2-2 times of the width of a connecting part between the support arms 1130 and the edge of the mass element 1140. Preferably, the length of the extension region 11210 on the mass element 1140 may be 1.2-1.5 times of the width of the connecting part between the support arms 1130 and the edge of the mass element 1140. For the materials, the dimensions, and other parameters of the acoustic transducer unit, the first electrode layer, the second electrode layer, the piezoelectric layer, the vibration unit, and the mass element 1140 in the embodiment, please refer to the descriptions of FIGS. 8-10, which is not repeated herein.

Figure 15:
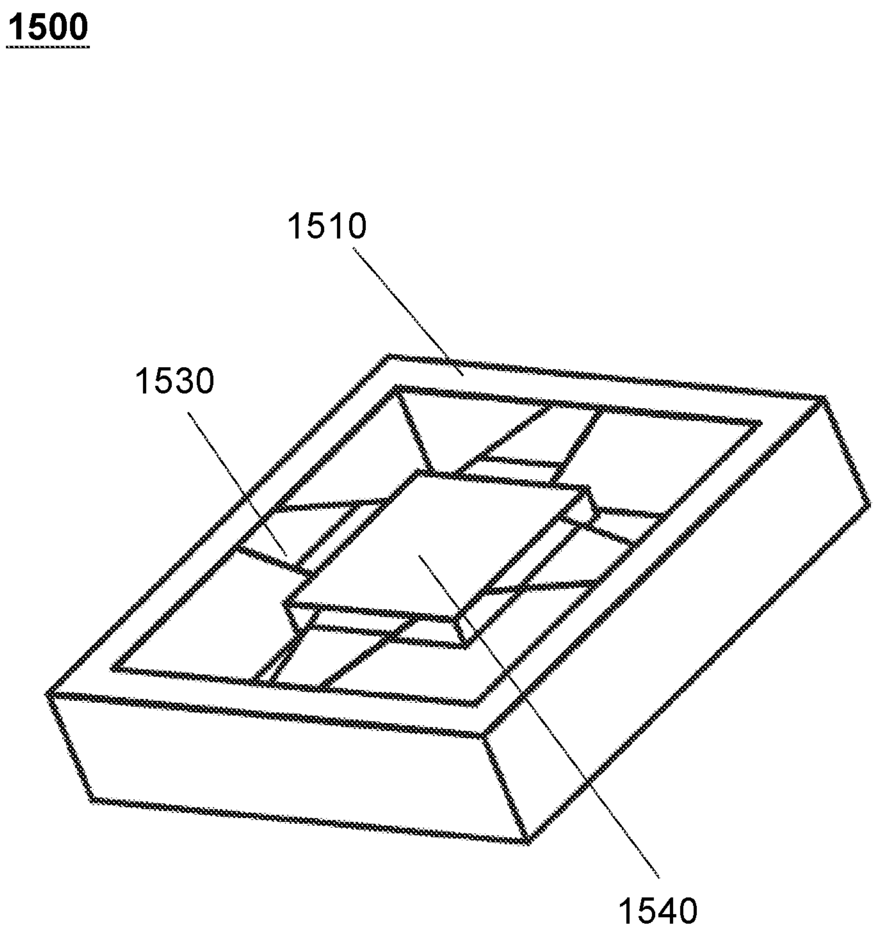
FIG. 15 is a schematic structural diagram illustrating a bone conduction microphone according to some embodiments of the present disclosure.

FIG. 15 is a schematic structural diagram illustrating another bone conduction microphone according to some embodiments of the present disclosure. The structure of the bone conduction microphone 1500 shown in FIG. 15 may be substantially the same as that of the bone conduction microphone 800 shown in FIG. 8. The difference may be the way of connection between the support arms and the base structure. As shown in FIG. 15, the base structure 1510 may be a cuboid frame structure. In some embodiments, the interior of the base structure 1510 may include a hollow position configured to suspend an acoustic transducer unit and a vibration unit. In some embodiments, the vibration unit may include four support arms 1530 and a mass element 1540. One end of each of the four support arms 1530 may be connected to an upper surface or a lower surface of the base structure 1510, or a side wall where the hollow position of the base structure 1510 is located, and the other end of each of the four support arms 1530 may be connected to the upper surface, the lower surface, or a circumferential side wall of the mass element 1540. In some embodiments, the mass element 1540 may protrude upward and/or downward relative to support arms 1530. For example, when the ends of the four support arms 1530 are connected to the upper surface of the mass element 1540, the mass element 1540 may protrude downward relative to the support arms 1530. As another example, when the ends of the four support arms 1530 are connected to the lower surface of the mass element 1540, the mass element 1540 may protrude upward relative to the support arms 1530. As another example, when the ends of the four support arms 1530 are connected to the circumferential side wall of the mass element 1540, the mass element 1540 may protrude upward and downward relative to the support arms 1530. In some embodiments, the shapes of the support arms 1530 may be trapezoidal. The end of each of the support arms 1530 with a larger width may be connected to the mass element 1540, and the end of each of the support arms 1530 with a smaller width may be connected to the base structure 1510. It should be noted that, the structure, dimension, thickness, or other parameters of the acoustic transducer unit 820, the first electrode layer 821, the second electrode layer 823, the piezoelectric layer 822, the vibration unit, the mass element 840, the extension region 8210, the electrode insulated trench 8201, the electrode retraction trench, the electrode insulated trench 8200, and other components in FIGS. 8-10 may be applied to the bone conduction microphone 1500, which is not further described herein.

Figure 16:
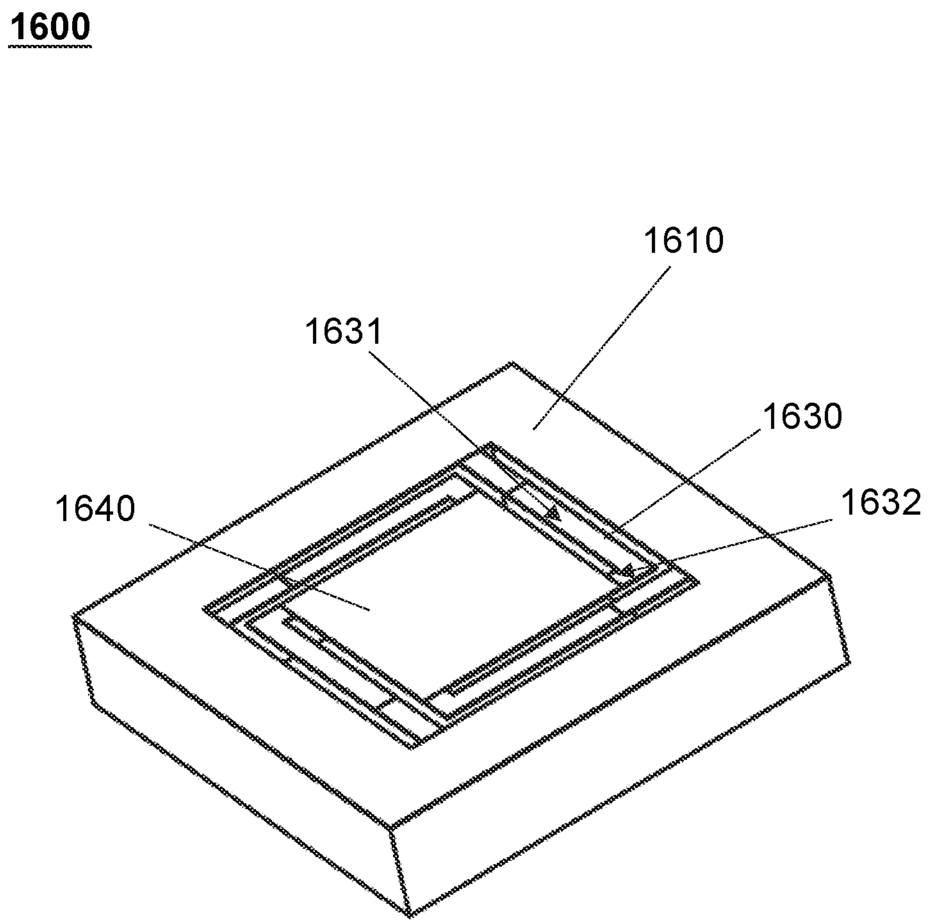
FIG. 16 is a schematic structural diagram illustrating a bone conduction microphone according to some embodiments of the present disclosure.

FIG. 16 is a schematic structural diagram illustrating a bone conduction microphone according to some embodiments of the present disclosure. The structure of the bone conduction microphone 1600 shown in FIG. 16 may be substantially the same as that of the bone conduction microphone 800 shown in FIG. 8. The difference is that the structures of the support arms 1630 in the bone conduction microphone 1600 may be different from those of the support arms 830 in the bone conduction microphone 800. In some embodiments, the interior of the base structure 1610 may include a hollow position configured to suspend an acoustic transducer unit and a vibration unit. In some embodiments, the vibration unit may include four support arms 1630 and a mass element 1640. One end of each of the four support arms 1630 may be connected to an upper surface or a lower surface of the base structure 1610, or a side wall where the hollow position of the base structure 1610 is located, and the other end of each of the four support arms 1630 may be connected to the upper surface, the lower surface, or a circumferential side wall of the mass element 1640. In some embodiments, the mass element 1640 may protrude upward and/or downward relative to the support arms 1630. For example, when the ends of the four support arms 1630 are connected to the upper surface of the mass element 1640, the mass element 1640 may protrude downward relative to the support arms 1630. As another example, when the ends of the four support arms 1630 are connected to the lower surface of the mass element 1640, the mass element 1640 may protrude upward relative to the support arms 1630. As another example, when the ends of the four support arms 1630 are connected to the circumferential side wall of the mass element 1640, the mass element 840 may protrude upward and downward relative to the support arms 1630. In some embodiments, the upper surface of the mass element 1640 and the upper surface of the support arms 1630 may be located on the same horizontal plane, and/or the lower surface of the mass element 1640 and the lower surface of the support arms 1630 may be located on the same horizontal plane. In some embodiments, the shape of the support arms 1630 may be an approximate L-shaped structure. As shown in FIG. 16, the support arms 1630 may include a first support arm 1631 and a second support arm 1632. One end part of the first support arm 1631 may be connected to one end part of the second support arm 1632. A certain included angle may be formed between the first support arm 1631 and the second support arm 1632. In some embodiments, the included angle may be within a range of 75°-105°. In some embodiments, one end of the first support arm 1631 away from a connection between the first support arm 1631 and the second support arm 1632 may be connected to a base structure 1610, and one end of the second support arm 1632 away from a connection between first support arm 1631 and the second support arm 1632 may be connected to the upper surface, the lower surface, or the circumferential side wall of the mass element 1640, so that the mass element 1640 may be suspended in the hollow position of the base structure 1610.

In some embodiments, the acoustic transducer unit may be a multi-layer structure. The acoustic transducer unit may include a first electrode layer, a second electrode layer, a piezoelectric layer, an elastic layer, a seed layer, an electrode insulated trench, an electrode insulated communication, or other structures. For the structure of each layer of the acoustic transducer unit, the mass element 1640, etc., please refer to the descriptions of acoustic transducer unit 820, the first electrode layer 821, the second electrode layer 823, the piezoelectric layer 822, the vibration unit, the mass element 840, the extension region 8210, the electrode insulated trench 8201, the electrode retraction trench, and the electrode insulated trench 8200, which is not further described herein.

In some embodiments, the bone conduction microphone described in any one of the above embodiments may further include a limiting structure (not shown in the figure). The limiting structure may be a plate-shaped structure. In some embodiments, the limiting structure may be located in the hollow position of the base structure. The limiting structure may be located above or below the laminated structure and set opposite to the laminated structure. In some embodiments, when the base structure is a vertically penetrating structure, the limiting structure may also be located at the top or bottom of the base structure. The limiting structure and the mass units of the laminated structure may be arranged at intervals. The limiting structure may limit the amplitude of the mass units in the laminated structure when a large impact is subjected to, so as to avoid damage to the device due to severe vibration. In some embodiments, the limiting structure may be a rigid structure (e.g., a limiting block), or a structure with a certain elasticity (e.g., an elastic cushion, a buffer cantilever beam, or a buffer support arm and a limiting block, etc.).

Figure 17:
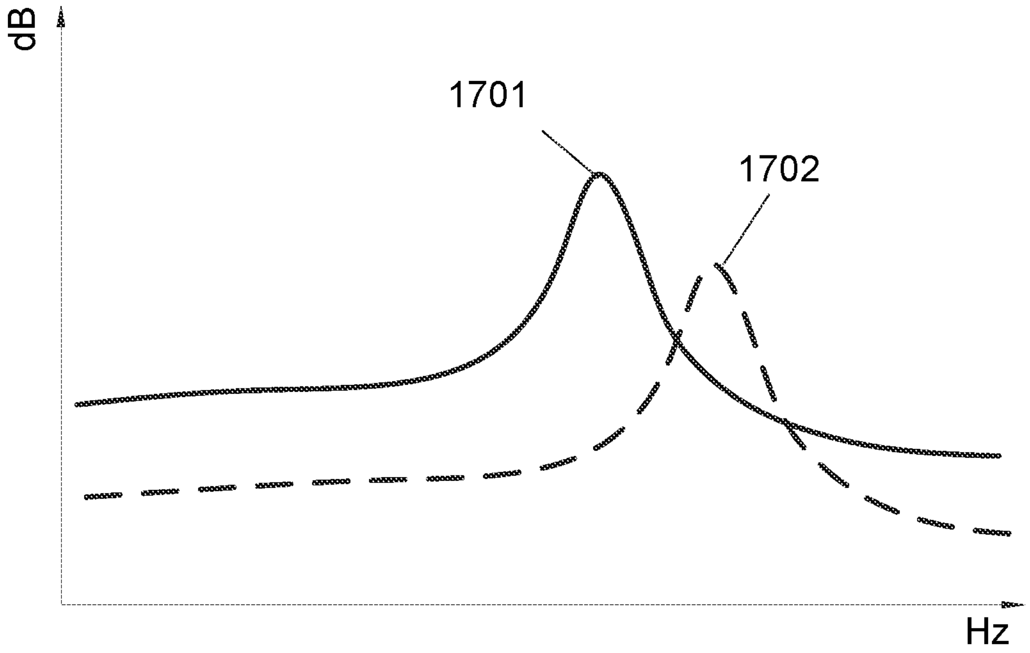
FIG. 17 is a frequency response curve illustrating a natural frequency advance of a laminated structure according to some embodiments of the present disclosure.

The laminated structure may have a natural frequency. When the frequency of the external vibration signal is close to the natural frequency, the laminated structure may generate a larger amplitude, thereby outputting a larger electrical signal. Therefore, the response of the bone conduction microphone to the external vibration may appear to generate a formant near the natural frequency. In some embodiments, by changing the parameters of the laminated structure, the natural frequency of the laminated structure may be shifted to a voice frequency band range, so that the formant of the bone conduction microphone may be located in the voice range, thereby improving the sensitivity of the bone conduction microphone to the vibration in the voice band (e.g., the frequency range before the formant). As shown in FIG. 17, the frequency corresponding to a formant 1701 in a frequency response curve (solid line curve in FIG. 17) of natural frequency advance of the laminated structure may be smaller relative to the frequency corresponding to a formant 1702 in a frequency response curve (dotted line curve in FIG. 17) of unchanged natural frequency of the laminated structure. For the external vibration signal whose frequency is less than the frequency of the formant 1701, the bone conduction microphone corresponding to the solid line curve may have a higher sensitivity.

The displacement output formula of the laminated structure may be as follows:

$$x_a = \frac{F}{\omega|Z|} = \frac{F}{\omega\sqrt{R^2 + (\omega M - K\omega^{-1})^2}}. \tag{5}$$

Where M is the mass of the laminated structure, R is the damping of the laminated structure, K is the elastic coefficient of the laminated structure, F is the amplitude of the driving force, $x_a$ is the displacement of the laminated structure, $\omega$ is the circular frequency of the external force, and $\omega_0$ is the natural frequency of the laminated structure. When the circular frequency of the external force is $$\omega < \omega_0\left(\omega_0 = \frac{F}{M}\right), \omega M < K\omega^{-1}.$$

If the natural frequency $\omega_0$ of the laminated structure is reduced (by increasing M or decreasing K or both increasing M and decreasing K), then $|\omega M < K\omega^{-1}|$ may decrease, and the corresponding displacement output $x_a$ may increase. When the frequency of the exciting force $\omega=\omega_0$, $\omega M=K\omega^{-1}$. When the natural frequency $\omega_0$ of a vibration-electrical signal conversion device (laminated structure) is changed, the corresponding displacement output $x_a$ may be unchanged. When the frequency of the exciting force $\omega>\omega_0$, $\omega M>K\omega^{-1}$. If the natural frequency $\omega_0$ of the vibration-electric signal conversion device is reduced (by increasing M or decreasing K or increasing M and decreasing K at the same time), then $|\omega M-K\omega^{-1}|$ may increase, and the corresponding displacement output $x_a$ may decrease.

As the formant advances, there may be a peak in the voice band. When the bone conduction microphone collects the signal, there may be too much signal in the formant frequency band, which makes a poor communication effect. In some embodiments, in order to improve the quality of the sound signal collected by the bone conduction microphone, a damping structure layer may be arranged at the laminated structure. The damping structure layer may increase the energy loss of the laminated structure during the vibration process, especially the loss at the resonant frequency. Here, the reciprocal 1/Q of the mechanical quality factor may be used to describe the damping coefficient as follows:

$$Q^{-1} = \frac{\Delta f}{\sqrt{3} f_0}. \tag{6}$$

Where $Q^{-1}$ is the reciprocal of the quality factor, also referred to as the structural loss factor $\eta$, $\Delta f$ is the frequency difference $f_1-f_2$ at half the resonance amplitude (also referred to as the 3 dB bandwidth), and $f_0$ is the resonant frequency.

The relationship between the loss factor $\eta$ of the laminated structure and the loss factor tan $\delta$ of the damping material may be as follows:

$$\eta = \frac{XY\tan\delta}{1 + (2+Y)X + (1+Y)\left[1 + (\tan\delta)^2\right]X^2}. \tag{7}$$

Where X is a shear parameter, which is related to the thickness and material properties of each layer of the laminated structure. Y is a stiffness parameter, which is related to the thickness and Young's modulus of each layer of the laminated structure.

Figure 18:
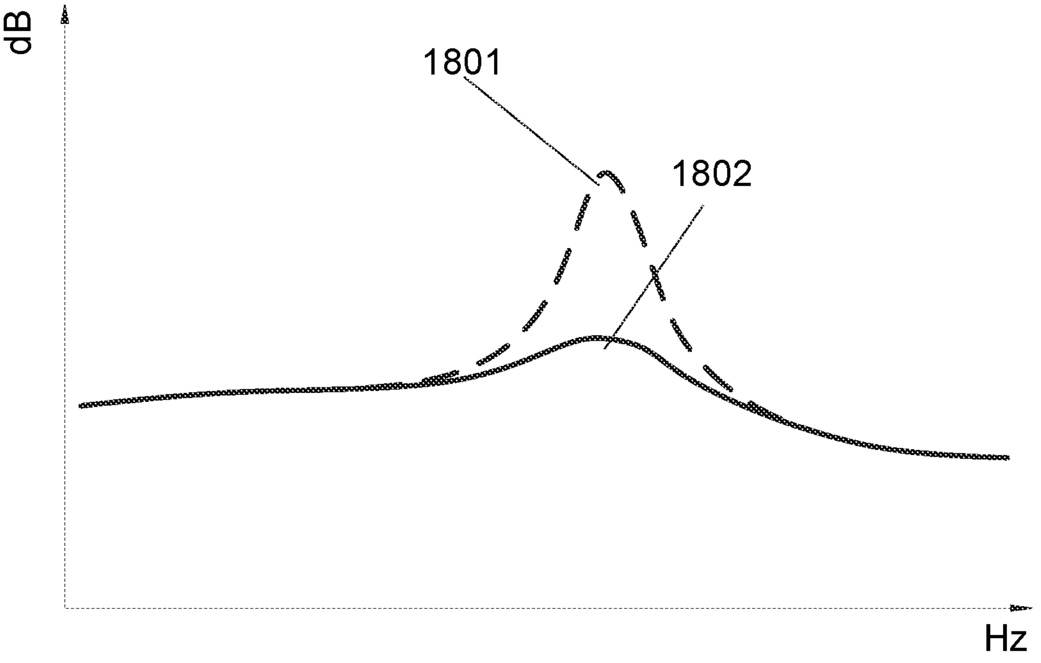
FIG. 18 is a frequency response curve illustrating a bone conduction microphone with or without a damping structure layer according to some embodiments of the present disclosure.

According to formula (6) and formula (7), it can be seen that by adjusting the material of the damping structure layer and the materials of each layer of the laminated structure, the loss factor n of the laminated structure may be adjusted in a suitable range. As the damping of the damping structure layer of the laminated structure increases, the mechanical quality factor Q may decrease, and the corresponding 3 dB bandwidth may increase. The damping of the damping structure layer may be different under different stress (deformation) states. For example, a greater damping may be presented at high stress or large amplitude. Therefore, the characteristics of the laminated structure with small amplitude in the non-resonance region and large amplitude in the resonance region may be used, the Q value in the resonance region may be reduced while ensuring that the sensitivity of the bone conduction microphone in the non-resonance region is not reduced by adding the damping structure layer, so that the frequency response of the bone conduction microphone may be relatively flat over the entire frequency band. FIG. 18 is a frequency response curve illustrating a bone conduction microphone with or without a damping structure layer according to some embodiments of the present disclosure. As shown in FIG. 18, the frequency response curve 1802 of the electrical signal outputted by the bone conduction microphone with the damping structure layer may be flat relative to the frequency response curve 1801 of the electrical signal outputted by the bone conduction microphone without the damping structure layer.

In some embodiments, the bone conduction microphone may include at least one damping structure layer. A peripheral side of the at least one damping structure layer may be connected to the base structure. In some embodiments, the at least one damping structure layer may be located on the upper and/or lower surface of the laminated structure or between the multi-layer structures of the laminated structure. In some embodiments, for the macro-sized laminated structure and the base structure, the damping structure layer may be directly bonded to the surface of the base structure or the laminated structure. In some embodiments, for a MEMS device, the damping structure layer may be connected to the laminated structure and the base structure by using a semiconductor process, such as evaporation, spin coating, micro-assembly, or the like. In some embodiments, the shape of the damping structure layer may be a regular or irregular shape such as a circle, an ellipse, a triangle, a quadrangle, a hexagon, and an octagon. In some embodiments, the output effect of the electrical signal of the bone conduction microphone may be improved by selecting the material, dimension, thickness, etc. of a damping membrane.

Figure 19:
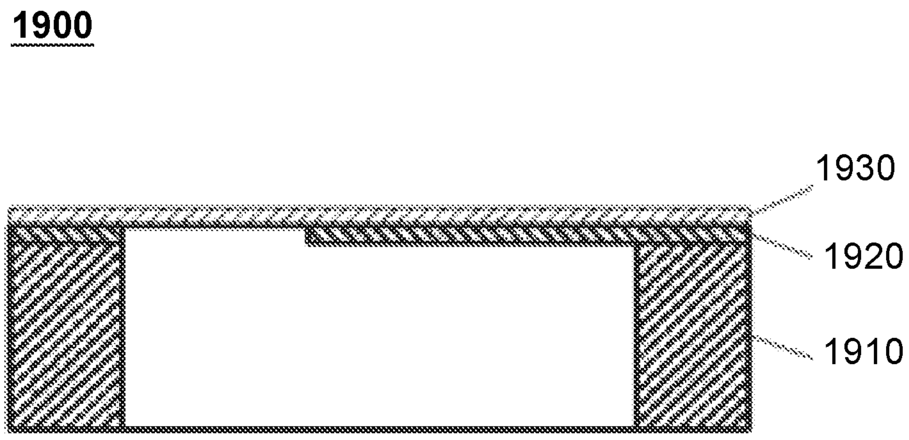
FIG. 19 is a sectional view of a bone conduction microphone according to some embodiments of the present disclosure.

In order to describe the damping structure layer more clearly, the bone conduction microphone in the form of a cantilever beam (e.g., the bone conduction microphone 100 shown in FIG. 1, the bone conduction microphone 300 shown in FIG. 3, and the bone conduction microphone 400 shown in FIG. 4) may be used as an exemplary illustration. FIG. 19 is a sectional view of a bone conduction microphone according to some embodiments of the present disclosure. As shown in FIG. 19, the bone conduction microphone 1900 may include a base structure 1910, a laminated structure 1920, and a damping structure layer 1930. Further, one end of the laminated structure 1920 may be connected to an upper surface of the base structure 1910, the other end of the laminated structure 1920 may be suspended in a hollow position of the base structure 1910, and the damping structure layer 1930 may be located on the upper surface of the laminated structure 1920. The area of the damping structure layer 1930 may be greater than the area of the laminated structure 1920, i.e., the damping structure layer 1930 may not only cover the upper surface of the laminated structure 1920, but may further cover a gap between the laminated structure 1920 and the base structure 1910. In some embodiments, at least a part of the circumferential side of the damping structure layer 1930 may be fixed to the base structure 1910.

Figure 20:
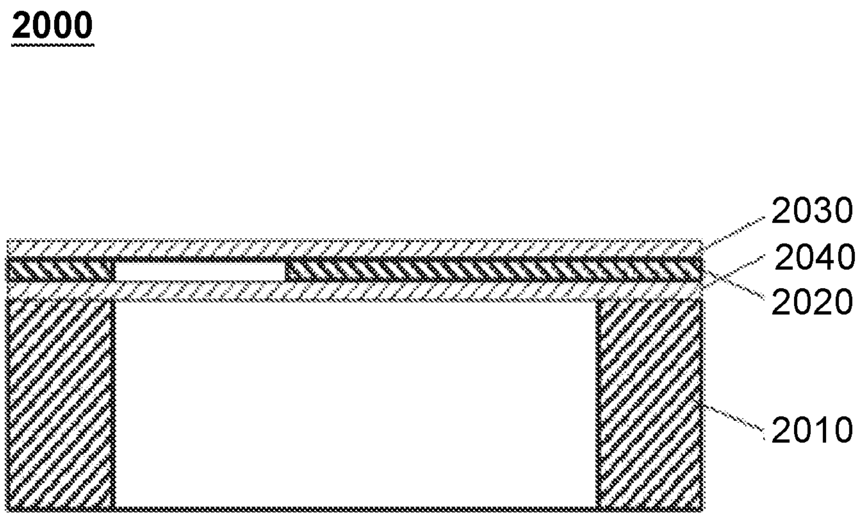
FIG. 20 is a sectional view of a bone conduction microphone according to some embodiments of the present disclosure.

FIG. 20 is a sectional view of a bone conduction microphone according to some embodiments of the present disclosure. As shown in FIG. 20, the bone conduction microphone 2000 may include a base structure 2010, a laminated structure 2020, and two damping structure layers. The two damping structure layers may include a first damping structure layer 2030 and a second damping structure layer 2040. Further, the second damping structure layer 2040 may be connected to an upper surface of the base structure 2010, and the lower surface of the laminated structure 2020 may be connected to the upper surface of the second damping structure layer 2030. One end of the laminated structure 2020 may be suspended in a hollow position of the base structure 2010. The first damping structure layer 2030 may be located on the upper surface of the laminated structure 2020. The area of the first damping structure layer 2030 and/or the second damping structure layer 2040 may be greater than the area of the laminated structure 2020.

Figure 21:
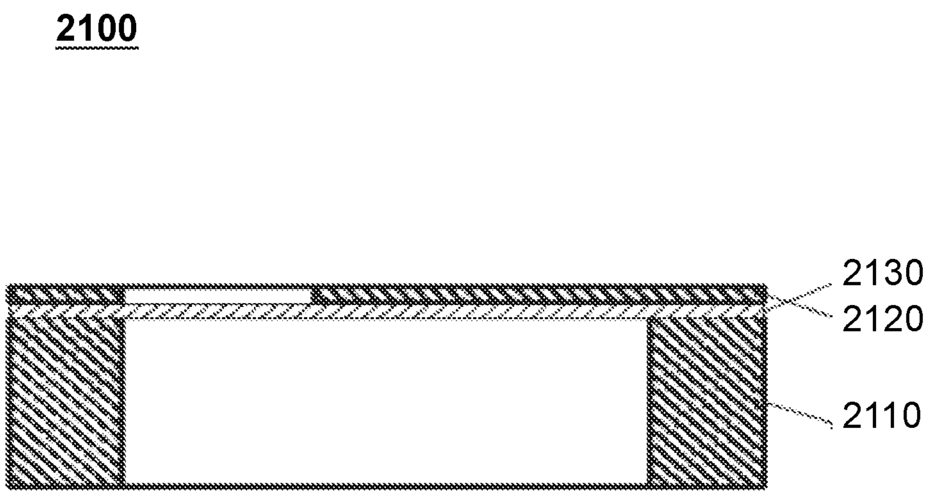
FIG. 21 is a sectional view of a bone conduction microphone according to some embodiments of the present disclosure.

FIG. 21 is a sectional view of a bone conduction microphone according to some embodiments of the present disclosure. As shown in FIG. 21, the bone conduction microphone 2100 may include a base structure 2110, a laminated structure 2120, and a damping structure layer 2130. Further, the damping structure layer 2130 may be located on a lower surface of the base structure 2110. The lower surface of the laminated structure 2120 may be connected to the upper surface of the damping structure layer 2130. One end of the laminated structure 2120 may be suspended in a hollow position of the base structure 2110.

It should be noted that the position of the damping structure layer (e.g., the damping structure layer 1930) may not be limited to the upper surface and/or the lower surface of the above-mentioned laminated structure in FIGS. 19-21, and may also be located between multi-layer structures of the laminated structure. For example, the damping structure layer may be located between an elastic layer and a first electrode layer. As another example, the damping structure layer may also be located between a first elastic layer and a second elastic layer. In addition, the damping structure layer may not be limited to the above-mentioned bone conduction microphone in the form of cantilever beam, and may also be applied to the bone conduction microphone shown in FIGS. 5, 7, 8, 11, 15, and 16, which is not repeated herein.

The basic concept has been described above, obviously, for those skilled in the art, the above detailed disclosure is only an example, and does not constitute a limitation to the present disclosure. Although not explicitly stated here, those skilled in the art may make various modifications, improvements and amendments to the present disclosure. These modifications, improvements, and amendments are intended to be suggested by the present disclosure, and are within the spirit and scope of the exemplary embodiments of the present disclosure.

Moreover, certain terminology has been used to describe embodiments of the present disclosure. For example, "one embodiment", "an embodiment", and/or "some embodiments" may indicate a certain feature, structure, or characteristic related to at least one embodiment of the present disclosure. Therefore, it should be emphasized and noted that two or more references to "one embodiment" or "an embodiment" or "an alternative embodiment" in different places in the present disclosure do not necessarily refer to the same embodiment. In addition, certain features, structures or characteristics of one or more embodiments of the present disclosure may be properly combined.

In addition, those skilled in the art may understand that various aspects of the present disclosure may be illustrated and described through several patentable categories or situations, including any new and useful processes, machines, products, or combinations of materials, or any new and useful improvements. Accordingly, all aspects of the present disclosure may be performed entirely by hardware, may be performed entirely by software (including firmware, resident software, microcode, etc.), or may be performed by a combination of hardware and software. The above hardware or software may be referred to as "block", "module", "engine", "unit", "component" or "system". In addition, aspects of the present disclosure may appear as a computer product located in one or more computer-readable media, the product including computer-readable program code.

In addition, unless explicitly stated in the claims, the order of processing elements and sequences described in the disclosure, the use of numbers and letters, or the use of other designations are not used to limit the order of the flow and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, while the system components described above may be implemented as hardware devices, they may also be implemented as a software-only solution, such as installing the described system on an existing processing device or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, the present disclosure does not mean that object of the present disclosure requires more features than the features mentioned in the claims. In fact, the features of the embodiments are less than all the features of the single embodiment disclosed above.

In some embodiments, numbers describing the quantity of components and attributes are used. It should be understood that such numbers used in the description of the embodiments use the modifiers "about", "approximately" or "substantially" in some examples. Unless otherwise stated, "about", "approximately" or "substantially" indicates that the stated number allows for a variation of ±20%. Accordingly, in some embodiments, the numerical parameters used in the disclosure and claims are approximations that can vary depending upon the desired characteristics of individual embodiments. In some embodiments, numerical parameters should consider the specified significant digits and adopt the general digit retention method. Notwithstanding that the numerical fields and parameters used in some embodiments of the present disclosure to confirm the breadth of their ranges are approximations, in particular embodiments such numerical values are set as precisely as practicable.

The entire contents of each patent, patent disclosure, patent disclosure publication, and other material, such as article, book, specification, publication, document, etc., cited in the present disclosure are hereby incorporated by reference into the present disclosure. Application history documents that are inconsistent with or conflict with the content of the present disclosure are excluded, as are documents (currently or hereafter appended to the present disclosure) that limit the broadest scope of the claims of the present disclosure. It should be noted that if there is any inconsistency or conflict between the descriptions, definitions, and/or terms used in the attached materials of the present disclosure and the contents of the present disclosure, the descriptions, definitions and/or terms used in this disclosure shall prevail.

At last, it should be understood that the embodiments described in the present disclosure are merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, the embodiments of the present disclosure are not limited to the embodiments explicitly introduced and described in the present disclosure.

What is claimed is:

1. A bone conduction microphone, comprising:

a laminated structure formed by a vibration unit and an acoustic transducer unit; and a base structure configured to load the laminated structure, at least one side of the laminated structure being physically connected to the base structure; wherein the base structure vibrates based on an external vibration signal, and the vibration unit deforms in response to the vibration of the base structure; and the acoustic transducer unit generates an electrical signal based on the deformation of the vibration unit, wherein a resonant frequency of the bone conduction microphone is within a range of 2.5 kHz-4.5 kHz;

the vibration unit includes a suspension membrane structure, the suspension membrane structure is connected to the base structure through a circumferential side of the suspension membrane structure, and the acoustic transducer unit is located on an upper surface or a lower surface of the suspension membrane structure; wherein the acoustic transducer unit is a ring structure, and a thickness of the suspension membrane structure located in an inner region of the ring structure is greater than a thickness of the suspension membrane structure located in an outer region of the ring structure.

2. The bone conduction microphone of claim 1, wherein the resonant frequency of the bone conduction microphone is positively correlated with a stiffness of the vibration unit, or the resonant frequency of the bone conduction microphone is negatively correlated with a mass of the laminated structure.

3. The bone conduction microphone of claim 1, wherein the acoustic transducer unit includes a first electrode layer, a piezoelectric layer, and a second electrode layer arranged in sequence from top to bottom.

4. The bone conduction microphone of claim 3, wherein the suspension membrane structure includes a plurality of holes, and the plurality of holes are distributed along an inner circumferential direction of the acoustic transducer unit.

5. The bone conduction microphone of claim 4, wherein the plurality of holes are circular holes, and radii of the circular holes are within a range of 20 μm-300 μm.

6. The bone conduction microphone of claim 4, wherein a shape enclosed by the plurality of holes is consistent with a shape of the acoustic transducer unit.

7. The bone conduction microphone of claim 4, wherein the plurality of holes are distributed in a circle along the inner circumferential direction of the acoustic transducer unit, wherein a radius of the circle is within a range of 300 μm-700 μm.

8. The bone conduction microphone of claim 4, wherein the acoustic transducer unit at least includes an effective acoustic transducer unit, and a radial distance from an edge of the effective acoustic transducer unit to centers of the plurality of holes is within a range of 50 μm-400 μm.

9. The bone conduction microphone of claim 8, wherein an inner diameter of the effective acoustic transducer unit is within a range of 100 μm-700 μm, or an outer diameter of the effective acoustic transducer unit is within a range of 110 μm-710 μm.

10. The bone conduction microphone of claim 3, wherein the thickness of the suspension membrane structure the thickness of the suspension membrane structure located in the inner region of the ring structure or the thickness of the suspension membrane structure located in the outer region of the ring structure is within a range of 0.5 μm-10 μm.

11. The bone conduction microphone of claim 3, wherein a thickness of the first electrode layer is within a range of 80 nm-250 nm, and a thickness of the second electrode layer is within a range of 80 nm-250 nm.

12. The bone conduction microphone of claim 3, wherein a thickness of the piezoelectric layer is within a range of 0.8 μm-5 μm.

13. The bone conduction microphone of claim 3, wherein the vibration unit further includes a mass element, wherein the mass element is a cylinder, a radius of a cross-section of the mass element perpendicular to a thickness direction is within a range of 100 μm-700 μm, and a thickness of the mass element is within a range of 20 μm-400 μm.

14. The bone conduction microphone of claim 3, wherein a lead structure is arranged on the suspension membrane structure, and the first electrode layer and the second electrode layer are connected to the base structure through the lead structure.

15. The bone conduction microphone of claim 14, wherein a width of the lead structure is within a range of 2 μm-100 μm.

16. The bone conduction microphone of claim 1, wherein a ratio of an electrical signal intensity to a noise intensity of the bone conduction microphone is 50%-100% of a maximum ratio of the electrical signal intensity to the noise intensity.

17. The bone conduction microphone of claim 1, wherein the vibration unit includes at least one support arm and a mass element, and the mass element is connected to the base structure through the at least one support arm.

18. The bone conduction microphone of claim 17, further comprising a limiting structure located in a hollow position of the base structure, wherein the limiting structure is connected to the base structure, and the limiting structure is located above or below the mass element.

19. The bone conduction microphone of claim 1, further comprising at least one damping structure layer, wherein the at least one damping structure layer covers an upper surface, a lower surface, or an inside of the laminated structure.

* * * * *